(12) United States Patent
Yamazaki et al.

(10) Patent No.: US 9,947,797 B2
(45) Date of Patent: Apr. 17, 2018

(54) SEMICONDUCTOR DEVICE AND METHOD FOR MANUFACTURING THE SAME

(71) Applicant: Semiconductor Energy Laboratory Co., Ltd., Atsugi-shi, Kanagawa-ken (JP)

(72) Inventors: Shunpei Yamazaki, Setagaya (JP); Kengo Akimoto, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/496,368

(22) Filed: Sep. 25, 2014

(65) Prior Publication Data

US 2015/0048363 A1     Feb. 19, 2015

Related U.S. Application Data

(63) Continuation of application No. 12/785,664, filed on May 24, 2010, now Pat. No. 8,872,171.

(30) Foreign Application Priority Data

May 29, 2009    (JP) .................................. 2009-131616

(51) Int. Cl.
    *H01L 29/49*       (2006.01)
    *H01L 29/786*     (2006.01)
    (Continued)

(52) U.S. Cl.
    CPC .......... *H01L 29/7869* (2013.01); *H01L 29/24* (2013.01); *H01L 29/247* (2013.01);
    (Continued)

(58) Field of Classification Search
None
See application file for complete search history.

(56) References Cited

U.S. PATENT DOCUMENTS 4,244,040 A    1/1981    Fondiller et al.
5,311,041 A    5/1994    Tominaga et al.
(Continued)

FOREIGN PATENT DOCUMENTS

CN       001941398 A     4/2007
CN       101315884 A     12/2008
(Continued)

OTHER PUBLICATIONS

Chinese Office Action (Application No. 201010200480.8) dated Jan. 12, 2015.
(Continued)

*Primary Examiner* — Ali Naraghi
(74) *Attorney, Agent, or Firm* — Robinson Intellectual Property Law Office; Eric J. Robinson

(57) ABSTRACT

Homogeneity and stability of electric characteristics of a thin film transistor included in a circuit are critical for the performance of a display device including said circuit. An object of the invention is to provide an oxide semiconductor film with low hydrogen content and which is used in an inverted staggered thin film transistor having well defined electric characteristics. In order to achieve the object, a gate insulating film, an oxide semiconductor layer, and a channel protective film are successively formed with a sputtering method without being exposed to air. The oxide semiconductor layer is formed so as to limit hydrogen contamination, in an atmosphere including a proportion of oxygen. In addition, layers provided over and under a channel formation region of the oxide semiconductor layer are formed using compounds of silicon, oxygen and/or nitrogen.

43 Claims, 26 Drawing Sheets

(51) Int. Cl.
*H01L 29/24* (2006.01)
*H01L 29/51* (2006.01)
*H01L 27/12* (2006.01)

(52) U.S. Cl.
CPC ........ *H01L 29/4908* (2013.01); *H01L 29/513* (2013.01); *H01L 29/78609* (2013.01); *H01L 29/78693* (2013.01); *H01L 29/78696* (2013.01); *H01L 27/1225* (2013.01)

(56) References Cited

U.S. PATENT DOCUMENTS

| | | |
|---|---|---|
| 5,444,673 A | 8/1995 | Mathurin |
| 5,731,856 A | 3/1998 | Kim et al. |
| 5,744,864 A | 4/1998 | Cillessen et al. |
| 5,773,325 A | 6/1998 | Teramoto |
| 6,191,452 B1 | 2/2001 | Oda et al. |
| 6,246,070 B1 | 6/2001 | Yamazaki et al. |
| 6,249,330 B1 | 6/2001 | Yamaji et al. |
| 6,294,274 B1 | 9/2001 | Kawazoe et al. |
| 6,303,946 B1 | 10/2001 | Sung |
| 6,451,632 B1 | 9/2002 | Sung |
| 6,459,906 B1 | 10/2002 | Yang |
| 6,555,419 B2 | 4/2003 | Oda et al. |
| 6,563,174 B2 | 5/2003 | Kawasaki et al. |
| 6,727,522 B1 | 4/2004 | Kawasaki et al. |
| 6,838,308 B2 | 1/2005 | Haga |
| 6,838,324 B2 | 1/2005 | Yamazaki et al. |
| 6,867,075 B2 | 3/2005 | Oda et al. |
| 6,888,522 B1 | 5/2005 | Shibata et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,160,768 B2 | 1/2007 | Kudo et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,320,905 B2 | 1/2008 | Yamazaki et al. |
| 7,323,356 B2 | 1/2008 | Hosono et al. |
| 7,382,421 B2 | 6/2008 | Hoffman et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,453,426 B2 | 11/2008 | Yamazaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,569,851 B2 | 8/2009 | Song et al. |
| 7,576,394 B2 | 8/2009 | Furuta et al. |
| 7,598,520 B2 | 10/2009 | Hirao et al. |
| 7,601,984 B2 | 10/2009 | Sano et al. |
| 7,629,633 B2 | 12/2009 | Chan et al. |
| 7,642,038 B2 | 1/2010 | Fujii |
| 7,651,896 B2 | 1/2010 | Honda et al. |
| 7,674,650 B2 | 3/2010 | Akimoto et al. |
| 7,732,819 B2 | 6/2010 | Akimoto et al. |
| 7,791,074 B2 | 9/2010 | Iwasaki |
| 7,847,287 B2 | 12/2010 | Kim et al. |
| 7,855,379 B2 | 12/2010 | Hayashi et al. |
| 7,884,360 B2 | 2/2011 | Takechi et al. |
| 7,910,490 B2 | 3/2011 | Akimoto et al. |
| 7,923,723 B2 | 4/2011 | Hayashi et al. |
| 7,932,521 B2 | 4/2011 | Akimoto et al. |
| 7,935,582 B2 | 5/2011 | Iwasaki |
| 7,952,095 B2 | 5/2011 | Oue et al. |
| 7,956,361 B2 | 6/2011 | Iwasaki |
| 7,977,168 B2 | 7/2011 | Honda et al. |
| 7,981,734 B2 | 7/2011 | Furuta et al. |
| 7,993,964 B2 | 8/2011 | Hirao et al. |
| 7,994,500 B2 | 8/2011 | Kim et al. |
| 8,043,901 B2 | 10/2011 | Yamazaki et al. |
| 8,053,773 B2 | 11/2011 | Shin et al. |
| 8,058,549 B2 | 11/2011 | Kothari et al. |
| 8,088,652 B2 | 1/2012 | Hayashi et al. |
| 8,110,436 B2 | 2/2012 | Hayashi et al. |
| 8,130,440 B2 | 3/2012 | Kothari et al. |
| 8,134,156 B2 | 3/2012 | Akimoto |
| 8,148,779 B2 | 4/2012 | Jeong et al. |
| 8,154,024 B2 | 4/2012 | Iwasaki |
| 8,158,464 B2 | 4/2012 | Akimoto |
| 8,169,686 B2 | 5/2012 | Kothari et al. |
| 8,178,926 B2 | 5/2012 | Nakayama |
| 8,188,471 B2 | 5/2012 | Iwasaki et al. |
| 8,188,480 B2 | 5/2012 | Itai |
| 8,193,045 B2 | 6/2012 | Omura et al. |
| 8,203,143 B2 | 6/2012 | Imai |
| 8,222,092 B2 | 7/2012 | Yamazaki et al. |
| 8,274,077 B2 | 9/2012 | Akimoto et al. |
| 8,304,298 B2 | 11/2012 | Ofuji et al. |
| 8,319,214 B2 | 11/2012 | Imai |
| 8,319,905 B2 | 11/2012 | Yoon et al. |
| 8,354,674 B2 | 1/2013 | Kimura |
| 8,368,079 B2 | 2/2013 | Akimoto |
| 8,420,442 B2 | 4/2013 | Takechi et al. |
| 8,466,463 B2 | 6/2013 | Akimoto et al. |
| 8,525,165 B2 | 9/2013 | Akimoto |
| 8,659,014 B2 | 2/2014 | Honda et al. |
| 8,797,628 B2 | 8/2014 | Kothari et al. |
| 8,802,462 B2 | 8/2014 | Yamazaki |
| 8,871,566 B2 | 10/2014 | Shin et al. |
| 8,872,171 B2 * | 10/2014 | Yamazaki ........... H01L 29/4908 257/43 |
| 8,889,480 B2 | 11/2014 | Takechi et al. |
| 8,907,868 B2 | 12/2014 | Yamazaki |
| 8,974,918 B2 | 3/2015 | Yamazaki |
| 2001/0030323 A1 | 10/2001 | Ikeda |
| 2001/0035527 A1 | 11/2001 | Tanaka et al. |
| 2001/0046027 A1 | 11/2001 | Tai et al. |
| 2002/0056838 A1 | 5/2002 | Ogawa |
| 2002/0075423 A1 | 6/2002 | Fujino |
| 2002/0117719 A1 | 8/2002 | Ando et al. |
| 2002/0132454 A1 | 9/2002 | Ohtsu et al. |
| 2003/0047785 A1 | 3/2003 | Kawasaki et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2004/0157564 A1 | 8/2004 | Murakami et al. |
| 2005/0017302 A1 | 1/2005 | Hoffman |
| 2005/0170565 A1 | 8/2005 | Fujii et al. |
| 2005/0199959 A1 | 9/2005 | Chiang et al. |
| 2005/0253171 A1 * | 11/2005 | Kang ................. H01L 27/3246 257/211 |
| 2005/0275038 A1 | 12/2005 | Shih et al. |
| 2005/0282317 A1 | 12/2005 | Ikeda |
| 2005/0285251 A1 | 12/2005 | Lee et al. |
| 2005/0285509 A1 * | 12/2005 | Funamoto ........... H01L 51/5209 313/504 |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0175609 A1 | 8/2006 | Chan et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |

(56) References Cited

U.S. PATENT DOCUMENTS

| | | |
|---|---|---|
| 2007/0046191 A1 | 3/2007 | Saito |
| 2007/0052020 A1 | 3/2007 | Chen et al. |
| 2007/0052025 A1 | 3/2007 | Yabuta |
| 2007/0054507 A1 | 3/2007 | Kaji et al. |
| 2007/0069209 A1 | 3/2007 | Jeong et al. |
| 2007/0072439 A1* | 3/2007 | Akimoto ............ H01L 27/1225 438/795 |
| 2007/0087490 A1 | 4/2007 | Seo et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0061295 A1* | 3/2008 | Wang .................. H01L 27/124 257/59 |
| 2008/0073653 A1 | 3/2008 | Iwasaki |
| 2008/0079075 A1 | 4/2008 | Seon et al. |
| 2008/0083950 A1 | 4/2008 | Pan et al. |
| 2008/0093595 A1 | 4/2008 | Song et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0197350 A1 | 8/2008 | Park et al. |
| 2008/0203387 A1 | 8/2008 | Kang et al. |
| 2008/0206935 A1 | 8/2008 | Jang et al. |
| 2008/0224125 A1 | 9/2008 | Tanabe et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0266448 A1 | 10/2008 | Reiner et al. |
| 2008/0277657 A1 | 11/2008 | Jeong et al. |
| 2008/0291350 A1 | 11/2008 | Hayashi et al. |
| 2008/0296568 A1 | 12/2008 | Ryu et al. |
| 2008/0299689 A1 | 12/2008 | Yamazaki |
| 2008/0303020 A1* | 12/2008 | Shin .................. H01L 29/66742 257/43 |
| 2008/0308796 A1 | 12/2008 | Akimoto et al. |
| 2008/0308804 A1 | 12/2008 | Akimoto et al. |
| 2008/0308805 A1 | 12/2008 | Akimoto et al. |
| 2008/0308806 A1 | 12/2008 | Akimoto et al. |
| 2009/0001374 A1 | 1/2009 | Inoue et al. |
| 2009/0008639 A1 | 1/2009 | Akimoto et al. |
| 2009/0020753 A1 | 1/2009 | Jeong et al. |
| 2009/0068773 A1 | 3/2009 | Lai et al. |
| 2009/0072232 A1 | 3/2009 | Hayashi et al. |
| 2009/0073325 A1 | 3/2009 | Kuwabara et al. |
| 2009/0090915 A1 | 4/2009 | Yamazaki et al. |
| 2009/0114910 A1 | 5/2009 | Chang |
| 2009/0127550 A1 | 5/2009 | Imai |
| 2009/0134399 A1 | 5/2009 | Sakakura et al. |
| 2009/0141004 A1 | 6/2009 | Yamazaki |
| 2009/0152506 A1 | 6/2009 | Umeda et al. |
| 2009/0152541 A1 | 6/2009 | Maekawa et al. |
| 2009/0186445 A1 | 7/2009 | Akimoto |
| 2009/0189155 A1 | 7/2009 | Akimoto |
| 2009/0236596 A1 | 9/2009 | Itai |
| 2009/0239335 A1 | 9/2009 | Akimoto et al. |
| 2009/0256147 A1 | 10/2009 | Kim et al. |
| 2009/0269881 A1 | 10/2009 | Furuta et al. |
| 2009/0278122 A1 | 11/2009 | Hosono et al. |
| 2009/0280600 A1 | 11/2009 | Hosono et al. |
| 2009/0294772 A1 | 12/2009 | Jeong et al. |
| 2009/0305461 A1 | 12/2009 | Akimoto et al. |
| 2010/0003783 A1 | 1/2010 | Akimoto |
| 2010/0007829 A1 | 1/2010 | Oikawa et al. |
| 2010/0013372 A1 | 1/2010 | Oikawa et al. |
| 2010/0025678 A1 | 2/2010 | Yamazaki et al. |
| 2010/0032665 A1 | 2/2010 | Yamazaki et al. |
| 2010/0051938 A1 | 3/2010 | Hayashi et al. |
| 2010/0051943 A1 | 3/2010 | Fujii |
| 2010/0051949 A1 | 3/2010 | Yamazaki et al. |
| 2010/0065844 A1 | 3/2010 | Tokunaga |
| 2010/0072467 A1 | 3/2010 | Yamazaki et al. |
| 2010/0078633 A1 | 4/2010 | Watanabe |
| 2010/0084648 A1 | 4/2010 | Watanabe |
| 2010/0092800 A1 | 4/2010 | Itagaki et al. |
| 2010/0102311 A1 | 4/2010 | Ito et al. |
| 2010/0109002 A1 | 5/2010 | Itagaki et al. |
| 2010/0136743 A1 | 6/2010 | Akimoto et al. |
| 2010/0163876 A1 | 7/2010 | Inoue et al. |
| 2010/0193691 A1 | 8/2010 | Ishii et al. |
| 2010/0193785 A1 | 8/2010 | Kimura |
| 2010/0244022 A1 | 9/2010 | Takahashi et al. |
| 2010/0258794 A1 | 10/2010 | Iwasaki et al. |
| 2010/0283049 A1 | 11/2010 | Sato et al. |
| 2011/0024740 A1 | 2/2011 | Yamazaki et al. |
| 2011/0024750 A1 | 2/2011 | Yamazaki et al. |
| 2011/0024751 A1 | 2/2011 | Yamazaki et al. |
| 2011/0031491 A1 | 2/2011 | Yamazaki et al. |
| 2011/0104851 A1 | 5/2011 | Akimoto et al. |
| 2011/0117697 A1 | 5/2011 | Akimoto et al. |
| 2011/0121290 A1 | 5/2011 | Akimoto et al. |
| 2011/0193083 A1 | 8/2011 | Kim et al. |
| 2012/0194896 A1 | 8/2012 | Kothari et al. |
| 2012/0273779 A1 | 11/2012 | Yamazaki et al. |
| 2012/0273780 A1 | 11/2012 | Yamazaki et al. |
| 2012/0280230 A1 | 11/2012 | Akimoto et al. |
| 2013/0140559 A1 | 6/2013 | Yamazaki et al. |
| 2013/0217191 A1 | 8/2013 | Yamazaki et al. |
| 2015/0084029 A1 | 3/2015 | Yamazaki |
| 2016/0268359 A1 | 9/2016 | Yamazaki et al. |

FOREIGN PATENT DOCUMENTS

| | | |
|---|---|---|
| CN | 101335304 A | 12/2008 |
| CN | 101405869 A | 4/2009 |
| EP | 1737044 A | 12/2006 |
| EP | 1770788 A | 4/2007 |
| EP | 1981085 A | 10/2008 |
| EP | 1983499 A | 10/2008 |
| EP | 1995787 A | 11/2008 |
| EP | 1998373 A | 12/2008 |
| EP | 1998374 A | 12/2008 |
| EP | 1998375 A | 12/2008 |
| EP | 2226847 A | 9/2010 |
| EP | 2264770 A | 12/2010 |
| EP | 2339639 A | 6/2011 |
| EP | 2816607 A | 12/2014 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-097432 A | 4/1996 |
| JP | 08-264794 A | 10/1996 |
| JP | 08-274345 A | 10/1996 |
| JP | 11-040814 A | 2/1999 |
| JP | 11-505377 | 5/1999 |
| JP | 11-284188 A | 10/1999 |
| JP | 2000-044236 A | 2/2000 |
| JP | 2000-150900 A | 5/2000 |
| JP | 2000-150904 A | 5/2000 |
| JP | 2000-357586 A | 12/2000 |
| JP | 2002-076356 A | 3/2002 |
| JP | 2002-134527 A | 5/2002 |
| JP | 2002-289859 A | 10/2002 |
| JP | 2003-086000 A | 3/2003 |

(56) References Cited

FOREIGN PATENT DOCUMENTS

| JP | 2003-086808 A | 3/2003 |
|---|---|---|
| JP | 2003-264148 A | 9/2003 |
| JP | 2003-273133 A | 9/2003 |
| JP | 2004-103957 A | 4/2004 |
| JP | 2004-273614 A | 9/2004 |
| JP | 2004-273732 A | 9/2004 |
| JP | 2004-292873 A | 10/2004 |
| JP | 2006-100760 A | 4/2006 |
| JP | 2007-073559 A | 3/2007 |
| JP | 2007-096055 A | 4/2007 |
| JP | 2007-103918 A | 4/2007 |
| JP | 2007-123861 A | 5/2007 |
| JP | 2007-194594 A | 8/2007 |
| JP | 2007-212699 A | 8/2007 |
| JP | 2007-258675 A | 10/2007 |
| JP | 2007-299913 A | 11/2007 |
| JP | 2008-085312 A | 4/2008 |
| JP | 2008-098447 A | 4/2008 |
| JP | 2008-124215 A | 5/2008 |
| JP | 2008-281988 A | 11/2008 |
| JP | 2009-033145 A | 2/2009 |
| JP | 2009-081413 A | 4/2009 |
| JP | 2009-099953 A | 5/2009 |
| JP | 2009-111365 A | 5/2009 |
| JP | 2009-141002 A | 6/2009 |
| JP | 2010-040552 A | 2/2010 |
| KR | 2003-0022692 A | 3/2003 |
| KR | 10-0430020 | 6/2004 |
| KR | 2007-0053233 A | 5/2007 |
| KR | 10-0873081 | 12/2008 |
| KR | 2008-0108223 A | 12/2008 |
| KR | 2009-0048651 A | 5/2009 |
| TW | 491983 | 6/2002 |
| WO | WO-2004/114391 | 12/2004 |
| WO | WO-2006/025609 | 3/2006 |
| WO | WO-2007/029844 | 3/2007 |
| WO | WO-2007/058329 | 5/2007 |
| WO | WO-2007/089048 | 8/2007 |
| WO | WO-2007/108293 | 9/2007 |
| WO | WO-2008/126879 | 10/2008 |
| WO | WO-2008/143304 | 11/2008 |
| WO | WO-2008/149873 | 12/2008 |
| WO | WO-2009/031634 | 3/2009 |
| WO | WO-2009/034953 | 3/2009 |
| WO | WO-2009/041713 | 4/2009 |
| WO | WO-2009/072532 | 6/2009 |

OTHER PUBLICATIONS

Chinese Office Action (Application No. 201010200480.8) dated Jan. 20, 2016.
Korean Office Action (Application No. 2014-0136127) dated Mar. 31, 2016.
European Office Action (Application No. 10161738.9) dated Jun. 17, 2015.
Chinese Office Action (Application No. 201010200480.8) dated Jun. 25, 2015.
Korean Office Action (Application No. 2014-0136127) dated Sep. 17, 2015.
Nakamura M. et al., "Syntheses and crystal structures of new homologous compounds, indium iron zinc oxides (InFeO3(ZnO)m) (m natural number) and related compounds," Kotai Butsuri (Solid State Physics), 1993, vol. 28, No. 5, pp. 317-327.
Taiwanese Office Action (Application No. 099114955) dated Dec. 8, 2015.
Korean Office Action (Application No. 2010-0049495) dated Nov. 15, 2016.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Cho.D et al., "21.2:Al and Sn—Doped Zinc Indium Oxide Thin Film Transistors for AMOLED Back-Plane", SID Digest '09 : SID International Symposium Digest of Technical Papers, May 31, 2009, pp. 280-283.
Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Meiboom.S et al., "Theory of the Blue Phase of Cholesteric Liquid Crystals", Phys. Rev. Lett. (Physical Review Letters), May 4, 1981, vol. 48, No. 18, pp. 1216-1219.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Kitzerow.H et al., "Observation of Blue Phases in Chiral Networks", Liquid Crystals, 1993, vol. 14, No. 3, pp. 911-916.
Kikuchi.H et al., "Polymer-Stabilized Liquid Crystal Blue Phases", Nature Materials, Sep. 2, 2002, vol. 1, pp. 64-68.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Park.J et al., "High performance amorphous oxide thin film transistors with self-aligned top-gate structure", IEDM 09: Technical Digest of International Electron Devices Meeting, Dec. 7, 2009, pp. 191-194.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Miyasaka.M, "SUFTLA Flexible Microelectronics on Their Way to Business", SID Digest '07 : SID International Symposium Digest of Technical Papers, 2007, vol. 38, pp. 1673-1676.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Prins.M et al., "A Ferroelectric Transparent Thin-Film Transistor", Appl. Phys. Lett. (Applied Physics Letters), Jun. 17, 1996, vol. 68, No. 25, pp. 3650-3652.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.
Ohara.H et al., "21.3:4.0 In. QVGA AMOLED Display Using In—Ga—Zn-Oxide TFTS With a Novel Passivation Layer", SID Digest '09 : SID International Symposium Digest of Technical Papers, May 31, 2009, pp. 284-287.
Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Sakata.J et al., "Development of 4.0-In. AMOLED Display With Driver Circuit Using Amorphous In—Ga—Zn-Oxide TFTS", IDW '09 : Proceedings of the 16th International Display Workshops, 2009, pp. 689-692.
Kimizuka.N et al., "SPINEL,YbFe2O4, and Yb2Fe3O7 Types of Structures for Compounds in the In2O3 and Sc2O3—A2O3—BO

(56) References Cited

OTHER PUBLICATIONS

Systems [A; Fe, Ga, or Al; B: Mg, Mn, Fe, Ni, Cu,or Zn] at Temperatures Over 1000° C", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Nakamura.M et al., "The phase relations in the In2O3—Ga2ZnO4—ZnO system at 1350° C", Journal of Solid State Chemistry, Aug. 1, 1991, vol. 93, No. 2, pp. 298-315.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Lee.H et al., "Current Status of, Challenges to, and Perspective View of AM-OLED ", IDW '06 : Proceedings of the 13th International Display Workshops, Dec. 7, 2006, pp. 663-666.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Nowatari.H et al., "60.2: Intermediate Connector With Suppressed Voltage Loss for White TANDEM OLEDS", SID Digest '09 : SID International Symposium Digest of Technical Papers, May 31, 2009, vol. 40, pp. 899-902.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Kurokawa.Y et al., "UHF RFCPUS on Flexible and Glass Substrates for Secure RFID Systems", Journal of Solid-State Circuits , 2008, vol. 43, No. 1, pp. 292-299.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Park.S et al., "Challenge to Future Displays: Transparent AM-OLED Driven by Peald Grown ZnO TFT", IMID '07 Digest, 2007, pp. 1249-1252.

Park.J et al., "Amorphous Indium-Gallium-Zinc Oxide TFTS and Their Application for Large Size AMOLED", AM-FPD '08 Digest of Technical Papers, Jul. 2, 2008, pp. 275-278.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

European Search Report (Application No. 10161738.9) dated Jul. 5, 2010.

Nakamura.M, "Synthesis of Homologous Compound with New Long-Period Structure", NIRIM Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m <4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters) , 2005, vol. 87, pp. 122102-1-122102-3.

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

(56) References Cited

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Kim.H et al., "Low resistance Ti/Au contacts to amorphous gallium indium zinc oxides", Appl. Phys. Lett. (Applied Physics Letters), 2011, vol. 98, No. 11, pp. 112107-1-112107-3.

Shimura.Y et al., "Specific contact resistances between amorphous oxide semiconductor In—Ga—Zn—O and metallic electrodes", Thin Solid Films, 2008, vol. 516, pp. 5899-5902.

Dawson.R et al., "24.1: Invited Paper: Pursuit of Active Matrix Organic Light Emitting Diode Displays", SID Digest '01 : SID International Symposium Digest of Technical Papers, 2001, vol. 32, No. 1, pp. 372-375.

Kim.K et al., "Amorphous Silicon Backplane for Active-Matrix Organic Light-Emitting Diodes", 2004 Joint International Meeting, Oct. 3, 2004.

Pineda. E, "Expect iPad 5, iPad Mini 2 with Longer Battery Hours on Release Date Due to IGZO Display Panel, Bluetooth LE", International Business Times, Jul. 11, 2013. Webpage: http://au.ibtimes.com/articles/488889/20130711/expect-ipad-5-mini-2-longer-battery.htm#.Ue9QkKxYV8F.

Chinese Office Action (Application No. 201010200480.8) dated Nov. 27, 2013.

European Office Action (Application No. 10161738.9) dated Feb. 14, 2014.

Korean Office Action (Application No. 2010-0049495) dated Jul. 28, 2016.

European Office Action (Application No. 10161738.9) dated May 3, 2016.

Taiwanese Office Action (Application No. 103140462) dated Mar. 25, 2016.

European Office Action (Application No. 10161738.9) dated Mar. 6, 2017.

Taiwanese Office Action (Application No. 105139251) dated Mar. 31, 2017.

Korean Office Action (Application No. 2017-0150871) dated Feb. 13, 2018.

\* cited by examiner

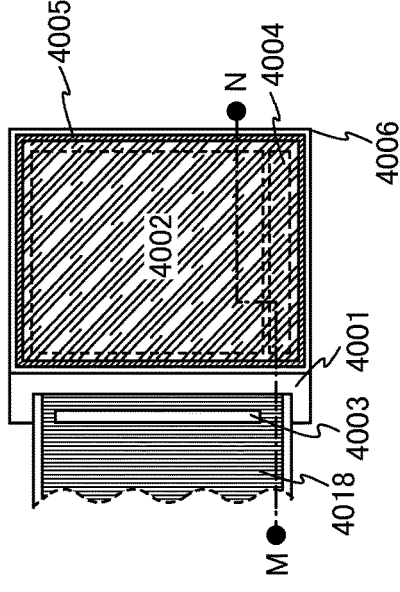
FIG. 11A1
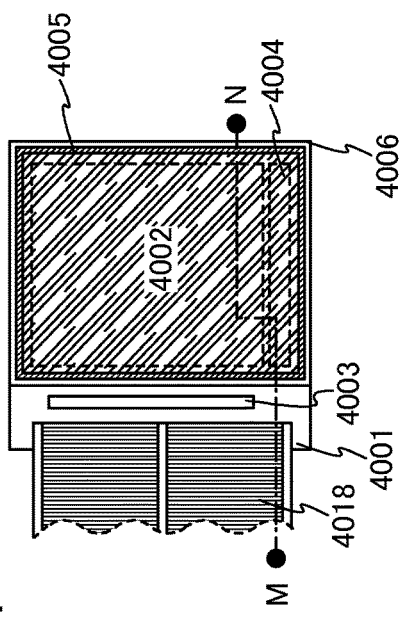
FIG. 11A2
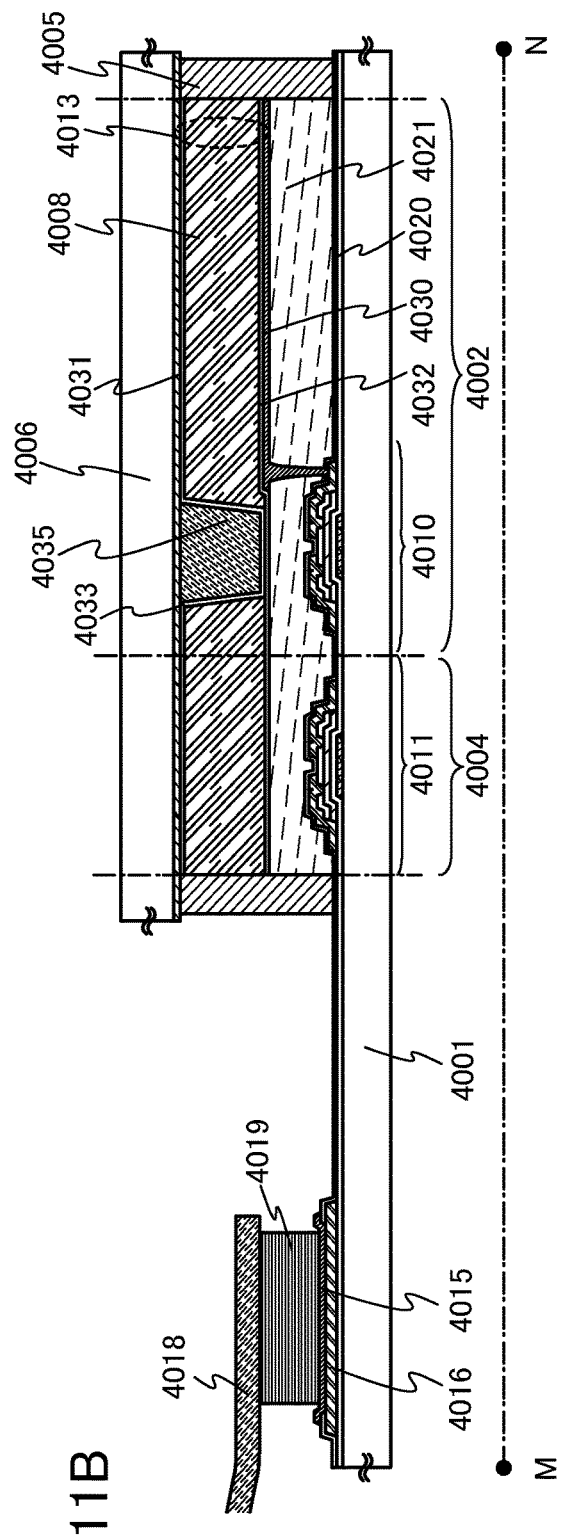
FIG. 11B

SEMICONDUCTOR DEVICE AND METHOD FOR MANUFACTURING THE SAME

BACKGROUND OF THE INVENTION

1. Field of the Invention

The present invention relates to a semiconductor device which has a circuit including a thin film transistor (hereinafter also referred to as a TFT) in which a channel formation region is formed using an oxide semiconductor film and a method for manufacturing the semiconductor device. For example, the present invention relates to an electronic device having an electro-optical device typified by a liquid crystal display panel or a light-emitting display device including an organic light-emitting element.

It is to be noted that the semiconductor device in this specification refers to all devices that can function by utilizing semiconductor characteristics, and electro-optical devices, semiconductor circuits, and electronic devices are all semiconductor devices.

2. Description of the Related Art

Various metal oxides are used for a variety of applications. Indium oxide is a well-known material and is used as a light-transmitting electrode material which is needed for a liquid crystal display or the like.

Some metal oxides have semiconductor characteristics. Examples of metal oxides having semiconductor characteristics include tungsten oxide, tin oxide, indium oxide, zinc oxide, and the like. Thin film transistors in which a channel formation region is formed using such metal oxides having semiconductor characteristics have already been disclosed (Patent Documents 1 to 4, Non-Patent Document 1).

Further, not only single oxides but also multiple oxides are known as metal oxides. For example, $InGaO_3(ZnO)_m$ (m is a natural number) which is a homologous compound is known as a multiple oxide semiconductor including In, Ga, and Zn (Non-Patent Documents 2 to 4).

In addition, it has been confirmed that an oxide semiconductor including such an In—Ga—Zn-based oxide can be used as a channel layer of a thin film transistor (Patent Document 5, and Non-Patent Documents 5 and 6).

REFERENCE

[Patent Document 1] Japanese Published Patent Application No. S60-198861
[Patent Document 2] Japanese Published Patent Application No. H8-264794
[Patent Document 3] Japanese Translation of PCT International Application No. H11-505377
[Patent Document 4] Japanese Published Patent Application No. 2000-150900
[Patent Document 5] Japanese Published Patent Application No. 2004-103957
[Non-Patent Document 1] M. W. Prins, K. O. Grosse-Holz, G Muller, J. F. M. Cillessen, J. B. Giesbers, R. P. Weening, and R. M. Wolf, "A ferroelectric transparent thin-film transistor", *Appl. Phys. Lett.*, 17 Jun. 1996, Vol. 68, pp. 3650-3652
[Non-Patent Document 2] M. Nakamura, N. Kimizuka, and T. Mohri, "The Phase Relations in the $In_2O_3$—$Ga_2ZnO_4$—ZnO System at 1350° C.", *J. Solid State Chem.*, 1991, Vol. 93, pp. 298-315
[Non-Patent Document 3] N. Kimizuka, M. Isobe, and M. Nakamura, "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System", *J. Solid State Chem.*, 1995, Vol. 116, pp. 170-178
[Non-Patent Document 4] M. Nakamura, N. Kimizuka, T. Mohri, and M. Isobe, "Syntheses and crystal structures of new homologous compounds, indium iron zinc oxides $(InFeO_3(ZnO)_m)$ (m: natural number) and related compounds", *KOTAI BUTSURI (SOLID STATE PHYSICS)*, 1993, Vol. 28, No. 5, pp. 317-327
[Non-Patent Document 5] K. Nomura, H. Ohta, K. Ueda, T. Kamiya, M. Hirano, and H. Hosono, "Thin-film transistor fabricated in single-crystalline transparent oxide semiconductor", *SCIENCE*, 2003, Vol. 300, pp. 1269-1272
[Non-Patent Document 6] K. Nomura, H. Ohta, A. Takagi, T. Kamiya, M. Hirano, and H. Hosono, "Room-temperature fabrication of transparent flexible thin-film transistors using amorphous oxide semiconductors", *NATURE*, 2004, Vol. 432, pp. 488-492

SUMMARY OF THE INVENTION

The field effect mobility of a thin film transistor in which a channel formation region is provided in an oxide semiconductor is higher than that of a thin film transistor using amorphous silicon.

Such an oxide semiconductor is expected to be used for forming a thin film transistor over a glass substrate, a plastic substrate, or the like, and to be applied to a display device such as a liquid crystal display device, an electroluminescent display device, or electronic paper.

In an active matrix display device, electric characteristics of a thin film transistor included in a circuit are important and performance of the display device depends on the electric characteristics. Among the electric characteristics of a thin film transistor, in particular, threshold voltage $(V_{th})$ is important. It is needless to say that high field effect mobility is favorable. When the threshold voltage value is high or is on the minus side, it is difficult to control the circuit even if the field effect mobility is high. When a thin film transistor has high threshold voltage value and a large absolute value of its threshold voltage, the TFT cannot perform switching function and may be a load when driven at low voltage. Further, when the threshold voltage value is on the minus side, current tends to flow between the source electrode and the drain electrode even if the gate voltage is 0 V, that is, the transistor tends to be normally on.

In the case of an n-channel thin film transistor, it is preferable that a channel is formed and drain current begins to flow after positive gate voltage is applied. A transistor in which a channel is not formed unless a high driving voltage is applied and a transistor in which a channel is formed and drain current flows even in the case of the negative voltage state are unsuitable for a thin film transistor used in a circuit.

It is an object to provide a structure of a thin film transistor including an oxide semiconductor film, in which gate threshold voltage at which a channel is formed is positive and as close to 0 V as possible.

Further, it is another object to reduce variation in electric characteristics of the thin film transistor including an oxide semiconductor film. In particular, in a liquid crystal display device where variation between elements is large, there is a risk that display unevenness due to variation in TFT characteristics is caused.

Further, also in a display device including a light-emitting element, in the case where there is large variation in on current $(I_{on})$ of TFTs (TFTs in a driver circuit or TFTs supplying current to light-emitting elements arranged in pixels) which are arranged so as to make constant current flow to a pixel electrode, there is a risk that variation in luminance is generated in a display screen.

It is another object to provide a highly reliable semiconductor device using an oxide semiconductor.

Each embodiment of the invention disclosed in this specification achieves at least one of the above objects.

In order to improve characteristics of an oxide semiconductor layer and reduce variation in the characteristics, reduction in the concentration of hydrogen in the oxide semiconductor layer is important.

Therefore, with the use of an oxide semiconductor in which hydrogen is thoroughly reduced, electric characteristics of a thin film transistor are improved, and the thin film transistor can have little variation in characteristics and high reliability.

Characteristics of a thin film transistor in which a channel formation region is provided in an oxide semiconductor layer are affected by an interface condition of the oxide semiconductor layer, that is, an interface between the oxide semiconductor layer and a gate insulating film, an interface between the oxide semiconductor layer and a protective insulating film, or an interface between the oxide semiconductor layer and an electrode. Moreover, the characteristics of a thin film transistor are largely affected by the characteristics of the oxide semiconductor layer itself.

In order to form such interfaces in a clean condition, a gate insulating film, an oxide semiconductor layer, and a channel protective film are successively formed without being exposed to air. Preferably, the three layers are successively formed under reduced pressure so that an oxide semiconductor layer having an excellent interface can be obtained, and leakage current of a TFT in an off state can be small and a thin film transistor having high current-driving ability can be obtained. In particular, the oxide semiconductor layer is formed with a sputtering method in an atmosphere including oxygen at a flow rate of greater than or equal to 50% and less than or equal to 100%, preferably greater than or equal to 70% and less than or equal to 100%, whereby hydrogen can be prevented from being included in the oxide semiconductor layer.

Note that for the oxide semiconductor film, an oxide semiconductor including zinc oxide (ZnO) in an amorphous state, a polycrystalline state, or a microcrystalline state in which both amorphous and polycrystalline states exist, to which one or a plurality of impurity elements selected from the following is added can be used: Group 1 elements (for example, lithium (Li), sodium (Na), potassium (K), rubidium (Rb), and cesium (Cs)), Group 13 elements (for example, boron (B), gallium (Ga), indium (In), and thallium (Tl)), Group 14 elements (for example, carbon (C), silicon (Si), germanium (Ge), tin (Sn), and lead (Pb)), Group 15 elements (for example, nitrogen (N), phosphorus (P), arsenic (As), antimony (Sb), and bismuth (Bi)), Group 17 elements (for example, fluorine (F), chlorine (CO, bromine (Br), and iodine (I)), and the like. Alternatively, an oxide semiconductor including zinc oxide in an amorphous state, a polycrystalline state, or a microcrystalline state in which both amorphous and polycrystalline states exist, to which no impurity element is added can be used.

Specifically, for example, any of an oxide semiconductor such as magnesium zinc oxide ($Mg_xZn_{(1-x)}O$), cadmium zinc oxide ($Cd_xZn_{(1-x)}O$, or cadmium oxide (CdO); an In—Ga—Zn—O-based (a-IGZO) oxide semiconductor typified by $InGaO_3(ZnO)_5$; an In—Sn—Zn—O-based oxide semiconductor; a Ga—Sn—Zn—O-based oxide semiconductor; an In—Zn—O-based oxide semiconductor; a Sn—Zn—O-based oxide semiconductor; an In—Sn—O-based oxide semiconductor; or a Ga—Zn—O-based oxide semiconductor can be used. Note that the In—Ga—Zn—O-based oxide semiconductor is a material having a wide energy gap (Eg); therefore, even if two gate electrodes are provided above and below an oxide semiconductor film, an increase in off current can be suppressed, which is favorable.

Further, as the oxide semiconductor film, an oxide semiconductor film including silicon oxide which is obtained with a sputtering method using an oxide semiconductor target including $SiO_x$ may be used. Typically, an oxide semiconductor target including $SiO_2$ at greater than or equal to 0.1 weight % and less than or equal to 20 weight %, preferably at greater than or equal to 1 weight % and less than or equal to 6 weight % may be used to form a film so that the oxide semiconductor film includes $SiO_x$ (x>0) which inhibits crystallization. Thus, a thin film transistor whose gate threshold voltage at which a channel is formed is positive and as close to 0 V as possible can be realized.

For the formation of the oxide semiconductor layer, a vapor phase method such as a pulsed laser deposition method (a PLD method) or an electron beam deposition method can be employed, but a sputtering method in an atmosphere of only oxygen is suitable in terms of reduction in hydrogen. In general, sputtering is performed in an atmosphere including a rare gas such as Ar or Kr; however, such a rare gas element has larger mass than oxygen and thus there is a possibility that desorption of hydrogen, contained in moisture or hydrocarbon originating from gas adsorbed to an inner wall of a film formation chamber or a jig, is promoted in sputtering.

Sputtering is performed in an atmosphere of only oxygen, whereby desorption of a gas attached to an inner wall of the film formation chamber and a jig can be prevented. However, in order to increase deposition rate, a rare gas may be mixed with oxygen in the range where desorption of the gas from an inner wall of the film formation chamber or the like is not caused. Specifically, sputtering may be performed in an atmosphere including oxygen at a flow rate of greater than or equal to 50% and less than or equal to 100%, preferably greater than or equal to 70% and less than or equal to 100%.

An embodiment of the invention to be disclosed in this specification is a method for manufacturing a semiconductor device, including the steps of: forming a gate electrode over a substrate having an insulating surface; stacking a first insulating film, an oxide semiconductor layer which is formed with a sputtering method in an atmosphere including oxygen at a flow rate of greater than or equal to 50% and less than or equal to 100%, preferably greater than or equal to 70% and less than or equal to 100%, and a second insulating film in this order over the gate electrode without exposure to air; selectively etching the second insulating film to form a protective film in a position overlapping with the gate electrode; forming a conductive film over the oxide semiconductor layer and the protective film; and selectively etching the conductive film and the oxide semiconductor layer.

Another embodiment of the invention to be disclosed in this specification is a method for manufacturing a semiconductor device, including the steps of: forming a gate electrode over a substrate having an insulating surface; forming a first insulating film over the gate electrode; forming a conductive film over the first insulating film; selectively etching the conductive film to form a source electrode and a drain electrode; stacking an oxide semiconductor layer which is formed with a sputtering method in an atmosphere including oxygen at a flow rate of greater than or equal to 50% and less than or equal to 100%, preferably greater than or equal to 70% and less than or equal to 100%, and a second insulating film in this order over the first insulating film, the source electrode, and the drain electrode without exposure to air; selectively etching the second insulating film and the oxide semiconductor layer to form a protective film and an island-like semiconductor layer; and forming a third insulating film which covers the protective film and the island-like semiconductor layer.

The present invention achieves at least one of the above objects.

In the above manufacturing process, silicon oxynitride films are used as the first insulating film and the second insulating film. When the oxide semiconductor layer is interposed between the silicon oxynitride films, hydrogen, moisture, or the like can be prevented from entering or diffusing into the oxide semiconductor layer. The silicon oxynitride films may be formed, for example, with a sputtering method using silicon, silicon oxide, or the like as a sputtering target in an atmosphere including oxygen and nitrogen. The silicon oxynitride films can also be formed with a so-called CVD method such as a high-density plasma CVD method. In the case of a CVD method, an appropriate mixture of silane, dinitrogen monoxide, and nitrogen may be used as a reaction gas, for example.

Examples of a sputtering method include an RF sputtering method in which a high-frequency power source is used as a sputtering power source, a DC sputtering method, and a pulsed DC sputtering method in which a bias is applied in a pulsed manner. An RF sputtering method is mainly used in the case where an insulating film is formed, and a DC sputtering method is mainly used in the case where a metal film is formed.

In addition, there is also a multi-source sputtering apparatus in which a plurality of targets of different materials can be set. With the multi-source sputtering apparatus, films of different materials can be formed to be stacked in the same chamber, or a film of plural kinds of materials can be formed by electric discharge at the same time in the same chamber.

Further, there are a sputtering apparatus provided with a magnet system inside the chamber and used for magnetron sputtering, and a sputtering apparatus used for ECR sputtering in which plasma generated with the use of microwaves is used without using glow discharge.

An insulating film such as a silicon oxide film or a silicon nitride film may be used as the first insulating film or the second insulating film; however, use of the silicon oxynitride film including nitrogen at greater than or equal to 3 atomic % and less than or equal to 30 atomic % can prevent hydrogen, moisture, or the like from entering or diffusing into the oxide semiconductor layer. The insulating films are preferably formed under the condition where hysteresis or charge buildup is not caused in the thin film transistor.

The oxide semiconductor film is formed with a sputtering method using an oxide semiconductor target which includes at least In, Ga, and Zn, and the concentration of hydrogen included in the target needs to be as low as possible. In general, an oxide semiconductor target includes hydrogen at greater than or equal to $10^{20}$ atoms/cm$^3$ and less than or equal to $10^{21}$ atoms/cm$^3$ when measured by SIMS analysis; however, the hydrogen concentration is preferably $10^{19}$ atoms/cm$^3$ or lower.

In general, a target has a structure in which a target material is bonded to a metal plate called a backing plate. For example, a target material of an oxide semiconductor is formed in such a manner that oxides including indium (In), gallium (Ga), and zinc (Zn) are mixed at the same rate ($In_2O_3$:$Ga_2O_3$:ZnO=1:1:1 [molar ratio]), and the compound is sintered at a high temperature of 800° C. or more. The sintering is performed in an inert gas atmosphere (a nitrogen atmosphere or a rare gas atmosphere), whereby hydrogen, moisture, hydrocarbon, or the like can be prevented from being included in the target material. The sintering may be performed in vacuum or in a high-pressure atmosphere, and further, may be performed with application of mechanical pressure.

Note that the target material may have either an amorphous structure or a crystalline structure. As described above, the target material may include $SiO_2$ at greater than or equal to 0.1 weight % and less than or equal to 20 weight %, preferably greater than or equal to 1 weight % and less than or equal to 6 weight %. Note that, in this specification, a target material is referred to as a target in some cases unless otherwise specified.

In general, a backing plate has functions of cooling a target material and being a sputtering electrode and thus is often formed using copper, which is excellent in thermal conductivity and electric conductivity. A cooling path is formed inside or on the back surface of the backing plate, and water, oil, or the like circulates through the cooling path as a coolant; thus, cooling efficiency of a target can be increased. Note that water vaporizes at 100° C.; therefore, in the case where the temperature of the target needs to be kept at 100° C. or higher, oil or the like is preferable to water.

It is preferable that the target material and the backing plate be bonded to each other, for example, by electron beam welding. The electron beam welding refers to a method in which electrons generated in a vacuum atmosphere are accelerated, focused, and then delivered to an object, whereby welding can be performed only on a portion which is desired to be welded without damage on the material property of portions of the object except for the welded portion. In the electron beam welding, the shape of the welded portion and the depth of welding can be controlled. Since the welding is performed in vacuum, hydrogen, moisture, hydrocarbon, or the like can be prevented from attaching to the target material.

The manufactured target is transported while being held in a vacuum atmosphere or in an inert gas atmosphere (a nitrogen atmosphere or a rare gas atmosphere). Accordingly, hydrogen, moisture, hydrocarbon, or the like can be prevented from attaching to the target.

Similarly, the target is set in a sputtering apparatus in an inert gas atmosphere (a nitrogen atmosphere or a rare gas atmosphere) without being exposed to air. Accordingly, hydrogen, moisture, hydrocarbon, or the like can be prevented from attaching to the target.

After the target is set in the sputtering apparatus, dehydrogenation treatment is preferably performed to remove hydrogen which remains on a surface of or inside the target material. As the dehydrogenation treatment, a method in which the inside of the film formation chamber is heated to higher than or equal to 200° C. and lower than or equal to 600° C. under reduced pressure, a method in which introduction and exhaust of nitrogen or an inert gas are repeated while the inside of the film formation chamber is heated, and the like can be given. In this case, not water but oil or the like is preferably used as a coolant for the target. Although a certain level of effect can be obtained when introduction and exhaust of nitrogen are repeated without heating, it is more preferable to perform the treatment with the inside of the film formation chamber heated. Alternatively, oxygen, an inert gas, or both oxygen and an inert gas may be introduced into the film formation chamber, and plasma of an inert gas and/or oxygen may be generated using a high frequency or a microwave. Although a certain level of effect can be obtained when the treatment is performed without heating, it is preferable to perform the treatment with the inside of the film formation chamber heated.

Note that as a vacuum pump used for a vacuum apparatus such as a sputtering apparatus, for example, a cryopump may be used. The cryopump is a pump by which exhaust is performed in such a manner that a surface having extremely low temperature is provided in a vacuum chamber, and gas molecules in the vacuum chamber are condensed on or adsorbed to the surface having extremely low temperature so as to be captured. The cryopump has high capability of exhausting hydrogen or moisture.

In particular, the first insulating film, the oxide semiconductor layer, and the second insulating film are formed by any of the above-described heating and other methods as appropriate in an atmosphere in which the amount of hydrogen, moisture, and hydrocarbon is sufficiently reduced.

As a gas used in manufacturing the thin film transistor, a high-purity gas in which the concentration of hydrogen, moisture, hydrocarbon, or the like is reduced as much as possible is preferably used. Provision of a refiner between a gas supply source and each apparatus enables the further increase in gas purity. A gas whose purity is 99.9999% or higher is preferably used. Further, in order to prevent gas inclusion from an inner wall of a gas pipe, a gas pipe whose inner surface has been subjected to mirror polishing and passivation with $Cr_2O_3$ or $Al_2O_3$ is preferably used. As a joint or a valve of the pipe, an all-metal valve in which a resin is not used in its sealing portion is preferable.

In this specification, successive film formation is carried out as follows: a substrate to be processed is placed in an atmosphere which is controlled to be vacuum or an inert gas atmosphere (a nitrogen atmosphere or a rare gas atmosphere) at all times without being exposed to a contaminant atmosphere such as air during a process from a first film formation step to a second film formation step. By the successive film formation, film formation can be performed without reattachment of hydrogen, moisture, hydrocarbon, or the like to the substrate to be processed, which has been cleaned.

The conductive film functions as a source electrode and a drain electrode. The conductive film is formed using a single layer or a stacked layer of aluminum or an aluminum alloy to which an element to improve heat resistance or an element to prevent hillocks, such as copper, silicon, titanium, neodymium, scandium, or molybdenum, is added. Alternatively, a structure may be employed in which a layer including a high-melting-point metal such as titanium, molybdenum, or tungsten is provided on the lower side, the upper side, or both sides of a single layer or a stacked layer of aluminum or an aluminum alloy. Among all, titanium can be given as an example of a material having excellent interface characteristics with the oxide semiconductor layer. In particular, when a stack of a titanium film, an aluminum film, and a titanium film is used as the conductive film, the resistance is low. The aluminum film is interposed between the titanium films, whereby hillocks due to the aluminum film are less likely to be generated. Thus, the stack is suitable for the source electrode and the drain electrode.

Alternatively, between the gate electrode and the first insulating film, a silicon nitride film or a silicon oxide film may be additionally provided. In other words, the gate insulating film may have a stacked-layer structure of two or more layers. A silicon oxynitride film is preferable as the first insulating film which is the uppermost layer of the gate insulating film and in contact with the oxide semiconductor layer, while an insulating film formed under the first insulating film may be a silicon nitride film or a silicon oxide film. By provision of such a silicon nitride film or a silicon oxide film, the film serves as an etching stopper to prevent a surface of a substrate from being etched in a manufacturing process of a TFT. The silicon nitride film or the silicon oxide film can prevent mobile ions of sodium or the like from entering a semiconductor region from a glass substrate including alkali metal such as sodium, so that variation in electric characteristics of a TFT can be suppressed.

Thus, a structure can be realized in which gate threshold voltage at which a channel is formed is positive and as close to 0 V as possible in a thin film transistor including an oxide semiconductor film. Moreover, variation in threshold voltage can be reduced, deterioration of electric characteristics can be prevented, and shift to normally on of a TFT can be reduced, or preferably eliminated.

BRIEF DESCRIPTION OF THE DRAWINGS

In the accompanying drawings:

FIGS. 11A1, 11A2, and 11B illustrate semiconductor devices according to one embodiment of the present invention;

DETAILED DESCRIPTION OF THE INVENTION

Embodiments of the present invention will be described below.

Embodiment 1

In this embodiment, a thin film transistor and a manufacturing process thereof will be described with reference to FIGS. 1A to 1E.

Figure 1A:
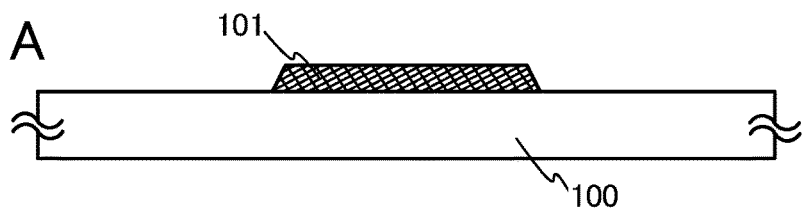
FIGS. 1A to 1E are cross-sectional views illustrating a manufacturing process of a thin film transistor which is one embodiment of the present invention.

First, a gate electrode 101 is formed over a substrate 100 (see FIG. 1A).

As the substrate 100, any of the following substrates can be used: non-alkaline glass substrates formed of barium borosilicate glass, aluminoborosilicate glass, aluminosilicate glass, and the like with a fusion method or a float method; ceramic substrates; plastic substrates having heat resistance sufficient to withstand a process temperature of this manufacturing process; and the like. Alternatively, a metal substrate such as a stainless steel alloy substrate which is provided with an insulating film over the surface may be used. As the substrate 100, a substrate having a size of 320 mm×400 mm, 370 mm×470 mm, 550 mm×650 mm, 600 mm×720 mm, 680 mm×880 mm, 730 mm×920 mm, 1000 mm×1200 mm, 1100 mm×1250 mm, 1150 mm×1300 mm, 1500 mm×1800 mm, 1900 mm×2200 mm, 2160 mm×2460 mm, 2400 mm×2800 mm, 2850 mm×3050 mm, or the like can be used.

Further, a base insulating film may be formed over the substrate 100 before the gate electrode 101 is formed. The base insulating film can be formed with a single layer or stacked layers of any of a silicon oxide film, a silicon nitride film, a silicon oxynitride film, and a silicon nitride oxide film with a CVD method, a sputtering method, or the like. A small amount of a halogen element such as fluorine or chlorine may be added to the base insulating film to immobilize mobile ions of sodium or the like. The peak of the concentration of a halogen element to be included in the insulating film, when measured by secondary ion mass spectrometry (SIMS), is preferably in the range of greater than or equal to $1 \times 10^{15}$ cm$^{-3}$ and less than or equal to $1 \times 10^{20}$ cm$^{-3}$.

The gate electrode 101 is formed by using a metal material such as titanium, molybdenum, chromium, tantalum, tungsten, or aluminum, or an alloy material thereof. The gate electrode 101 can be formed in such a manner that a conductive film is formed over the substrate 100 by a sputtering method or a vacuum evaporation method; a mask is formed over the conductive film by a photolithography technique or an inkjet method; and the conductive film is etched using the mask. Alternatively, the gate electrode 101 can be formed by discharging a conductive nanopaste of silver, gold, copper, or the like with an inkjet method and baking the conductive nanopaste. Note that, as bather metal which increases adhesion of the gate electrode 101 and prevents diffusion to the substrate or the base film, a nitride film of the above metal material may be provided between the substrate 100 and the gate electrode 101. The gate electrode 101 may have a single-layer structure or a stacked-layer structure. For example, a structure in which a molybdenum film and an aluminum film are stacked in this order, a structure in which a molybdenum film and an alloy film of aluminum and neodymium are stacked in this order, a structure in which a titanium film and an aluminum film are stacked in this order, a structure in which a titanium film, an aluminum film, and a titanium film are stacked in this order, or the like can be formed over the substrate 100.

In this embodiment, a stacked-layer film of an aluminum film and a molybdenum film is formed with a sputtering method and is selectively etched with a photolithography technique. Here, a first photomask is used. Note that, since a semiconductor film and a wiring are formed over the gate electrode 101, the gate electrode 101 is preferably processed to have tapered end portions in order to prevent disconnection.

Figure 1B:
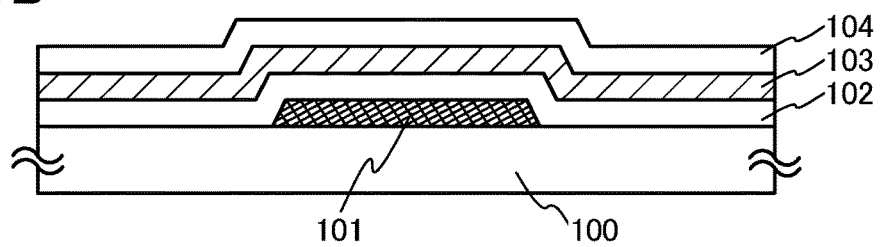
Figure 1C:
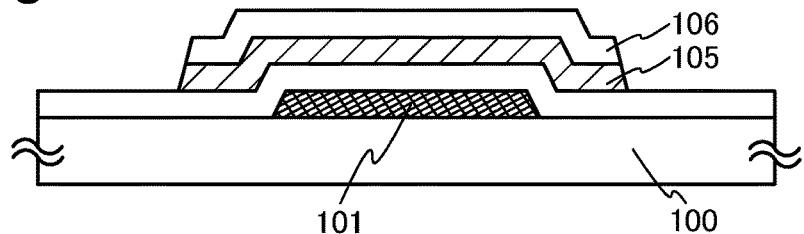
Figure 1D:
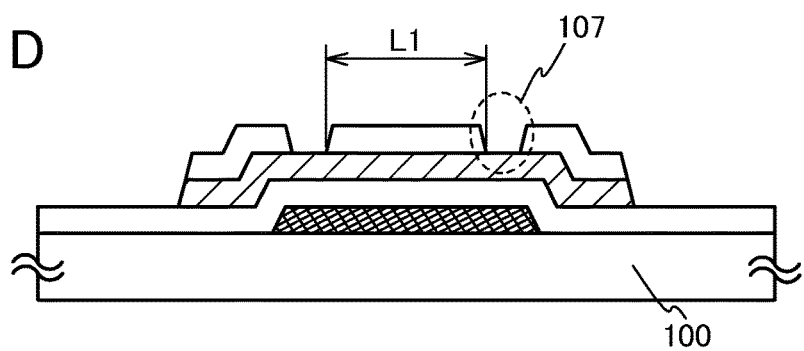
Figure 1E:
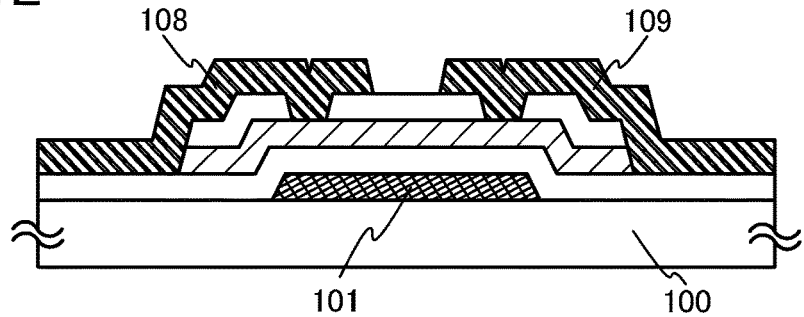

Next, a first insulating film 102 serving as a gate insulating film, a semiconductor film 103, and a second insulating film 104 are successively formed without being exposed to air (see FIG. 1B). When the films are formed successively without being exposed to air, high productivity is obtained and the reliability of interfaces between the thin films is increased. In addition, each interface between the stacked layers can be formed without being contaminated by moisture, hydrocarbon, or another contaminant impurity element which is included in air; thus, hydrogen can be prevented from being taken into the semiconductor film.

The first insulating film 102 and the second insulating film 104 can be formed using a silicon oxide film, a silicon nitride film, a silicon oxynitride film, or a silicon nitride oxide film with a CVD method, a sputtering method, or the like. Here, as the first insulating film 102 and the second insulating film 104, silicon oxynitride films each including nitrogen at greater than or equal to 3 atomic % and less than or equal to 30 atomic % are formed with an RF sputtering method. By use of the silicon oxynitride films each including nitrogen at greater than or equal to 3 atomic % and less than or equal to 30 atomic %, hydrogen, moisture, or the like can be prevented from entering or diffusing into the semiconductor film 103. The insulating films are preferably formed under the condition where hysteresis or charge buildup is not caused in the thin film transistor.

The first insulating film 102 can also have a stacked-layer structure of two or more layers. A silicon oxynitride film is preferable as a film which forms the uppermost layer of the first insulating film 102 and which is in contact with the oxide semiconductor layer, while an insulating film provided under the uppermost layer may be a silicon nitride film or a silicon oxide film. This film in the lower layer of the first insulating film 102 has an effect of preventing hillock generation when a material that may cause hillocks is used for the gate electrode 101.

Here, an oxide semiconductor layer (an IGZO semiconductor layer) is formed as the semiconductor film 103 with a DC magnetron sputtering method. In this specification, a semiconductor layer formed using an oxide semiconductor film including In, Ga, and Zn is also referred to as an "IGZO semiconductor layer." The IGZO semiconductor layer has high flexibility in the composition ratio of the metal elements and functions as a semiconductor layer at a wide range of mixture ratio. For example, indium oxide including zinc oxide at 10 weight %, a material in which indium oxide, gallium oxide, and zinc oxide are mixed in equimolar ratios, and oxide including In, Ga, and Zn at a ratio of 2.2:2.2:1.0 [atomic ratio] can be given. In order to reduce variation in electric characteristics of the thin film transistor, it is preferable that the IGZO semiconductor layer be in an amorphous state.

The semiconductor film 103 is formed in an atmosphere of only oxygen. In general, sputtering is often performed in an atmosphere including a rare gas such as Ar or Kr; however, such a rare gas element has larger mass than oxygen and thus there is a possibility that desorption of hydrogen, contained in moisture or hydrocarbon originating from gas adsorbed to an inner wall of a film formation chamber or a jig, is promoted in sputtering. However, in order to increase deposition rate, a rare gas may be mixed with oxygen in the range where desorption of a gas from an inner wall of the film formation chamber or the like is not caused. Specifically, the sputtering may be performed in an atmosphere including oxygen at a flow rate of greater than or equal to 50% and less than or equal to 100%, preferably greater than or equal to 70% and less than or equal to 100%. Note that the semiconductor film 103 is preferably formed under the condition that the substrate temperature is higher than or equal to room temperature (25° C.) and lower than 200° C.

Next, in order to pattern the semiconductor film 103, the second insulating film 104 is selectively etched to form an insulator 106, and the semiconductor film 103 is selectively etched to form an IGZO semiconductor layer 105. The etching is performed with a dry etching method using a chlorine gas. The insulator 106 functions as a channel protective film. In this stage, a surface of the gate insulating film is exposed in a region where the semiconductor film 103 is removed. Here, a second photomask is used. The mask formed over the second insulating film 104 in the patterning is removed by ashing treatment in an oxygen atmosphere. The cross-sectional structure of the substrate at this stage corresponds to the cross-sectional view of the substrate illustrated in FIG. 1C (see FIG. 1C). In order to eliminate moisture from the manufacturing process of the thin film transistor as much as possible, cleaning using water is not necessarily performed after that.

Next, heat treatment is preferably performed at higher than or equal to 200° C. and lower than or equal to 600° C., typically higher than or equal to 300° C. and lower than or equal to 500° C. Here, heat treatment is performed in a furnace at 350° C. for 1 hour in a nitrogen atmosphere including oxygen. This heat treatment allows atoms of the IGZO semiconductor layer 105 to be rearranged. By this heat treatment (the heat treatment may be light annealing), strain which inhibits carrier movement is released. There is no particular limitation on timing of the heat treatment as long as it is performed after the formation of the semiconductor film 103. In this embodiment, since the IGZO semiconductor layer 105 is covered with the insulator 106, deterioration of the IGZO semiconductor layer 105 after the heat treatment can be suppressed, which is preferable.

Next, part of the insulator 106 is removed, and a contact hole (opening) 107 for connecting the IGZO semiconductor layer 105 with a source electrode 108 or a drain electrode 109 which will be formed later is formed. A photolithography technique is employed to form the contact hole (opening) 107 by selective etching so that part of the IGZO semiconductor layer 105 is exposed. Here, a third photomask is used. The etching is performed with a dry etching method using a chlorine gas. The etching for forming the contact hole (opening) 107 is performed under the condition where the etching rate of the insulator 106 is sufficiently different from that of the IGZO semiconductor layer 105. Alternatively, the contact hole (opening) 107 may be formed by selectively removing only the insulator 106 by laser irradiation.

The contact hole (opening) 107 is preferably formed as small as possible in order to eliminate adverse effect of hydrogen, moisture, hydrocarbon, or the like on the IGZO semiconductor layer 105 in the formation of the contact hole (opening) 107. However, when the contact hole (opening) 107 is too small, sufficient characteristics of a completed thin film transistor cannot be obtained. Therefore, the contact hole (opening) 107 may be formed as small as possible within the range where adverse effect is not caused.

Next, a metal multilayer film serving as the source electrode and the drain electrode is formed. Here, an aluminum film is stacked over a titanium film, and another titanium film is stacked over the aluminum film with a DC magnetron sputtering method. Both a titanium target and an aluminum target are set in a sputtering chamber, and the films are successively formed using shutters so as to be sequentially stacked; thus, successive stacking can be performed in one chamber. At this time, an atmosphere of only a rare gas such as Ar or Kr may be employed. This is because the IGZO semiconductor layer 105 has already been interposed between the first insulating film 102 and the second insulating film 104 and thus a channel formation region in the IGZO semiconductor layer 105 is not particularly affected by hydrogen, moisture, hydrocarbon, or the like due to gas desorption from an inner wall of the chamber.

Before the metal multilayer film is formed, the IGZO semiconductor layer exposed in the contact hole (opening) 107 may be etched by approximately 10 nm by reverse sputtering. The reverse sputtering is a method by which voltage is applied to a substrate side to generate plasma on the substrate side in an inert gas atmosphere or an oxygen atmosphere, without applying voltage to a target side, so that a surface is etched. By the reverse sputtering, a favorable condition of an interface between the IGZO semiconductor layer and the metal multilayer film can be realized, and the contact resistance can be reduced.

Note that an oxide semiconductor film serving as a buffer layer may be formed between the IGZO semiconductor layer and the metal multilayer film. For example, titanium oxide, molybdenum oxide, zinc oxide, indium oxide, tungsten oxide, magnesium oxide, calcium oxide, tin oxide, or the like can be used. Further, an Al—Zn—O-based non-single-crystal film or an Al—Zn—O-based non-single-crystal film including nitrogen, that is, an Al—Zn—O—N-based non-single-crystal film may be used. The amount of aluminum included in the Al—Zn—O-based oxide semiconductor or the Al—Zn—O—N-based oxide semiconductor is preferably greater than or equal to 1 weight % and less than or equal to 10 weight %.

Note that the term Al—Zn—O—N-based oxide semiconductor film is used here just for convenience in denotation and does not mean that the stoichiometric proportion of Al to Zn to O to N in the film is 1:1:1:1. The constituent ratio of these elements can be adjusted as appropriate by conditions of film formation.

The buffer layer may include an impurity imparting n-type or p-type conductivity. As the impurity element, indium, gallium, aluminum, zinc, tin, or the like can be used.

Since the buffer layer has a higher carrier concentration than the IGZO semiconductor layer and is superior in conductivity, the contact resistance can be reduced as compared to the case of directly attaching the source electrode and the drain electrode to the IGZO semiconductor layer.

The buffer layer can also be referred to as a drain region or a source region.

Next, the metal multilayer film is selectively etched to form the source electrode 108 and the drain electrode 109. Here, a fourth photomask is used. The three-layer conductive film in which a titanium film, an aluminum film, and a titanium film are sequentially stacked can be etched with a dry etching method using a chlorine gas. Also in the case where a buffer layer is formed between the IGZO semiconductor layer and the metal multilayer film, the buffer layer can be etched at the same time as the metal multilayer film. The cross-sectional structure of the substrate at this stage corresponds to the cross-sectional view of the substrate illustrated in FIG. 1E (see FIG. 1E).

In this embodiment, a channel formation region is a region of the IGZO semiconductor layer 105, where the gate electrode 101 and the IGZO semiconductor layer 105 overlap with each other. The channel formation region is a region from an end portion of the contact hole (opening) 107 for connecting the source electrode 108 with the IGZO semiconductor layer 105 to an end portion of the contact hole (opening) 107 for connecting the drain electrode 109 with the IGZO semiconductor layer 105. L1 in FIG. 1D corresponds to a channel length.

The channel formation region of the IGZO semiconductor layer 105 is interposed between the silicon oxynitride films each including nitrogen at greater than or equal to 3 atomic % and less than or equal to 30 atomic %, whereby hydrogen, moisture, or the like can be prevented from entering or diffusing into the channel formation region. The silicon oxynitride films are preferably formed under the condition where hysteresis or charge buildup is not caused in the thin film transistor.

Embodiment 2

In this embodiment, a thin film transistor and a manufacturing process thereof will be described with reference to FIGS. 2A to 2F. Note that repetitive description of the same portions as Embodiment 1 or portions having functions similar to those in Embodiment 1, and steps for forming such portions will be omitted.

First, a gate electrode 201 is formed over a substrate 200. Here, a first photomask is used (see FIG. 2A).

Figure 2A:
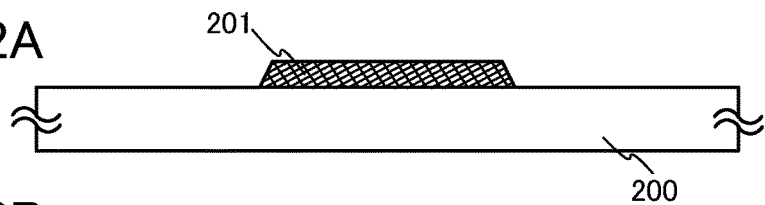
FIGS. 2A to 2F are cross-sectional views illustrating a manufacturing process of a thin film transistor which is one embodiment of the present invention.
Figure 2B:
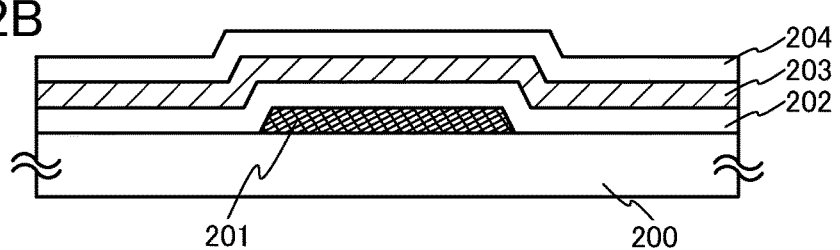
Figure 2C:
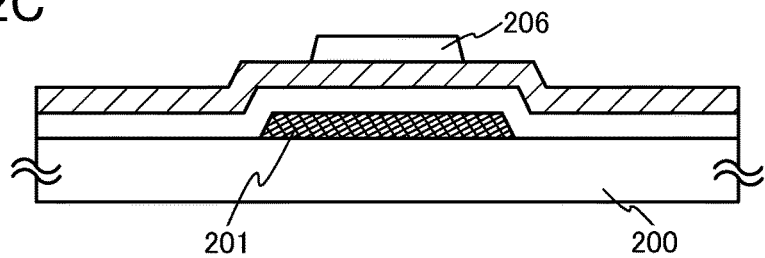
Figure 2D:
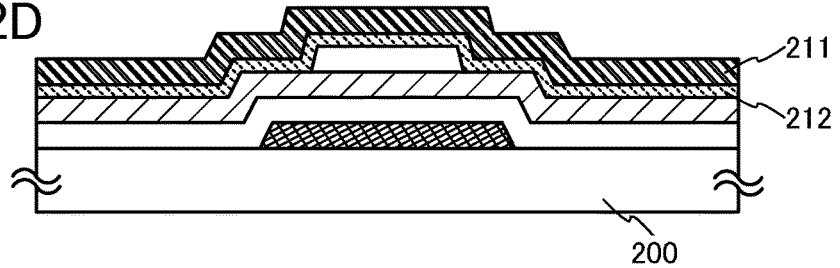
Figure 2E:
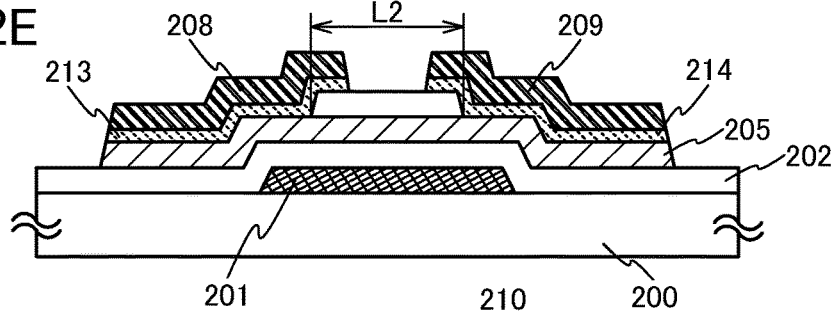
Figure 2F:
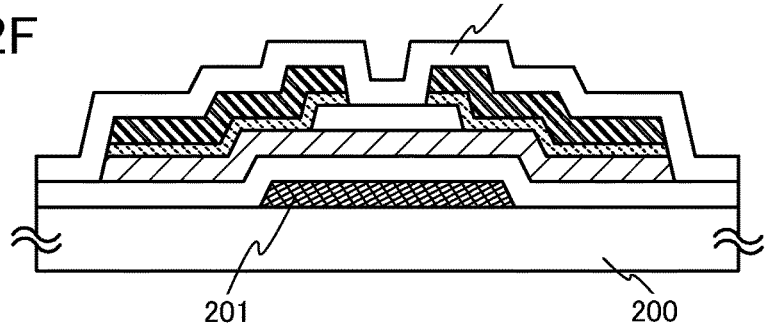

Next, a first insulating film 202 serving as a gate insulating film, a first semiconductor film 203, and a second insulating film 204 are successively formed without being exposed to air (see FIG. 2B). Here, as the first insulating film 202 and the second insulating film 204, silicon oxynitride films each including nitrogen at greater than or equal to 3 atomic % and less than or equal to 30 atomic % are formed with an RF sputtering method. As the first semiconductor film 203, an oxide semiconductor layer is formed with a DC magnetron sputtering method using an oxide semiconductor target in which $SiO_2$ is added at greater than or equal to 0.1 weight % and less than or equal to 20 weight % to a zinc (Zn)-including oxide semiconductor (ZnO). As described in Embodiment 1, the oxide semiconductor layer is formed in an atmosphere of only oxygen; however, an atmosphere in which a rare gas is mixed, where the flow rate of oxygen is greater than or equal to 50% and less than or equal to 100%, preferably greater than or equal to 70% and less than or equal to 100%, may also be employed. Note that the first semiconductor film 203 is preferably formed under the condition that the substrate temperature is higher than or equal to room temperature (25° C.) and lower than 200° C.

Next, the second insulating film 204 is etched so that only a portion which overlaps with the gate electrode and a portion serving as a channel formation region of the first semiconductor film 203 is left; thus, an insulator 206 is formed. The insulator 206 functions as a channel protective film. A photolithography technique is employed to form the insulator 206 by selective etching. Here, a second photomask is used. This etching for forming the insulator 206 is performed with a dry etching method under the condition where the etching rate of the second insulating film 204 is sufficiently different from that of the first semiconductor film 203 (see FIG. 2C). The mask formed over the second insulating film 204 in the patterning is removed by ashing treatment in an oxygen atmosphere. In order to eliminate moisture from the manufacturing process of the thin film transistor as much as possible, cleaning using water is not necessarily performed after that.

In addition, in the formation of the insulator 206, a mask can be selectively formed in a position overlapping with the gate electrode in a self-alignment manner by rear-face exposure, without using a photomask. In particular, since the first semiconductor film 203 is an oxide semiconductor film and has a high light-transmitting property, it is suitable for rear-face exposure. Note that, in the case of rear-face exposure, both the first insulating film 202 and the second insulating film 204 need to include materials having sufficient light-transmitting properties.

Next, heat treatment is preferably performed at higher than or equal to 200° C. and lower than or equal to 600° C., typically higher than or equal to 300° C. and lower than or equal to 500° C. Here, heat treatment is performed in a furnace at 350° C. for 1 hour in a nitrogen atmosphere including oxygen. This heat treatment allows atoms of the first semiconductor film 203 to be rearranged. By this heat treatment (the heat treatment may be light annealing), strain which inhibits carrier movement is released. There is no particular limitation on timing of the heat treatment as long as it is performed after the formation of the first semiconductor film 203. In this embodiment, since the top surface of the first semiconductor film 203 is covered with the insulator 206, deterioration of the first semiconductor film 203 after the heat treatment can be suppressed, which is preferable.

Next, a second semiconductor film 212 serving as buffer layers, and a metal multilayer film 211 serving as a source electrode and a drain electrode are formed. Here, a titanium oxide film is formed as the second semiconductor film 212 with a DC magnetron sputtering method. Then, the metal multilayer film 211 is formed in such a manner that a titanium film is stacked over the second semiconductor film 212, an aluminum film is stacked over the titanium film, and another titanium film is stacked over the aluminum film with a DC magnetron sputtering method (see FIG. 2D).

Since the second semiconductor film 212 serving as buffer layers has a higher carrier concentration than the oxide semiconductor layer and is superior in conductivity, the contact resistance can be reduced when the buffer layers are provided as compared to the case of directly attaching the source electrode and the drain electrode to the semiconductor layer.

After the second semiconductor film 212 serving as the buffer layers is formed, heat treatment is preferably performed at higher than or equal to 200° C. and lower than or equal to 600° C., typically higher than or equal to 300° C.

and lower than or equal to 500° C. Here, heat treatment is performed in a furnace at 350° C. for 1 hour in a nitrogen atmosphere including oxygen. This heat treatment allows atoms of the second semiconductor film 212 to be rearranged. By this heat treatment (the heat treatment may be light annealing), strain which inhibits carrier movement is released.

Next, the metal multilayer film is selectively etched to form a source electrode 208 and a drain electrode 209. Here, a third photomask is used. The etching is performed with a dry etching method. At this time, the etching is performed under the condition where all of the metal multilayer film 211, the second semiconductor film 212, and the first semiconductor film 203 can be etched, whereby the source electrode 208, the drain electrode 209, a source-side buffer layer 213, a drain-side buffer layer 214, and a semiconductor layer 205 can be formed in the same etching step. The insulator 206 functions as a channel protective film and prevents the semiconductor layer 205 in a channel formation region from being etched (see FIG. 2E).

In this embodiment, a channel formation region is a region of the semiconductor layer 205, where the gate electrode 201, the semiconductor layer 205, and the insulator 206 overlap with each other. A width L2 of the insulator 206 corresponds to a channel length.

As the layers provided over and under the channel formation region of the semiconductor layer 205, silicon oxynitride films each including nitrogen at greater than or equal to 3 atomic % and less than or equal to 30 atomic % are formed so that the channel formation region is interposed between the silicon oxynitride films, whereby hydrogen, moisture, or the like can be prevented from entering or diffusing into the channel formation region.

Note that, in order to prevent entry or diffusion of hydrogen, moisture, or the like through a side surface portion of the semiconductor layer, a third insulating film 210 may be formed so as to cover the thin film transistor. The third insulating film 210 can be formed using a silicon oxide film, a silicon nitride film, a silicon oxynitride film, or a silicon nitride oxide film. For example, a silicon oxynitride film including nitrogen at greater than or equal to 3 atomic % and less than or equal to 30 atomic % may be formed with a sputtering method. By use of the silicon oxynitride film including nitrogen at greater than or equal to 3 atomic % and less than or equal to 30 atomic %, hydrogen, moisture, hydrocarbon, or the like can be prevented from entering or diffusing into the thin film transistor. The silicon oxynitride film is preferably formed under the condition where hysteresis or charge buildup is not caused in the thin film transistor.

Embodiment 3

In this embodiment, a thin film transistor and a manufacturing process thereof will be described with reference to FIGS. 3A to 3E. Note that repetitive description of the same portions as Embodiment 1 or portions having functions similar to those in Embodiment 1, and steps for forming such portions will be omitted.

First, a gate electrode 301 is formed over a substrate 300. Here, a first photomask is used.

Next, a first insulating film 302, serving as a gate insulating film, and a metal multilayer film 311, serving as a source electrode and a drain electrode, are formed.

The first insulating film 302 can be formed using a silicon oxide film, a silicon nitride film, a silicon oxynitride film, or a silicon nitride oxide film with a CVD method, a sputtering method, or the like. Here, a silicon oxynitride film including nitrogen at greater than or equal to 3 atomic % and less than or equal to 30 atomic % is formed as the first insulating film 302 with an RF sputtering method.

Figure 3A:
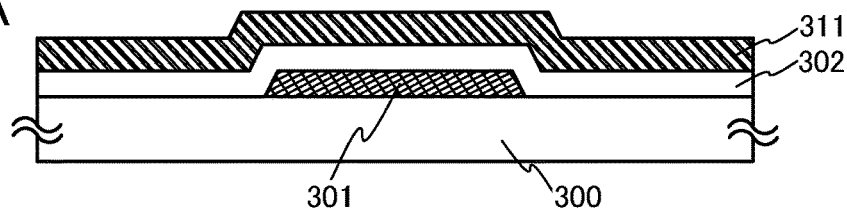
FIGS. 3A to 3E are cross-sectional views illustrating a manufacturing process of a thin film transistor which is one embodiment of the present invention.
Figure 3B:
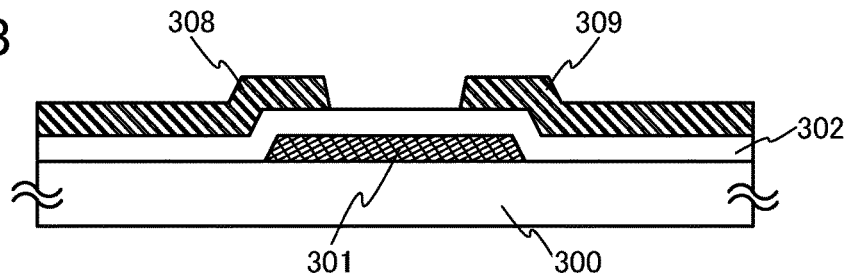

The metal multilayer film 311 serving as the source electrode and the drain electrode is formed in such a manner that an aluminum film is stacked over a titanium film and another titanium film is stacked over the aluminum film with a DC magnetron sputtering method (see FIG. 3A).

Next, the metal multilayer film is selectively etched to form a source electrode 308 and a drain electrode 309. Here, a second photomask is used (see FIG. 3B).

Figure 3C:
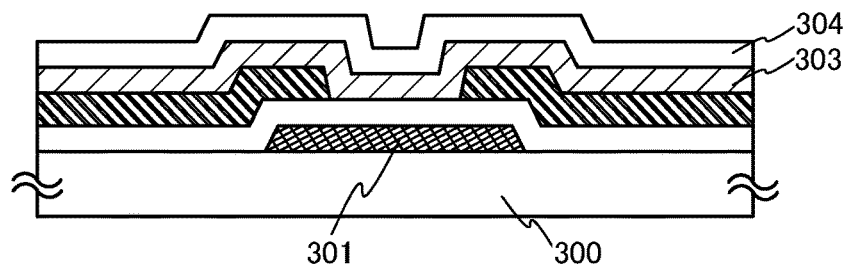
Figure 3D:
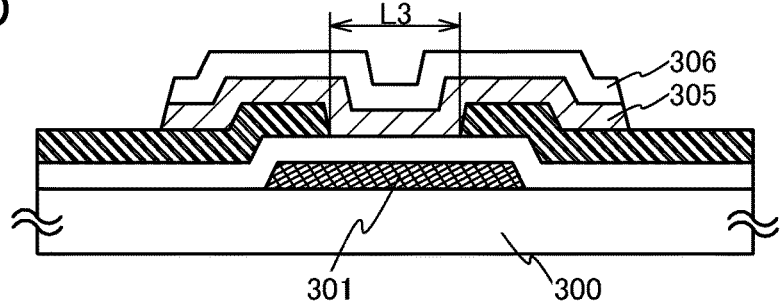
Figure 3E:
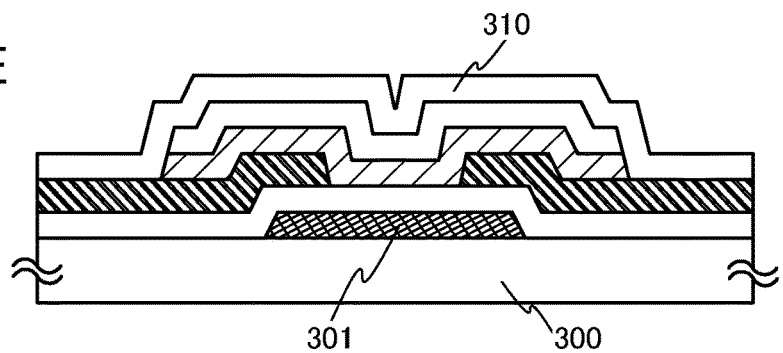

Then, a semiconductor film 303 and a second insulating film 304 are successively formed without being exposed to air (see FIG. 3C). As the semiconductor film 303, an oxide semiconductor layer (a ZnO—SiO$_x$ (x>0) semiconductor layer) which is formed with a DC magnetron sputtering method using a target of zinc oxide including silicon oxide at 10 weight % is used. As described in Embodiment 1, the oxide semiconductor layer is formed in an atmosphere of only oxygen; however, an atmosphere in which a rare gas is mixed, where the flow rate of oxygen is greater than or equal to 50% and less than or equal to 100%, preferably greater than or equal to 70% and less than or equal to 100%, may also be employed. Note that the semiconductor film 303 is preferably formed under the condition that the substrate temperature is higher than or equal to room temperature (25° C.) and lower than 200° C.

Here, results of evaluating the crystallinity of an oxide semiconductor layer (a ZnO—SiO semiconductor layer) by XRD measurement are shown. The measurement is performed on three kinds of oxide semiconductor layers (ZnO—SiO semiconductor layers) which are formed using respective targets of zinc oxide including silicon oxide at 7.5 weight %, 10 weight %, and 12.5 weight %.

Figure 26:
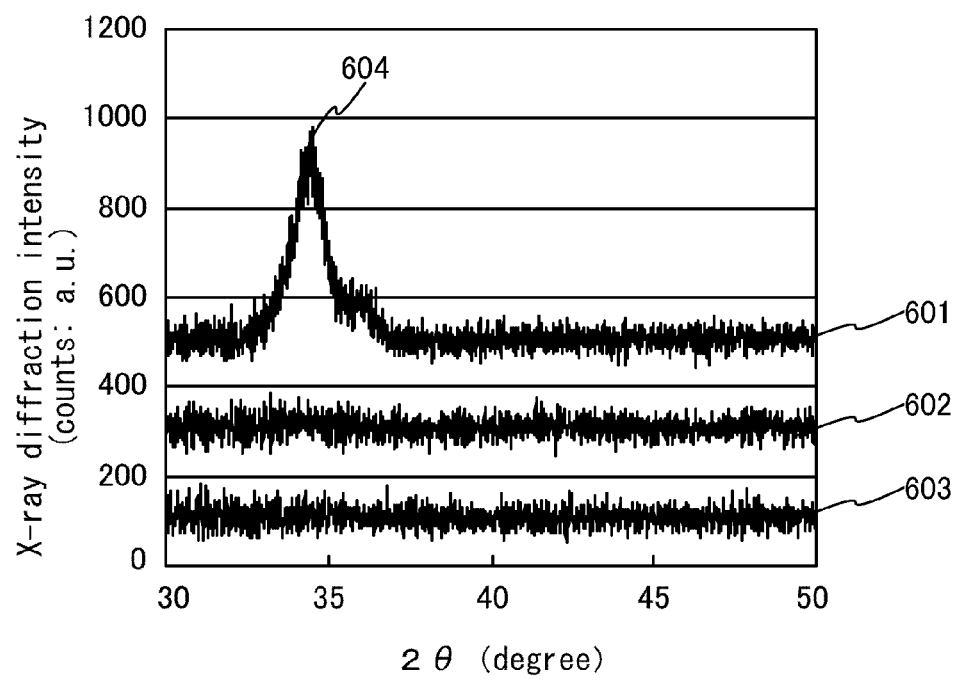
FIG. 26 shows a result of XRD measurement of an oxide semiconductor layer.

FIG. 26 shows results of the XRD measurement. The horizontal axis represents a rotation angle (2θ) of a measurement sample and a signal detection portion with respect to an incident X-ray, and the vertical axis represents X-ray diffraction intensity. FIG. 26 shows a measurement result 601 in the case of including silicon oxide at 7.5 weight %, a measurement result 602 in the case of including silicon oxide at 10 weight %, and a measurement result 603 in the case of including silicon oxide at 12.5 weight %.

According to the measurement results in FIG. 26, the following can be found: a peak 604 showing crystallinity is detected when 7.5 weight % of silicon oxide is included, while no peak showing crystallinity is detected and an amorphous film is formed when 10 weight % or more of silicon oxide is included. Therefore, a ZnO—SiO$_x$ (x>0) semiconductor layer which includes silicon oxide at 10 weight % or more can be kept amorphous even in heat treatment at 700° C.

Before the semiconductor film 303 is formed, surfaces of the first insulating film 302, the source electrode 308, and the drain electrode 309 may be etched by approximately 10 nm by reverse sputtering. By the reverse sputtering, hydrogen, moisture, hydrocarbon, or the like which is attached to the surfaces of the first insulating film 302, the source electrode 308, and the drain electrode 309 can be removed.

Next, in order to pattern the semiconductor film 303, the second insulating film 304 is selectively etched to form an insulator 306, and the semiconductor film 303 is selectively etched to form a ZnO—SiO$_x$ (x>0) semiconductor layer 305. Here, a third photomask is used. The mask formed over the second insulating film 304 in the patterning is removed by ashing treatment in an oxygen atmosphere. The insulator 306 functions as a channel protective film. The etching is performed with a dry etching method. In order to eliminate moisture from the manufacturing process of the thin film transistor as much as possible, cleaning using water is not necessarily performed after that.

Next, heat treatment is preferably performed at higher than or equal to 200° C. and lower than or equal to 600° C., typically higher than or equal to 300° C. and lower than or equal to 500° C. Here, heat treatment is performed in a furnace at 350° C. for 1 hour in a nitrogen atmosphere including oxygen. This heat treatment allows atoms of the semiconductor layer 305 to be rearranged. By this heat treatment (the heat treatment may be light annealing), strain which inhibits carrier movement is released. There is no particular limitation on timing of the heat treatment as long as it is performed after the formation of the semiconductor film 303. In this embodiment, since the top surface of the semiconductor layer 305 is covered with the insulator 306, deterioration of the semiconductor layer 305 after the heat treatment can be suppressed, which is preferable.

In this embodiment, a channel formation region is a region of the $ZnO$—$SiO_x$ (x>0) semiconductor layer 305, which overlaps with the gate electrode 301 and is located between the source electrode 308 and the drain electrode 309. A distance L3 between the source electrode 308 and the drain electrode 309 corresponds to a channel length.

As the layers provided over and under the channel formation region of the semiconductor layer 305, silicon oxynitride films each including nitrogen at greater than or equal to 3 atomic % and less than or equal to 30 atomic % are formed so that the channel formation region is interposed between the silicon oxynitride films, whereby hydrogen, moisture, or the like can be prevented from entering or diffusing into the channel formation region. The silicon oxynitride films are preferably formed under the condition where hysteresis or charge buildup is not caused in the thin film transistor.

Note that, in order to prevent entry or diffusion of hydrogen, moisture, or the like through a side surface portion of the $ZnO$—$SiO_x$ (x>0) semiconductor layer, a third insulating film 310 may be formed so as to cover the thin film transistor. The third insulating film 310 is preferably formed under the condition where hysteresis or charge buildup is not caused in the thin film transistor. The third insulating film 310 can be formed using a silicon oxide film, a silicon nitride film, a silicon oxynitride film, or a silicon nitride oxide film. For example, a silicon oxynitride film including nitrogen at greater than or equal to 3 atomic % and less than or equal to 30 atomic % may be formed with an RF sputtering method. By use of the silicon oxynitride film including nitrogen at greater than or equal to 3 atomic % and less than or equal to 30 atomic %, hydrogen, moisture, or the like can be prevented from entering or diffusing into the thin film transistor.

Further, an oxide semiconductor film serving as a buffer layer may be formed between the $ZnO$—$SiO_x$ (x>0) semiconductor layer and the metal multilayer film as needed.

Embodiment 4

In this embodiment, a thin film transistor and a manufacturing process thereof will be described with reference to FIGS. 4A to 4E. Note that repetitive description of the same portions as Embodiment 1 or portions having functions similar to those in Embodiment 1, and steps for forming such portions will be omitted.

First, a gate electrode 401 is formed over a substrate 400. Here, a first photomask is used (see FIG. 4A).

Figure 4A:
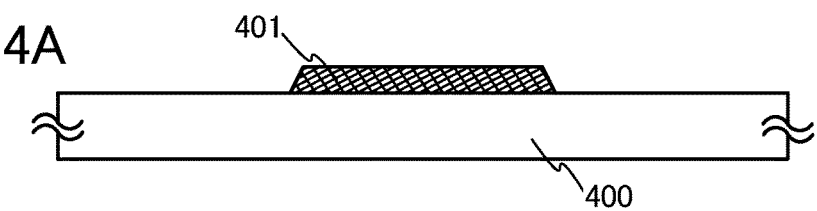
FIGS. 4A to 4E are cross-sectional views illustrating a manufacturing process of a thin film transistor which is one embodiment of the present invention.
Figure 4B:
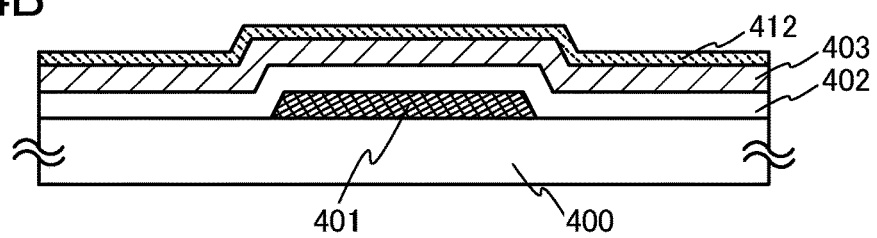
Figure 4C:
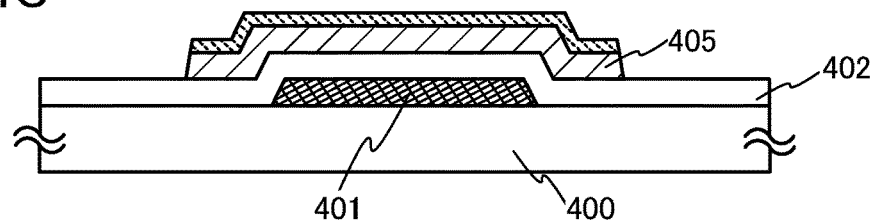
Figure 4D:
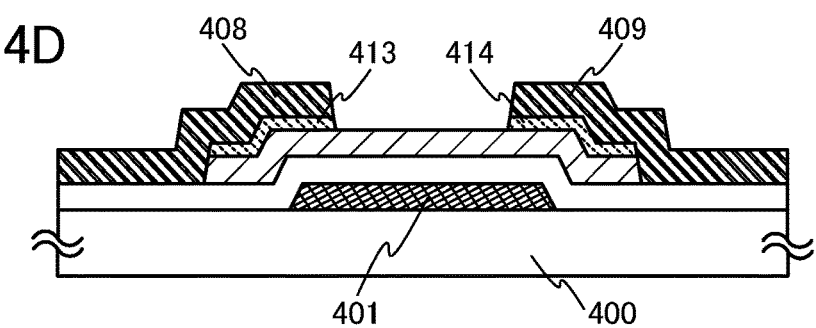
Figure 4E:
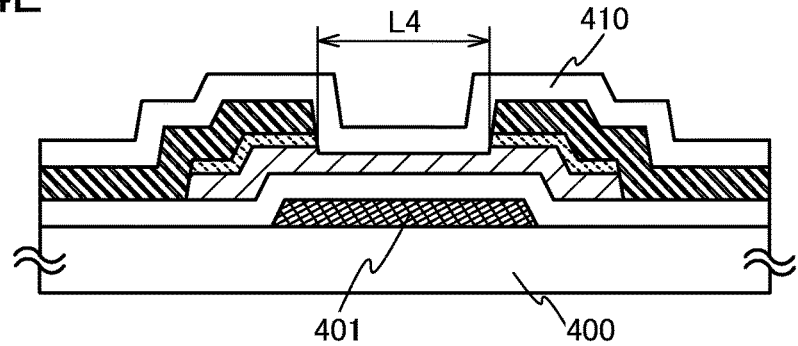

Next, a first insulating film 402 serving as a gate insulating film, a first semiconductor film 403, and a second semiconductor film 412 are successively formed without being exposed to air (see FIG. 4B). Here, as the first insulating film 402, a silicon oxynitride film including nitrogen at greater than or equal to 3 atomic % and less than or equal to 30 atomic % is formed with an RF sputtering method. An IGZO semiconductor layer is formed as the first semiconductor film 403 with a DC magnetron sputtering method, and an Al—Zn—O—N-based oxide semiconductor film is formed as the second semiconductor film 412. Note that the oxide semiconductor films are preferably formed under the condition that the substrate temperature is higher than or equal to room temperature (25° C.) and lower than 200° C.

Note that the term Al—Zn—O—N-based oxide semiconductor film is used here just for convenience in denotation and does not mean that the stoichiometric proportion of Al to Zn to O to N in the film is 1:1:1:1. The constituent ratio of these elements can be adjusted as appropriate by conditions of film formation.

Next, heat treatment is preferably performed at higher than or equal to 200° C. and lower than or equal to 600° C., typically higher than or equal to 300° C. and lower than or equal to 500° C. Here, heat treatment is performed in a furnace at 350° C. for 1 hour in a nitrogen atmosphere including oxygen. This heat treatment allows atoms of the IGZO semiconductor layer and the Al—Zn—O—N-based oxide semiconductor film to be rearranged. By this heat treatment (the heat treatment may be light annealing), strain which inhibits carrier movement is released. There is no particular limitation on timing of the heat treatment as long as it is performed after the formation of the first semiconductor film 403 and the second semiconductor film 412.

Next, in order to pattern the first semiconductor film 403, the second semiconductor film 412 is selectively etched, and the first semiconductor film 403 is selectively etched to form an IGZO semiconductor layer 405. The etching is performed with a dry etching method using a chlorine gas. The second semiconductor film 412 functions as buffer layers. In this stage, a surface of the gate insulating film is exposed in a region where the first semiconductor film 403 is removed. Here, a second photomask is used. The mask formed over the second semiconductor film 412 in the patterning is removed by ashing treatment in an oxygen atmosphere. The cross-sectional structure of the substrate at this stage corresponds to the cross-sectional view of the substrate illustrated in FIG. 4C (see FIG. 4C). In order to eliminate moisture from the manufacturing process of the thin film transistor as much as possible, cleaning using water is not necessarily performed after that.

Since the second semiconductor film 412 serving as the buffer layers has a higher carrier concentration than the IGZO semiconductor layer and is superior in conductivity, the contact resistance can be reduced when the buffer layers are provided as compared to the case of directly attaching a source electrode and a drain electrode to the IGZO semiconductor layer.

Next, a metal multilayer film serving as the source electrode and the drain electrode is formed. Here, an aluminum film is stacked over a titanium film and another titanium film is stacked over the aluminum film with a DC magnetron sputtering method. Both a titanium target and an aluminum target are set in a sputtering chamber, and the films are successively formed using shutters so as to be sequentially stacked; thus, successive stacking can be performed in one chamber.

Next, the metal multilayer film is selectively etched to form a source electrode 408 and a drain electrode 409. Here, a third photomask is used. The etching is performed with a dry etching method. In this case, the condition where the metal multilayer film and the second semiconductor film 412 can be etched and the etching rates thereof are sufficiently different from that of the IGZO semiconductor layer 405 is employed. Accordingly, the source electrode 408, the drain electrode 409, a source-side buffer layer 413, and a drain-side buffer layer 414 can be formed in the same etching step (see FIG. 4D).

Next, in order to prevent entry or diffusion of hydrogen, moisture, or the like from the outside, a third insulating film 410 is formed so as to cover the thin film transistor. The third insulating film 410 is preferably formed under the condition where hysteresis or charge buildup is not caused in the thin film transistor. The third insulating film 410 can be formed using a silicon oxide film, a silicon nitride film, a silicon oxynitride film, or a silicon nitride oxide film. For example, a silicon oxynitride film including nitrogen at greater than or equal to 3 atomic % and less than or equal to 30 atomic % may be formed with an RF sputtering method. By use of the silicon oxynitride film including nitrogen at greater than or equal to 3 atomic % and less than or equal to 30 atomic %, hydrogen, moisture, or the like can be prevented from entering or diffusing into the thin film transistor.

Before the third insulating film 410 is formed, surfaces of the IGZO semiconductor layer 405, the source electrode 408, and the drain electrode 409 may be etched by approximately 10 nm by reverse sputtering. By the reverse sputtering, hydrogen, moisture, hydrocarbon, or the like which is attached to the surfaces of the source electrode 408 and the drain electrode 409 can be removed.

In this embodiment, a channel formation region is a region of the IGZO semiconductor layer 405, which overlaps with the gate electrode 401 and is located between the source-side buffer layer 413 and the drain-side buffer layer 414. A distance L4 between the source-side buffer layer 413 and the drain-side buffer layer 414 corresponds to a channel length (see FIG. 4E).

As the layers provided over and under the channel formation region of the IGZO semiconductor layer 405, silicon oxynitride films each including nitrogen at greater than or equal to 3 atomic % and less than or equal to 30 atomic % are formed so that the channel formation region is interposed between the silicon oxynitride films, whereby hydrogen, moisture, or the like can be prevented from entering or diffusing into the channel formation region.

Embodiment 5

In this embodiment, a thin film transistor and a manufacturing process thereof will be described with reference to FIGS. 24A to 24E. Note that repetitive description of the same portions as Embodiment 1 or portions having functions similar to those in Embodiment 1, and steps for forming such portions will be omitted.

First, a gate electrode 701 is formed over a substrate 700. Here, a first photomask is used (see FIG. 24A).

Figure 24A:
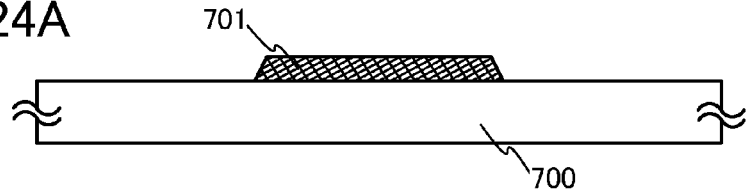
FIGS. 24A to 24E are cross-sectional views illustrating a manufacturing process of a thin film transistor which is one embodiment of the present invention.
Figure 24B:
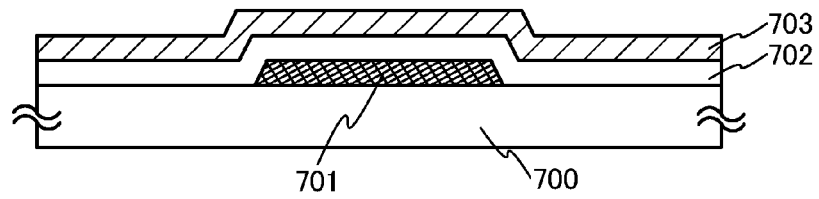
Figure 24C:
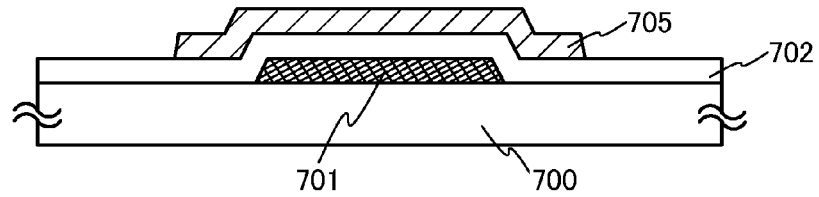
Figure 24D:
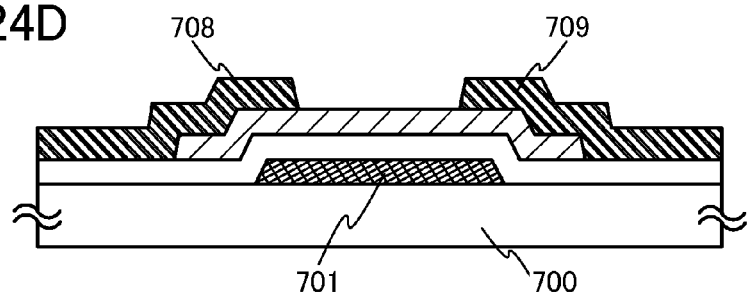
Figure 24E:
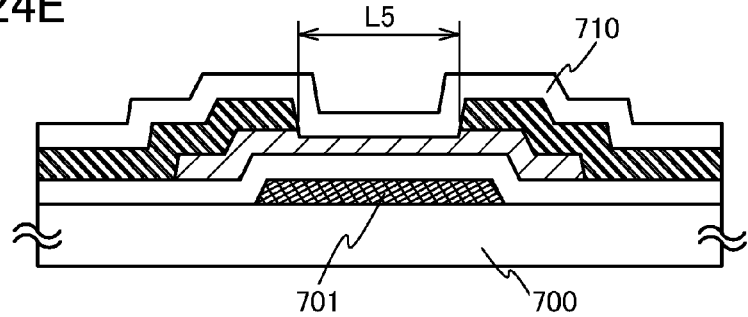

Next, a first insulating film 702 serving as a gate insulating film and a semiconductor film 703 are successively formed without being exposed to air (see FIG. 24B). Here, a silicon oxynitride film including nitrogen at greater than or equal to 3 atomic % and less than or equal to 30 atomic % is formed as the first insulating film 702 with an RF sputtering method, and the semiconductor film 703 is formed with a sputtering method using a target in which silicon oxide is added to an oxide including indium (In), gallium (Ga), and zinc (Zn). Note that the semiconductor film 703 is preferably formed under the condition that the substrate temperature is higher than or equal to room temperature (25° C.) and lower than 200° C.

Figure 25A:
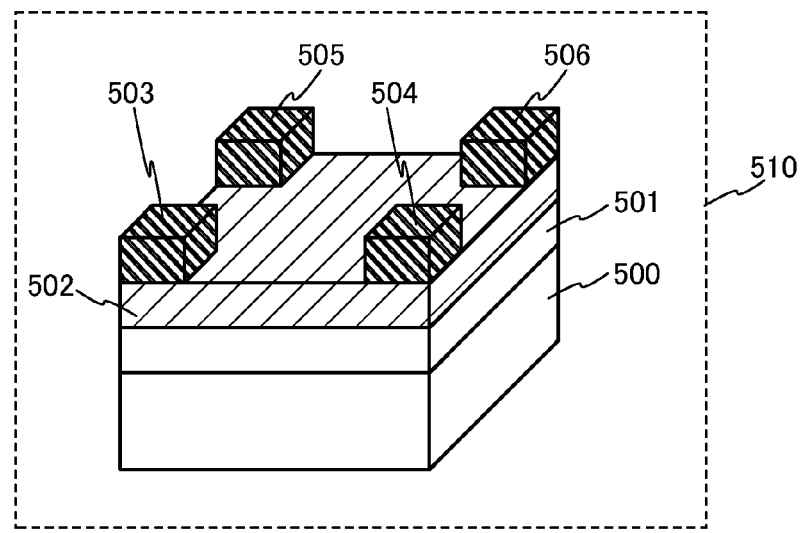
FIGS. 25A to 25C show results of Hall effect measurement of an oxide semiconductor.

On the occasion of the formation of the semiconductor film 703, a property of an oxide semiconductor film which is used as the semiconductor film 703 was evaluated separately. FIG. 25A illustrates a three-dimensional view of a property-evaluation sample 510 for evaluating a property of the oxide semiconductor film. The property-evaluation sample 510 was fabricated and subjected to Hall effect measurement at room temperature. Carrier concentration and Hall mobility of the oxide semiconductor film were evaluated. The property-evaluation sample 510 was fabricated in the following manner: an insulating film 501 including silicon oxynitride was formed over a substrate 500, an oxide semiconductor film 502 serving as an evaluation object was formed over the insulating film 501, and electrodes 503 to 506 were formed over the oxide semiconductor film 502. Oxide semiconductor films serving as evaluation objects were formed using three kinds of targets in which 2 weight %, 5 weight %, and 10 weight % of silicon oxide was added to respective target materials. The property-evaluation sample 510 was fabricated for each of the oxide semiconductor films, and Hall effect measurement was performed thereon at room temperature. In addition, a sample of an oxide semiconductor film formed using a target to which silicon oxide was not added was prepared as a reference, and evaluation was performed thereon in a similar manner.

Figure 25B:
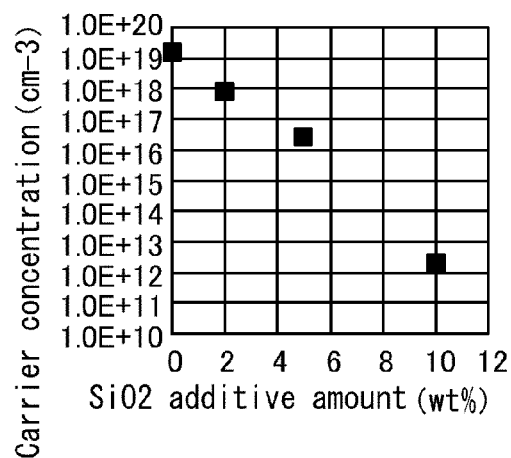

FIG. 25B shows the carrier concentrations of the oxide semiconductor films, which were obtained by the Hall effect measurement. In FIG. 25B, the horizontal axis represents the additive amount of silicon oxide, and the vertical axis represents the carrier concentration. As the additive amount of silicon oxide is increased from 0 weight % to 2 weight % to 5 weight % to 10 weight %, the carrier concentration is decreased from $1.6 \times 10^{19}/cm^3$ to $8.0 \times 10^{17}/cm^3$ to $2.7 \times 10^{16}/cm^3$ to $2.0 \times 10^{12}/cm^3$.

Figure 25C:
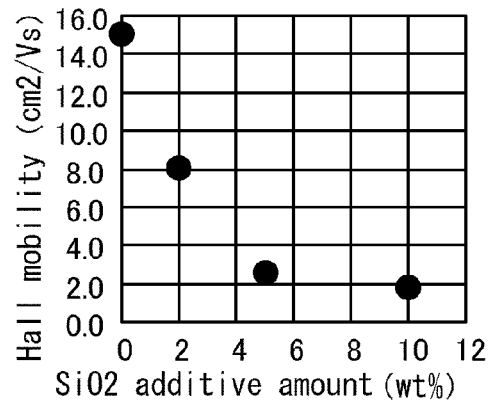

FIG. 25C shows the Hall mobility of the oxide semiconductor films, which was obtained by the Hall effect measurement. In FIG. 25C, the horizontal axis represents the additive amount of silicon oxide, and the vertical axis represents the Hall mobility. As the additive amount of silicon oxide is increased from 0 weight % to 2 weight % to 5 weight % to 10 weight %, the Hall mobility is decreased from 15.1 $cm^2/Vs$ to 8.1 $cm^2/Vs$ to 2.6 $cm^2/Vs$ to 1.8 $cm^2/Vs$.

The results in FIGS. 25B and 25C show that the carrier concentration and the Hall mobility tend to be decreased as the additive amount of silicon oxide is increased while there is no large difference in the Hall mobility between the case of adding 5 weight % of silicon oxide and the case of adding 10 weight % of silicon oxide. Therefore, when silicon oxide is added to an IGZO semiconductor layer, silicon oxide may be added to a target at greater than 0 weight % and less than or equal to 10 weight %; however, the range is preferably greater than 0 weight % and less than or equal to 6 weight %. That is, the carrier concentration may be higher than or equal to $2.0 \times 10^{12}/cm^3$ and lower than $1.6 \times 10^{19}/cm^3$; however, the range is preferably higher than or equal to $2.0 \times 10^{16}/cm^3$ and lower than $1.6 \times 10^{19}/cm^3$. In addition, the Hall mobility may be higher than or equal to 1.8 $cm^2/Vs$ and lower than 15.1 $cm^2/Vs$; however, the range is preferably higher than or equal to 2.4 $cm^2/Vs$ and lower than 15.1 $cm^2/vs$.

After the semiconductor film 703 is formed, heat treatment is preferably performed at higher than or equal to 200° C. and lower than or equal to 600° C., typically higher than or equal to 300° C. and lower than or equal to 500° C. Here, heat treatment is performed in a furnace at 350° C. for 1 hour in a nitrogen atmosphere including oxygen. This heat treatment allows atoms of the IGZO semiconductor layer to be rearranged. By this heat treatment (the heat treatment may be light annealing), strain which inhibits carrier movement is released. There is no particular limitation on timing of the heat treatment as long as it is performed after the formation of the semiconductor film 703.

Next, in order to pattern the semiconductor film 703, the semiconductor film 703 is selectively etched to form an IGZO semiconductor layer 705. The etching is performed with a dry etching method using a chlorine gas. In this stage, a surface of the gate insulating film is exposed in a region where the semiconductor film 703 is removed. Here, a second photomask is used. The mask formed over the semiconductor film 703 in the patterning is removed by ashing treatment in an oxygen atmosphere. The cross-sectional structure of the substrate at this stage corresponds to the cross-sectional view of the substrate illustrated in FIG. 24C (see FIG. 24C). In order to eliminate moisture from the manufacturing process of the thin film transistor as much as possible, cleaning using water is not necessarily performed after that.

Next, a metal multilayer film serving as a source electrode and a drain electrode is formed. Here, an aluminum film is stacked over a titanium film and another titanium film is stacked over the aluminum film with a DC magnetron sputtering method. Both a titanium target and an aluminum target are set in a sputtering chamber, and the films are successively formed using shutters so as to be sequentially stacked; thus, successive stacking can be performed in one chamber.

Next, the metal multilayer film is selectively etched to form a source electrode 708 and a drain electrode 709. Here, a third photomask is used. The etching is performed with a dry etching method. In this case, the condition where the metal multilayer film can be etched and the etching rate thereof is sufficiently different from that of the IGZO semiconductor layer 705 is employed. Accordingly, the source electrode 708 and the drain electrode 709 can be formed in the same etching step (see FIG. 24D).

Next, in order to prevent entry or diffusion of hydrogen, moisture, or the like from the outside, a third insulating film 710 is formed so as to cover the thin film transistor. The third insulating film 710 is preferably formed under the condition where hysteresis or charge buildup is not caused in the thin film transistor. The third insulating film 710 can be formed using a silicon oxide film, a silicon nitride film, a silicon oxynitride film, or a silicon nitride oxide film. For example, a silicon oxynitride film including nitrogen at greater than or equal to 3 atomic % and less than or equal to 30 atomic % may be formed with an RF sputtering method. By use of the silicon oxynitride film including nitrogen at greater than or equal to 3 atomic % and less than or equal to 30 atomic %, hydrogen, moisture, or the like can be prevented from entering or diffusing into the thin film transistor.

Before the third insulating film 710 is formed, surfaces of the IGZO semiconductor layer 705, the source electrode 708, and the drain electrode 709 may be etched by approximately 10 nm by reverse sputtering. By the reverse sputtering, hydrogen, moisture, hydrocarbon, or the like which is attached to the surfaces of the source electrode 708 and the drain electrode 709 can be removed.

In this embodiment, a channel formation region is a region of the IGZO semiconductor layer 705, which overlaps with the gate electrode 701 and is located between the source electrode 708 and the drain electrode 709. A distance L5 between the source electrode 708 and the drain electrode 709 corresponds to a channel length (see FIG. 24E).

As the layers provided over and under the channel formation region of the IGZO semiconductor layer 705, silicon oxynitride films each including nitrogen at greater than or equal to 3 atomic % and less than or equal to 30 atomic % are formed so that the channel formation region is interposed between the silicon oxynitride films, whereby hydrogen, moisture, or the like can be prevented from entering or diffusing into the channel formation region.

In this manner, the thin film transistor including the IGZO semiconductor layer can be manufactured.

FIGS. 26 and 25C indicate that addition of silicon oxide helps an oxide semiconductor layer to be amorphous and that effect of reducing variation in characteristics at the time of manufacturing a semiconductor device can be obtained. Moreover, a quantity of Ga, expensive element promoting the amorphous character of the IGZO semiconductor layer, can be reduced or cut, whereby productivity can be increased.

Embodiment 6

In this embodiment, an example of a semiconductor device, more precisely a display device in which at least part of a driver circuit and a thin film transistor provided in a pixel portion are formed over the same substrate, will be described.

The thin film transistor provided in the pixel portion is formed according to any of Embodiments 1 to 5. Further, the thin film transistors described in Embodiments 1 to 5 are n-channel TFTs, and thus part of a driver circuit that can include an n-channel TFT among driver circuits is formed over the same substrate as the thin film transistor of the pixel portion.

Figure 5A:
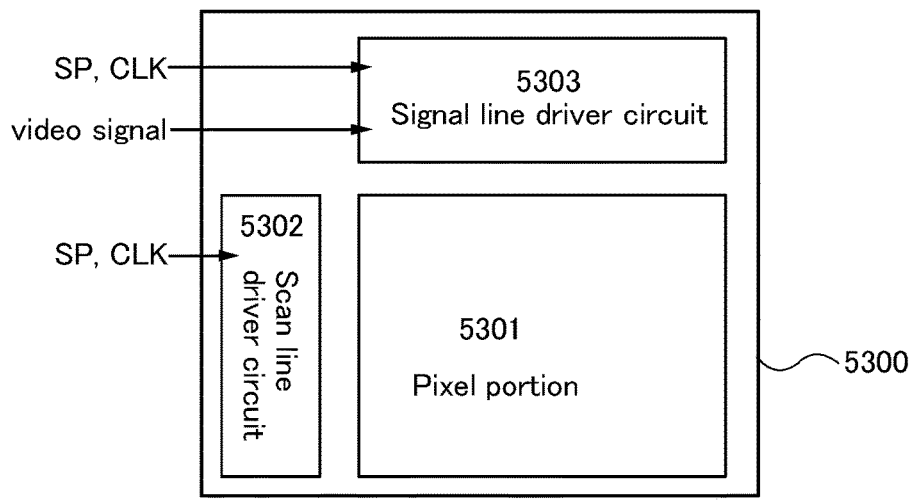
FIGS. 5A and 5B are each a block diagram of a semiconductor device.

FIG. 5A illustrates an example of a block diagram of an active matrix liquid crystal display device which is an embodiment of a semiconductor device. The display device illustrated in FIG. 5A includes, over a substrate 5300, a pixel portion 5301 including a plurality of pixels that are each provided with a display element; a scan line driver circuit 5302 that selects a pixel; and a signal line driver circuit 5303 that controls a video signal input to the selected pixel.

The pixel portion 5301 is connected to the signal line driver circuit 5303 by a plurality of signal lines S1 to Sm (not illustrated) that extend in a column direction from the signal line driver circuit 5303, and to the scan line driver circuit 5302 by a plurality of scan lines G1 to Gn (not illustrated) that extend in a row direction from the scan line driver circuit 5302. The pixel portion 5301 includes a plurality of pixels (not illustrated) arranged in matrix so as to correspond to the signal lines S1 to Sm and the scan lines G1 to Gn. Each pixel is connected to a signal line Sj (one of the signal lines S1 to Sm) and a scan line Gi (one of the scan lines G1 to Gn).

In addition, the thin film transistors described in Embodiments 1 to 5 are n-channel TFTs, and a signal line driver circuit including n-channel TFTs is described with reference to FIG. 6.

Figure 6:
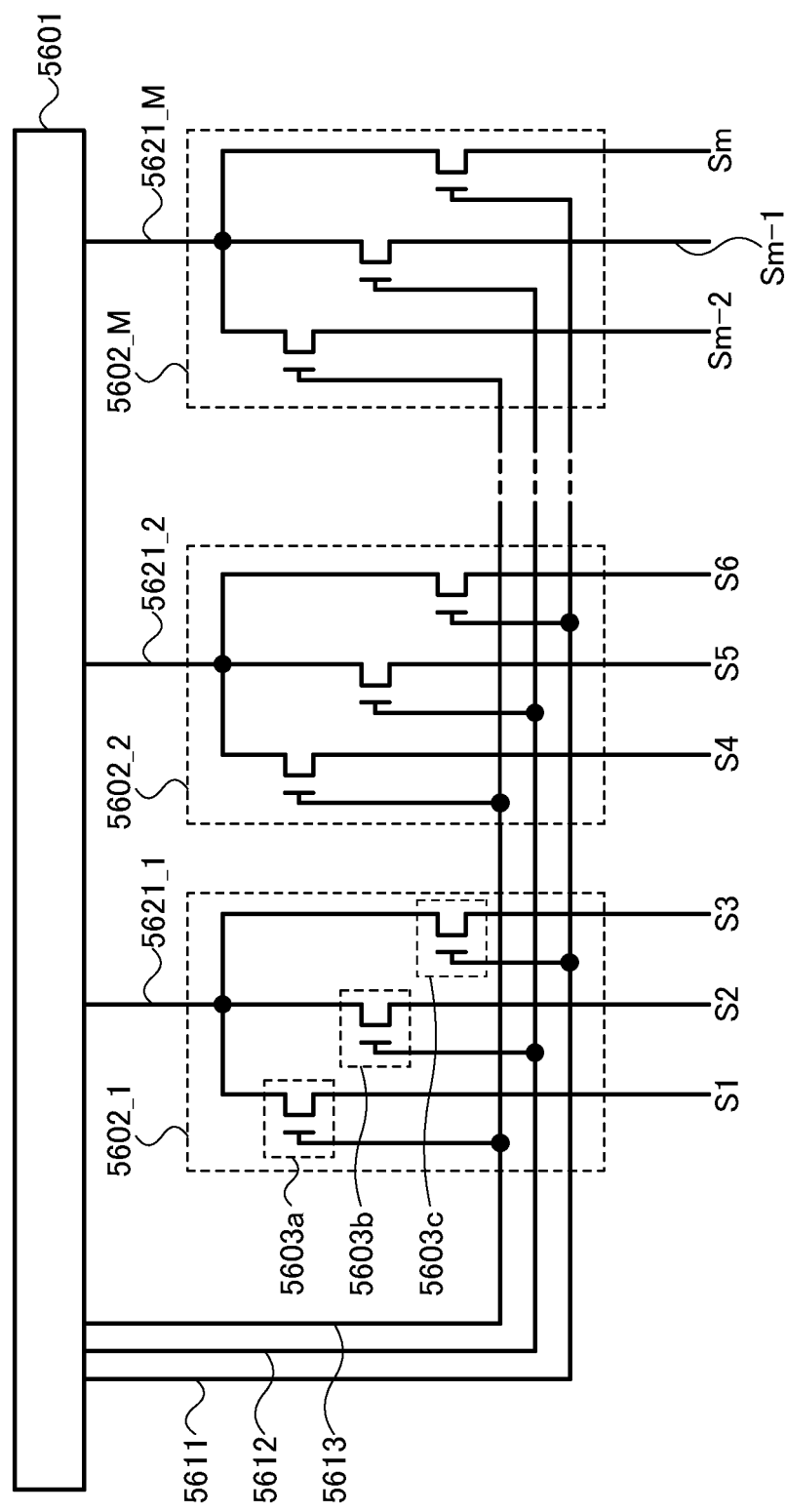
FIG. 6 illustrates a configuration of a signal line driver circuit.

The signal line driver circuit illustrated in FIG. 6 includes a driver IC 5601, switch groups 5602_1 to 5602_M, a first wiring 5611, a second wiring 5612, a third wiring 5613, and wirings 5621_1 to 5621_M. Each of the switch groups 5602_1 to 5602_M includes a first thin film transistor 5603*a*, a second thin film transistor 5603*b*, and a third thin film transistor 5603*c*.

The driver IC 5601 is connected to the first wiring 5611, the second wiring 5612, the third wiring 5613, and the wirings 5621_1 to 5621_M. Each of the switch groups 5602_1 to 5602_M is connected to the first wiring 5611, the second wiring 5612, and the third wiring 5613, and the wirings 5621_1 to 5621_M are connected to the switch groups 5602_1 to 5602_M, respectively. Each of the wirings 5621_1 to 5621_M is connected to three signal lines (a signal line Sm−2, a signal line Sm−1, and a signal line Sm (m=3M)) via the first thin film transistor 5603*a*, the second thin film transistor 5603*b*, and the third thin film transistor 5603*c*. For example, the wiring 5621_) of the J-th column (one of the wirings 5621_1 to 5621_M) is connected to a signal line Sj−2, a signal line Sj−1, and a signal line Sj (j=3J) via the first thin film transistor 5603*a*, the second thin film transistor 5603*b*, and the third thin film transistor 5603*c* which are included in the switch group 5602_J.

A signal is input to each of the first wiring 5611, the second wiring 5612, and the third wiring 5613.

Note that the driver IC 5601 is preferably formed using a single crystal semiconductor. The switch groups 5602_1 to 5602_M are preferably formed over the same substrate as the pixel portion and are thus preferably not formed on the same substrate as the driver IC. Therefore, the driver IC 5601 and the switch groups 5602_1 to 5602_M are preferably connected through an FPC or the like. Alternatively, the driver IC 5601 may be formed using a single crystal semiconductor layer which is provided with a method such as bonding over the same substrate as the pixel portion.

Figure 7:
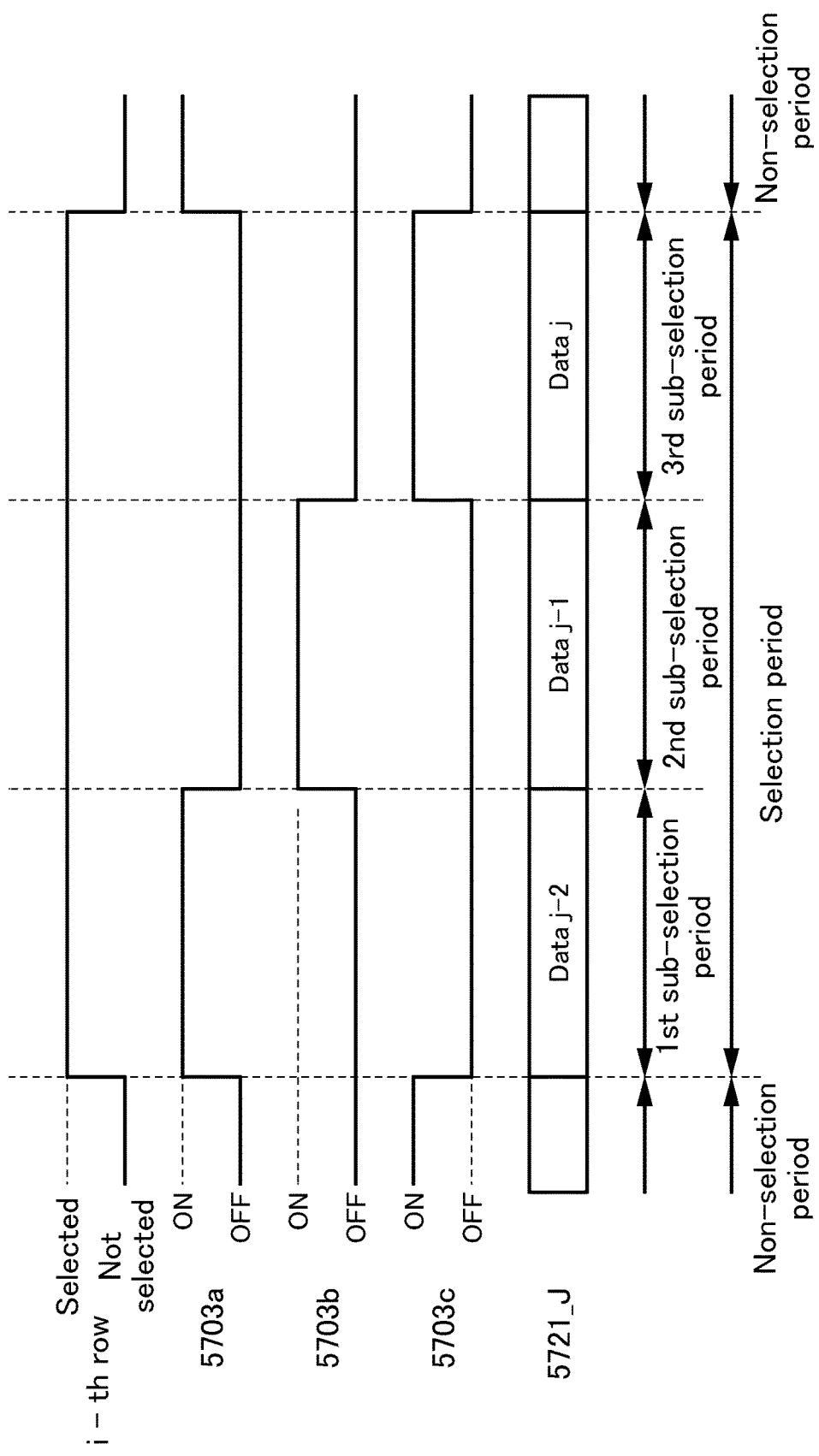
FIG. 7 is a timing chart illustrating operation of a signal line driver circuit.

Next, operation of the signal line driver circuit illustrated in FIG. 6 is described with reference to a timing chart in FIG. 7. The timing chart in FIG. 7 illustrates a case where the scan line Gi of the i-th row is selected. A selection period of the scan line Gi of the i-th row is divided into a first sub-selection period T1, a second sub-selection period T2, and a third sub-selection period T3. In addition, the signal line driver circuit in FIG. 6 is operated as in FIG. 7 even when a scan line of another row is selected.

Note that the timing chart in FIG. 7 shows a case where the wiring 5621_J of the J-th column is connected to the signal line Sj−2, the signal line Sj−1, and the signal line Sj via the first thin film transistor 5603*a*, the second thin film transistor 5603*b*, and the third thin film transistor 5603*c*.

The timing chart in FIG. 7 shows timing at which the scan line Gi of the i-th row is selected, timing 5703*a* of on/off of the first thin film transistor 5603*a*, timing 5703*b* of on/off of the second thin film transistor 5603*b*, timing 5703*c* of on/off of the third thin film transistor 5603*c*, and a signal 5721_J input to the wiring 5621_J of the J-th column.

In the first sub-selection period T1, the second sub-selection period T2, and the third sub-selection period T3, different video signals are input to the wirings 5621_1 to 5621_M. For example, a video signal input to the wiring 5621_J in the first sub-selection period T1 is input to the signal line Sj−2, a video signal input to the wiring 5621_J in the second sub-selection period T2 is input to the signal line Sj−1, and a video signal input to the wiring 5621_J in the third sub-selection period T3 is input to the signal line Sj. In addition, the video signals input to the wiring 5621_J in the first sub-selection period T1, the second sub-selection period T2, and the third sub-selection period T3 are denoted by Data_j−2, Data_j−1, and Data_j, respectively.

As illustrated in FIG. 7, in the first sub-selection period T1, the first thin film transistor 5603*a* is turned on, and the second thin film transistor 5603*b* and the third thin film transistor 5603*c* are turned off. At this time, Data_j−2 input to the wiring 5621_J is input to the signal line Sj−2 via the first thin film transistor 5603*a*. In the second sub-selection period T2, the second thin film transistor 5603*b* is turned on, and the first thin film transistor 5603*a* and the third thin film transistor 5603*c* are turned off. At this time, Data_j−1 input to the wiring 5621_J is input to the signal line Sj−1 via the second thin film transistor 5603*b*. In the third sub-selection period T3, the third thin film transistor 5603*c* is turned on, and the first thin film transistor 5603*a* and the second thin film transistor 5603*b* are turned off. At this time, Data_j input to the wiring 5621_J is input to the signal line Sj via the third thin film transistor 5603*c*.

As described above, in the signal line driver circuit in FIG. 6, by dividing one gate selection period into three, video signals can be input to three signal lines from one wiring 5621 in one gate selection period. Therefore, in the signal line driver circuit of FIG. 6, the number of connections between the substrate provided with the driver IC 5601 and the substrate provided with the pixel portion can be approximately ⅓ of the number of signal lines. The number of connections is reduced to approximately ⅓ of the number of the signal lines, so that reliability, yield, and the like of the signal line driver circuit in FIG. 6 can be improved.

Note that there is no limitation on the arrangement, the number, a driving method, and the like of the thin film transistors, as long as one gate selection period is divided into a plurality of sub-selection periods and video signals are input to a plurality of signal lines from one wiring in the respective sub-selection periods as illustrated in FIG. 6.

For example, when video signals are input to three or more signal lines from one wiring in each of three or more sub-selection periods, a thin film transistor and a wiring for controlling the thin film transistor may be added. Note that, when one gate selection period is divided into four or more sub-selection periods, one sub-selection period becomes short. Therefore, one gate selection period is preferably divided into two or three sub-selection periods.

Figure 8:
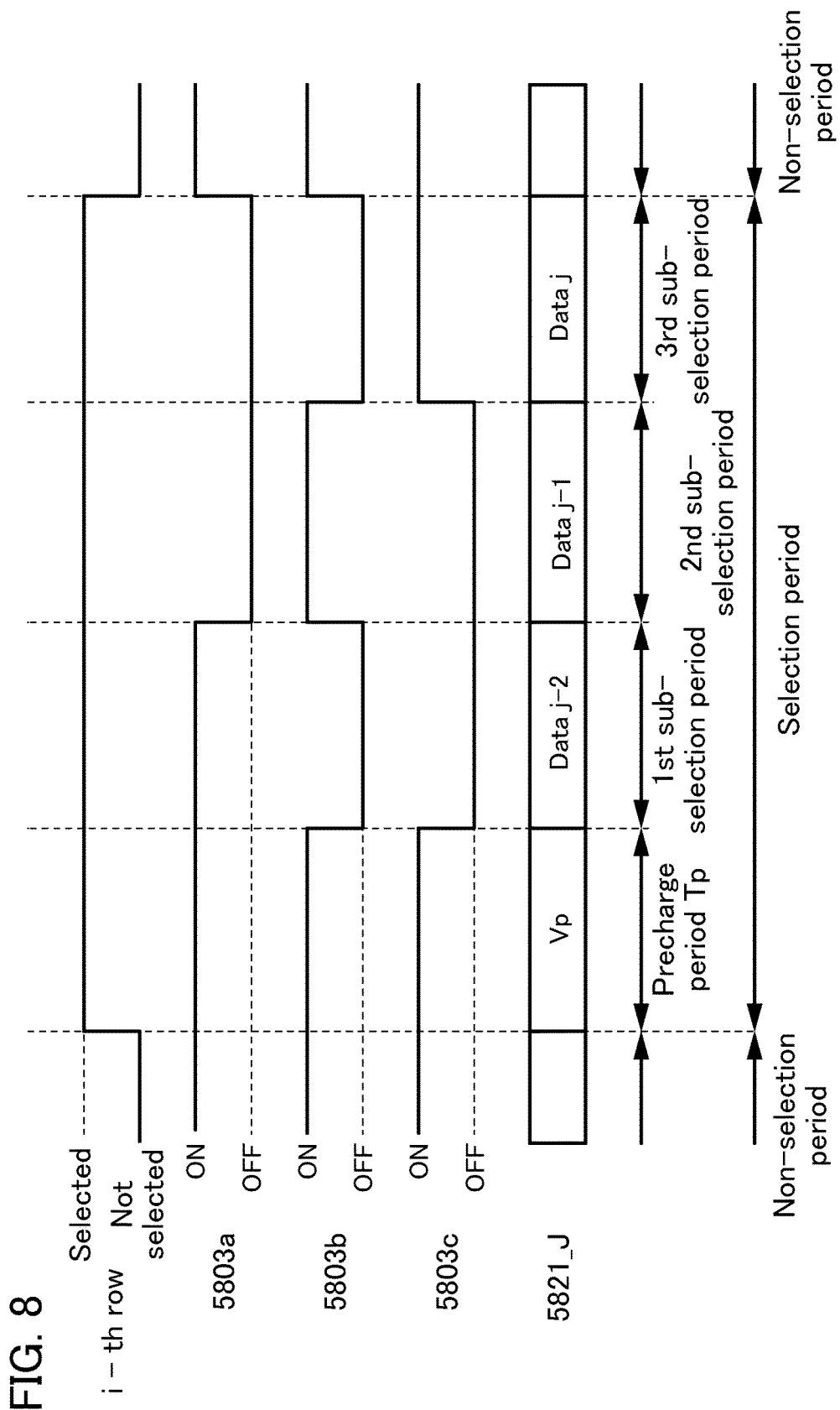
FIG. 8 is a timing chart illustrating operation of a signal line driver circuit.

As another example, one selection period may be divided into a precharge period Tp, the first sub-selection period T1, the second sub-selection period T2, and the third sub-selection period T3 as illustrated in a timing chart of FIG. 8. The timing chart in FIG. 8 illustrates timing at which the scan line Gi of the i-th row is selected, timing 5803*a* of on/off of the first thin film transistor 5603*a*, timing 5803*b* of on/off of the second thin film transistor 5603*b*, timing 5803*c* of on/off of the third thin film transistor 5603*c*, and a signal 5821_J input to the wiring 5621_J of the J-th column. As illustrated in FIG. 8, the first thin film transistor 5603*a*, the second thin film transistor 5603*b*, and the third thin film transistor 5603*c* are turned on in the precharge period Tp. At this time, precharge voltage Vp input to the wiring 5621_J is input to each of the signal line Sj−2, the signal line Sj−1, and the signal line Sj via the first thin film transistor 5603*a*, the second thin film transistor 5603*b*, and the third thin film transistor 5603*c*. In the first sub-selection period T1, the first thin film transistor 5603*a* is turned on, and the second thin film transistor 5603*b* and the third thin film transistor 5603*c* are turned off. At this time, Data_j−2 input to the wiring 5621_J is input to the signal line Sj−2 via the first thin film transistor 5603*a*. In the second sub-selection period T2, the second thin film transistor 5603*b* is turned on, and the first thin film transistor 5603*a* and the third thin film transistor 5603*c* are turned off. At this time, Data_j−1 input to the wiring 5621_J is input to the signal line Sj−1 via the second thin film transistor 5603*b*. In the third sub-selection period T3, the third thin film transistor 5603*c* is turned on, and the first thin film transistor 5603*a* and the second thin film transistor 5603*b* are turned off. At this time, Data_j input to the wiring 5621_J is input to the signal line Sj via the third thin film transistor 5603*c*.

As described above, in the signal line driver circuit of FIG. 6 to which the timing chart in FIG. 8 is applied, the video signal can be written to the pixel at high speed because the signal line can be precharged by provision of a precharge selection period before a sub-selection period. Note that portions in FIG. 8 which are similar to those in FIG. 7 are denoted by common reference numerals and detailed description of the same portions and portions having similar functions is omitted.

Further, a structure of a scan line driver circuit is described. The scan line driver circuit includes a shift register and a buffer. Additionally, the scan line driver circuit may include a level shifter in some cases. In the scan line driver circuit, when a clock signal (CLK) and a start pulse signal (SP) are input to the shift register, a selection signal is generated. The generated selection signal is buffered and amplified by the buffer, and the resulting signal is supplied to a corresponding scan line. Gate electrodes of transistors in pixels of one line are connected to the scan line. Further, since the transistors in the pixels of one line have to be turned on at the same time, a buffer which can feed a large amount of current is used.

An embodiment of a shift register which is used for part of a scan line driver circuit is described with reference to FIG. 9 and FIG. 10.

Figure 9:
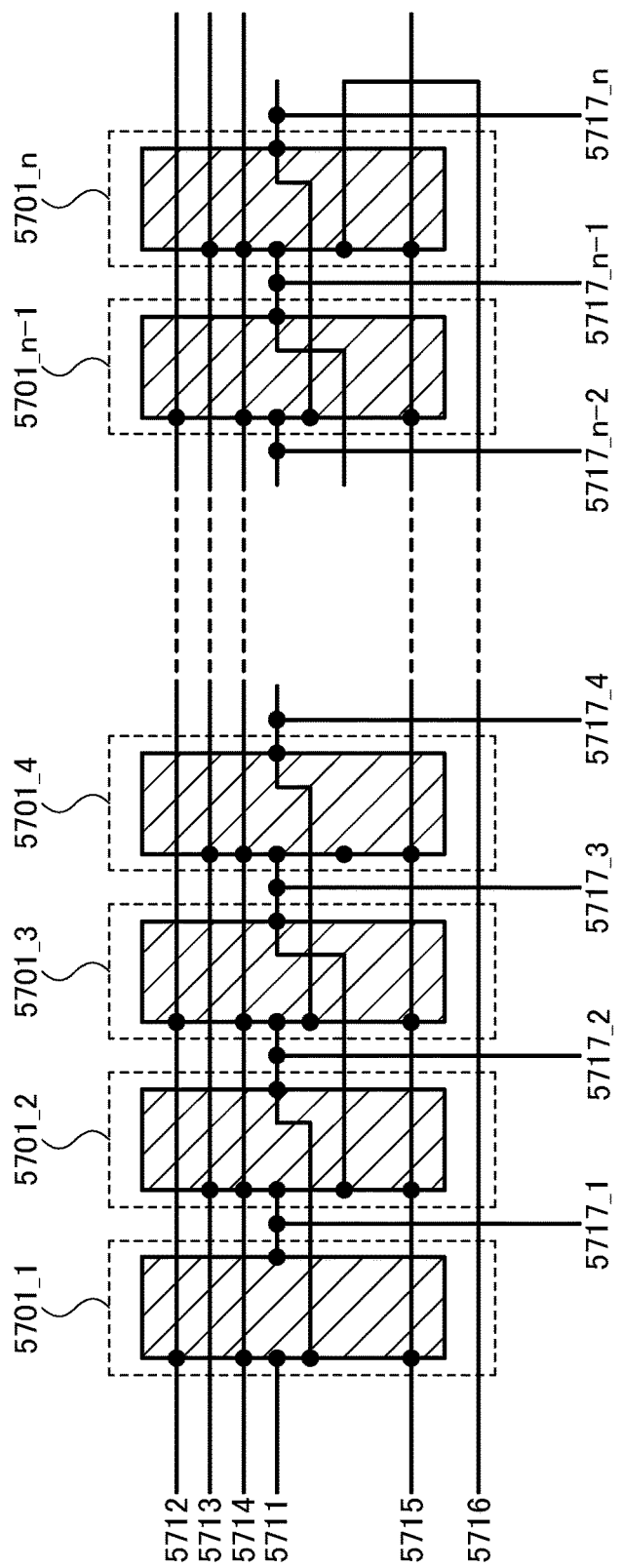
FIG. 9 illustrates a configuration of a shift register.

FIG. 9 illustrates a circuit configuration of the shift register. The shift register illustrated in FIG. 9 includes a plurality of flip-flops labeled flip-flops 5701_1 to 5701_*n*. The shift register is operated with input of a first clock signal, a second clock signal, a start pulse signal, and a reset signal.

The connection relation of the shift register illustrated in FIG. 9 is described. The flip-flop 5701_1 of a first stage is connected to a first wiring 5711, a second wiring 5712, a fourth wiring 5714, a fifth wiring 5715, a seventh wiring 5717_1, and a seventh wiring 5717_2. The flip-flop 5701_2 of a second stage is connected to a third wiring 5713, the fourth wiring 5714, the fifth wiring 5715, the seventh wiring 5717_1, the seventh wiring 57172, and a seventh wiring 5717_3.

In a similar manner, the flip-flop 5701_*i* (one of the flip-flops 5701_1 to 5701_*n*) of an i-th stage is connected to one of the second wiring 5712 and the third wiring 5713, the fourth wiring 5714, the fifth wiring 5715, a seventh wiring 5717_*i*−1, a seventh wiring 5717_*i*, and a seventh wiring 5717_*i*+1. Here, when the "i" is an odd number, the flip-flop 5701_*i* of the i-th stage is connected to the second wiring 5712; when the "i" is an even number, the flip-flop 5701_*i* of the i-th stage is connected to the third wiring 5713.

The flip-flop 5701_*n* of an n-th stage is connected to one of the second wiring 5712 and the third wiring 5713, the fourth wiring 5714, the fifth wiring 5715, a seventh wiring 5717_*n*−1, a seventh wiring 5717_*n*, and a sixth wiring 5716.

Note that the first wiring 5711, the second wiring 5712, the third wiring 5713, and the sixth wiring 5716 may be referred to as a first signal line, a second signal line, a third signal line, and a fourth signal line, respectively. The fourth wiring 5714 and the fifth wiring 5715 may be referred to as a first power supply line and a second power supply line, respectively.

Figure 10:
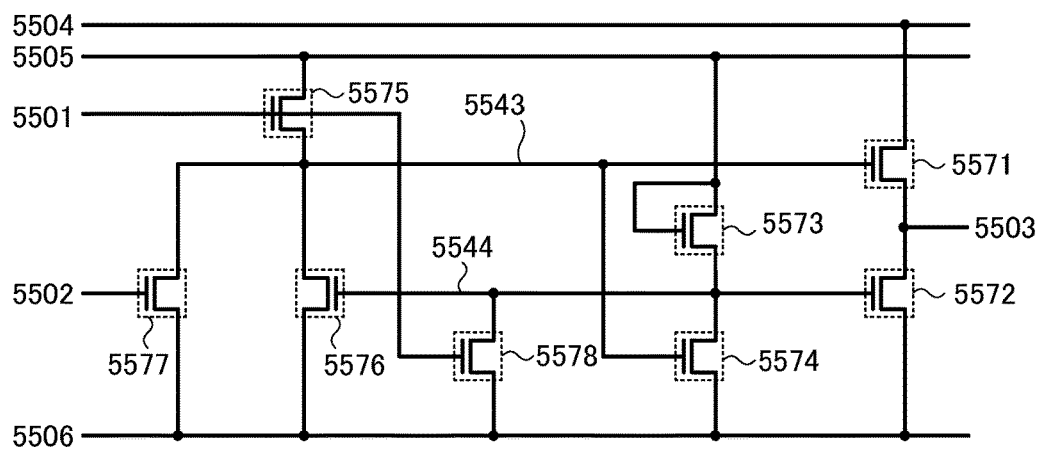
FIG. 10 illustrates a configuration of connections of a flip-flop.

Next, FIG. 10 illustrates details of the flip-flop illustrated in FIG. 9. A flip-flop illustrated in FIG. 10 includes a first thin film transistor 5571, a second thin film transistor 5572, a third thin film transistor 5573, a fourth thin film transistor 5574, a fifth thin film transistor 5575, a sixth thin film transistor 5576, a seventh thin film transistor 5577, and an eighth thin film transistor 5578. Each of the first thin film transistor 5571, the second thin film transistor 5572, the third thin film transistor 5573, the fourth thin film transistor 5574, the fifth thin film transistor 5575, the sixth thin film transistor 5576, the seventh thin film transistor 5577, and the eighth thin film transistor 5578 is an n-channel transistor and is turned on when the gate-source voltage ($V_{gs}$) exceeds the threshold voltage ($V_{th}$).

In addition, the flip-flop illustrated in FIG. 10 includes a first wiring 5501, a second wiring 5502, a third wiring 5503, a fourth wiring 5504, a fifth wiring 5505, and a sixth wiring 5506.

Note that all the thin film transistors here are enhancement-type n-channel transistors; however, the present invention is not limited thereto. For example, the driver circuit can be operated using depletion-type n-channel transistors.

Next, connections of the flip-flop illustrated in FIG. 10 are described below.

A first electrode (one of a source electrode and a drain electrode) of the first thin film transistor 5571 is connected to the fourth wiring 5504. A second electrode (the other of the source electrode and the drain electrode) of the first thin film transistor 5571 is connected to the third wiring 5503.

A first electrode of the second thin film transistor 5572 is connected to the sixth wiring 5506. A second electrode of the second thin film transistor 5572 is connected to the third wiring 5503.

A first electrode of the third thin film transistor 5573 is connected to the fifth wiring 5505, a second electrode of the third thin film transistor 5573 is connected to a gate electrode of the second thin film transistor 5572, and a gate electrode of the third thin film transistor 5573 is connected to the fifth wiring 5505.

A first electrode of the fourth thin film transistor 5574 is connected to the sixth wiring 5506, a second electrode of the fourth thin film transistor 5574 is connected to the gate electrode of the second thin film transistor 5572, and a gate electrode of the fourth thin film transistor 5574 is connected to a gate electrode of the first thin film transistor 5571.

A first electrode of the fifth thin film transistor 5575 is connected to the fifth wiring 5505, a second electrode of the fifth thin film transistor 5575 is connected to the gate electrode of the first thin film transistor 5571, and a gate electrode of the fifth thin film transistor 5575 is connected to the first wiring 5501.

A first electrode of the sixth thin film transistor 5576 is connected to the sixth wiring 5506, a second electrode of the sixth thin film transistor 5576 is connected to the gate electrode of the first thin film transistor 5571, and a gate electrode of the sixth thin film transistor 5576 is connected to the gate electrode of the second thin film transistor 5572.

A first electrode of the seventh thin film transistor 5577 is connected to the sixth wiring 5506, a second electrode of the seventh thin film transistor 5577 is connected to the gate electrode of the first thin film transistor 5571, and a gate electrode of the seventh thin film transistor 5577 is connected to the second wiring 5502.

A first electrode of the eighth thin film transistor 5578 is connected to the sixth wiring 5506, a second electrode of the eighth thin film transistor 5578 is connected to the gate electrode of the second thin film transistor 5572, and a gate electrode of the eighth thin film transistor 5578 is connected to the first wiring 5501.

Note that the points at which the gate electrode of the first thin film transistor 5571, the gate electrode of the fourth thin film transistor 5574, the second electrode of the fifth thin film transistor 5575, the second electrode of the sixth thin film transistor 5576, and the second electrode of the seventh thin film transistor 5577 are connected are each referred to as a node 5543. The points at which the gate electrode of the second thin film transistor 5572, the second electrode of the third thin film transistor 5573, the second electrode of the fourth thin film transistor 5574, the gate electrode of the sixth thin film transistor 5576, and the second electrode of the eighth thin film transistor 5578 are connected are each referred to as a node 5544.

Note that the first wiring 5501, the second wiring 5502, the third wiring 5503, and the fourth wiring 5504 may be referred to as a first signal line, a second signal line, a third signal line, and a fourth signal line, respectively. The fifth wiring 5505 and the sixth wiring 5506 may be referred to as a first power supply line and a second power supply line, respectively.

In the flip-flop 5701_i of the i-th stage, the first wiring 5501 in FIG. 10 is connected to the seventh wiring 5717_i−1 in FIG. 9. The second wiring 5502 in FIG. 10 is connected to the seventh wiring 5717_i+1 in FIG. 9. The third wiring 5503 in FIG. 10 is connected to the seventh wiring 5717_i. The sixth wiring 5506 in FIG. 10 is connected to the fifth wiring 5715.

When the "i" is an odd number, the fourth wiring 5504 in FIG. 10 is connected to the second wiring 5712 in FIG. 9; when the "i" is an even number, the fourth wiring 5504 in FIG. 10 is connected to the third wiring 5713 in FIG. 9. In addition, the fifth wiring 5505 in FIG. 10 is connected to the fourth wiring 5714 in FIG. 9.

Note that, in the flip-flop 5701_1 of the first stage, the first wiring 5501 in FIG. 10 is connected to the first wiring 5711 in FIG. 9. In addition, in the flip-flop 5701_n of the n-th stage, the second wiring 5502 in FIG. 10 is connected to the sixth wiring 5716 in FIG. 9.

In addition, the signal line driver circuit and the scan line driver circuit can be formed using only the n-channel TFTs described in any of Embodiments 1 to 5. The n-channel TFT described in any of Embodiments 1 to 5 has high mobility, and thus a driving frequency of a driver circuit can be increased; therefore, the n-channel TFT described in any of Embodiments 1 to 5 has high frequency characteristics (referred to as f characteristics). For example, since a scan line driver circuit using the n-channel TFT described in any of Embodiments 1 to 5 can be operated at high speed, a frame frequency can be increased; thus, insertion of black images can be realized.

In addition, when the channel width of the transistor in the scan line driver circuit is increased or a plurality of scan line driver circuits are provided, a higher frame frequency can be realized. When a plurality of scan line driver circuits are provided, a scan line driver circuit for driving scan lines of even-numbered rows is provided, for example, on one side and a scan line driver circuit for driving scan lines of odd-numbered rows is provided on the opposite side; thus, an increase in frame frequency can be realized. Furthermore, the use of the plurality of scan line driver circuits for output of signals to the same scan line is advantageous in increasing the size of a display device.

Figure 5B:
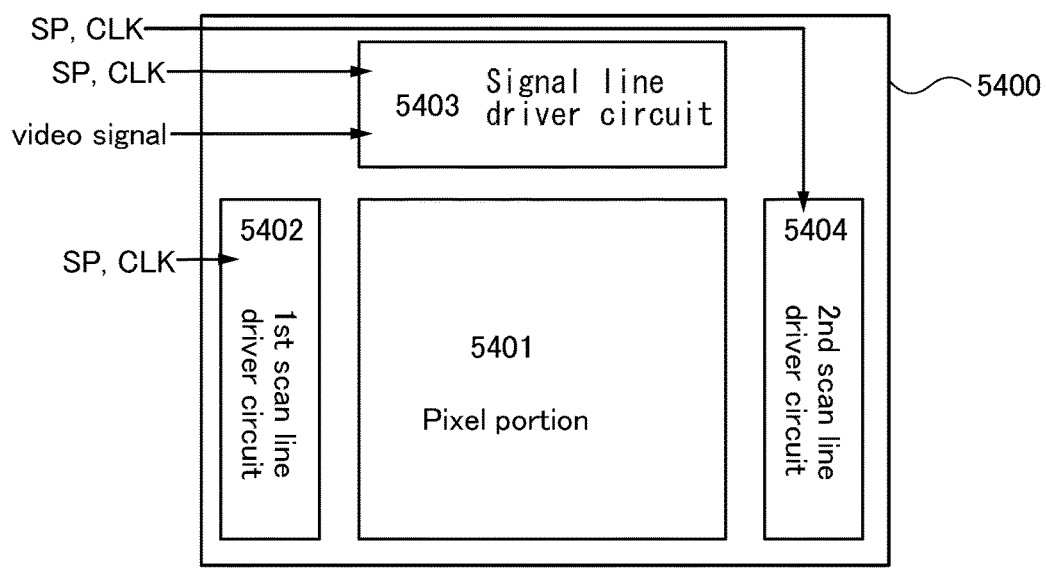

Further, when an active matrix light-emitting display device which is an embodiment of a semiconductor device is manufactured, a plurality of thin film transistors are arranged in at least one pixel, and thus a plurality of scan line driver circuits are preferably arranged. FIG. 5B is a block diagram illustrating an example of an active matrix light-emitting display device.

The light-emitting display device illustrated in FIG. 5B includes, over a substrate 5400, a pixel portion 5401 having a plurality of pixels each provided with a display element, a first scan line driver circuit 5402 and a second scan line driver circuit 5404 that select a pixel, and a signal line driver circuit 5403 that controls input of a video signal to the selected pixel.

When the video signal input to a pixel of the light-emitting display device illustrated in FIG. 5B is a digital signal, a pixel emits or does not emit light by switching on/off of a transistor. Thus, grayscale can be displayed using an area ratio grayscale method or a time ratio grayscale method. An area ratio grayscale method refers to a driving method by which one pixel is divided into a plurality of subpixels and the subpixels are driven independently based on video signals so that grayscale is displayed. A time ratio grayscale method refers to a driving method by which a period during which a pixel emits light is controlled so that grayscale is displayed.

Since the response speed of light-emitting elements is higher than that of liquid crystal elements or the like, the light-emitting elements are more suitable for a time ratio grayscale method than liquid-crystal display elements. Specifically, in the case of displaying with a time gray scale method, one frame period is divided into a plurality of subframe periods. Then, in accordance with video signals, the light-emitting element in the pixel is set in a light-emitting state or in a non-light-emitting state during each subframe period. By dividing one frame period into a plurality of subframe periods, the total length of time, in which pixels actually emit light in one frame period, can be controlled with video signals so that gray scales are displayed.

In the example of the light-emitting display device illustrated in FIG. 5B, in the case where two switching TFTs are arranged in one pixel, the first scan line driver circuit 5402 generates a signal which is input to a first scan line serving as a gate wiring of one of the switching TFTs, and the second scan line driver circuit 5404 generates a signal which is input to a second scan line serving as a gate wiring of the other of the switching TFTs; however, one scan line driver circuit may generate both the signal which is input to the first scan line and the signal which is input to the second scan line. In addition, for example, there is a possibility that a plurality of scan lines used for controlling the operation of the switching elements be provided in each pixel depending on the number of switching TFTs included in one pixel. In that case, one scan line driver circuit may generate all signals that are input to the plurality of scan lines, or a plurality of scan line driver circuits may generate signals that are input to the plurality of scan lines.

In addition, also in the light-emitting display device, part of the driver circuit that can include n-channel TFTs among driver circuits can be formed over the same substrate as the thin film transistors of the pixel portion. Alternatively, the signal line driver circuit and the scan line driver circuit can be formed using only the n-channel TFTs described in any of Embodiments 1 to 5.

Moreover, the above-described driver circuit can be used for electronic paper that drives electronic ink using an element electrically connected to a switching element, without being limited to applications to a liquid crystal display device or a light-emitting display device. The electronic paper is also referred to as an electrophoretic display device (electrophoretic display) and has advantages in that it has a level of readability comparable to that of plain paper, it has lower power consumption than other display devices, and it can be made thin and lightweight.

Embodiment 7

The thin film transistor described in any of Embodiments 1 to 5 is manufactured, and a semiconductor device having a display function (also referred to as a display device) can be manufactured using the thin film transistor in a pixel portion and further in a driver circuit. Further, part or whole of a driver circuit can be formed over the same substrate as a pixel portion, using the thin film transistor described in any of Embodiments 1 to 5, whereby a system-on-panel can be obtained.

The display device includes a display element. As the display element, a liquid crystal element (also referred to as a liquid crystal display element) or a light-emitting element (also referred to as a light-emitting display element) can be used. Light-emitting elements include, in its category, an element whose luminance is controlled by current or voltage, and specifically include an inorganic electroluminescent (EL) element, an organic EL element, and the like. Further, a display medium whose contrast is changed by an electric effect, such as an electronic ink, can be used.

In addition, the display device includes a panel in which the display element is sealed, and a module in which an IC or the like including a controller is mounted on the panel. An embodiment of the present invention relates to one embodiment of an element substrate before the display element is completed in a manufacturing process of the display device, and the element substrate is provided with a means for supplying current to the display element in each of a plurality of pixels. Specifically, the element substrate may be in a state provided with only a pixel electrode of the display element, a state after a conductive film serving as a pixel electrode is formed and before the conductive film is etched to form the pixel electrode, or any of other states.

Note that a display device in this specification means an image display device, a display device, or a light source (including a lighting device). Further, the display device includes any of the following modules in its category: a module to which a connector such as a flexible printed circuit (FPC), tape automated bonding (TAB) tape, or a tape carrier package (TCP) is attached; a module having TAB tape or a TCP which is provided with a printed wiring board at the end thereof; and a module having an integrated circuit (IC) which is directly mounted on a display element by a chip on glass (COG) method.

In this embodiment, the appearance and a cross section of a liquid crystal display panel which is one embodiment of a semiconductor device will be described with reference to FIGS. 11A1, 11A2, and 11B. FIGS. 11A1 and 11A2 are top views of a panel in which highly reliable thin film transistors 4010 and 4011 each including an oxide semiconductor layer, which are described in any of Embodiments 1 to 5, and a liquid crystal element 4013 formed over a first substrate 4001 are sealed with a sealant 4005 between the first substrate 4001 and a second substrate 4006. FIG. 11B is a cross-sectional view taken along line M-N of FIGS. 11A1 and 11A2.

The sealant 4005 is provided so as to surround a pixel portion 4002 and a scan line driver circuit 4004 which are provided over the first substrate 4001. The second substrate 4006 is provided over the pixel portion 4002 and the scan line driver circuit 4004. Therefore, the pixel portion 4002 and the scan line driver circuit 4004 are sealed together with a liquid crystal layer 4008, by the first substrate 4001, the sealant 4005, and the second substrate 4006. A signal line driver circuit 4003 that is formed using a single crystal semiconductor film or a polycrystalline semiconductor film over a substrate separately prepared is mounted in a region that is different from the region surrounded by the sealant 4005 over the first substrate 4001.

Note that the connection method of a driver circuit which is separately formed is not particularly limited, and a COG method, a wire bonding method, a TAB method, or the like can be used. FIG. 11A1 illustrates an example of mounting the signal line driver circuit 4003 with a COG method, and FIG. 11A2 illustrates an example of mounting the signal line driver circuit 4003 with a TAB method.

The pixel portion 4002 and the scan line driver circuit 4004 provided over the first substrate 4001 include a plurality of thin film transistors. FIG. 11B illustrates the thin film transistor 4010 included in the pixel portion 4002 and the thin film transistor 4011 included in the scan line driver circuit 4004. Over the thin film transistors 4010 and 4011, insulating layers 4020 and 4021 are provided.

The highly reliable thin film transistor including an oxide semiconductor layer, which is described in any of Embodiments 1 to 5, can be applied to each of the thin film transistors 4010 and 4011. In this embodiment, the thin film transistors 4010 and 4011 are n-channel thin film transistors.

A pixel electrode layer 4030 of the liquid crystal element 4013 is electrically connected to the thin film transistor 4010. A counter electrode layer 4031 of the liquid crystal element 4013 is formed on the second substrate 4006. A portion where the pixel electrode layer 4030, the counter electrode layer 4031, and the liquid crystal layer 4008 overlap one another corresponds to the liquid crystal element 4013. Note that the pixel electrode layer 4030 and the counter electrode layer 4031 are provided with an insulating layer 4032 and an insulating layer 4033, respectively, which each function as an alignment film. Further, the liquid crystal layer 4008 is interposed between the pixel electrode layer 4030 and the counter electrode layer 4031 with the insulating layers 4032 and 4033 each interposed between the liquid crystal layer 4008 and their respective pixel electrode layer.

Note that the first substrate 4001 and the second substrate 4006 can be formed using glass, metal (typically, stainless steel), ceramic, or plastic. As a plastic substrate, a fiberglass-reinforced plastics (FRP) plate, a polyvinyl fluoride (PVF) film, a polyester film, or an acrylic resin film can be used. In addition, a sheet with a structure in which an aluminum foil is sandwiched between PVF films or polyester films can be used.

Reference numeral 4035 denotes a columnar spacer obtained by selectively etching an insulating film and is provided to control the distance (a cell gap) between the pixel electrode layer 4030 and the counter electrode layer 4031. Note that a spherical spacer may also be used. The counter electrode layer 4031 is electrically connected to a common potential line provided over the same substrate as the thin film transistor 4010. With the use of the common connection portion, the counter electrode layer 4031 can be electrically connected to the common potential line through conductive particles provided between the pair of substrates. Note that the conductive particles are included in the sealant 4005.

Alternatively, a liquid crystal exhibiting a blue phase for which an alignment film is unnecessary may be used. A blue phase is one of liquid crystal phases, which appears just before a cholesteric phase changes into an isotropic phase while temperature of a cholesteric liquid crystal is increased. Since the blue phase appears only in a narrow range of temperature, the liquid crystal layer 4008 is formed using a liquid crystal composition including a chiral agent at 5 weight % or more so that the temperature range is widen. The liquid crystal composition including a liquid crystal exhibiting a blue phase and a chiral agent has a short response time of 10 μs to 100 μs, has optical isotropy, which makes the alignment process unneeded, and has small viewing angle dependence.

Although an example of a transmissive liquid crystal display device is described in this embodiment, the present invention can also be applied to a reflective liquid crystal display device and a transflective liquid crystal display device.

As an example of the present embodiment, a liquid crystal display device in which a polarizing plate is provided on the outer side of the substrate (on the viewer side) and a coloring layer and the electrode layer used for the display element are provided on the inner side of the substrate in that order; however, the polarizing plate may be provided on the inner side of the substrate. The stacked-layer structure of the polarizing plate and the coloring layer is not limited to this embodiment and may be set as appropriate depending on materials of the polarizing plate and the coloring layer or conditions of manufacturing steps. Further, a light-blocking film functioning as a black matrix may be provided.

In this embodiment, in order to reduce surface unevenness of the thin film transistor and to improve reliability of the thin film transistor, the thin film transistor obtained in any of Embodiments 1 to 5 is covered with the insulating layers (the insulating layer 4020 and the insulating layer 4021) functioning as a protective film and a planarizing insulating film. Note that the protective film is provided to prevent entry of contaminant impurities such as an organic substance, metal, or moisture present in air and is preferably a dense film. The protective film may be formed with a single layer or a stacked layer of any of a silicon oxide film, a silicon nitride film, a silicon oxynitride film, a silicon nitride oxide film, an aluminum oxide film, an aluminum nitride film, an aluminum oxynitride film, and an aluminum nitride oxide film with a sputtering method. Although an example in which the protective film is formed with a sputtering method is described in this embodiment, the present invention is not limited to this example, and the protective film may be formed with a variety of methods.

In this embodiment, the insulating layer 4020 having a stacked-layer structure is formed as a protective film. Here, as a first layer of the insulating layer 4020, a silicon oxide film is formed with a sputtering method. The use of a silicon oxide film as a protective film has an effect of preventing hillocks of an aluminum film which is used as a source electrode layer and a drain electrode layer.

As a second layer of the protective film, an insulating layer is formed. In this embodiment, as the second layer of the insulating layer 4020, a silicon nitride film is formed with a sputtering method. The use of the silicon nitride film as the protective film can prevent mobile ions of sodium or the like from entering a semiconductor region so that variation in electric characteristics of the TFT can be suppressed.

After the protective film is formed, the oxide semiconductor layer may be annealed (at 300° C. to 400° C.).

The insulating layer 4021 is formed as the planarizing insulating film. As the insulating layer 4021, an organic material having heat resistance such as polyimide, acrylic, benzocyclobutene, polyamide, or epoxy can be used. Other than such organic materials, it is also possible to use a low-dielectric constant material (a low-k material), a siloxane-based resin, phosphosilicate glass (PSG), borophosphosilicate glass (BPSG), or the like. Note that the insulating layer 4021 may be formed by stacking a plurality of insulating films formed using these materials.

Note that a siloxane-based resin is a resin formed using a siloxane-based material as a starting material and having the bond of Si—O—Si. The siloxane-based resin may include an organic group (such as an alkyl group or an aryl group) or a fluoro group as a substituent. The organic group may include a fluoro group.

A formation method of the insulating layer 4021 is not particularly limited, and the following method can be employed depending on the material: a sputtering method, an SOG method, a spin coating method, a dipping method, a spray coating method, a droplet discharge method (such as an inkjet method, screen printing, or offset printing), a doctor knife, a roll coater, a curtain coater, a knife coater, or the like. In the case of forming the insulating layer 4021 using a material solution, annealing (300° C. to 400° C.) of the oxide semiconductor layer may be performed at the same time as a baking step. The baking step of the insulating layer 4021 also serves as the annealing of the oxide semiconductor layer, whereby a semiconductor device can be manufactured efficiently.

The pixel electrode layer 4030 and the counter electrode layer 4031 can be formed using a light-transmitting conductive material such as indium oxide including tungsten oxide, indium zinc oxide including tungsten oxide, indium oxide including titanium oxide, indium tin oxide including titanium oxide, indium tin oxide (hereinafter referred to as ITO), indium zinc oxide, indium tin oxide to which silicon oxide is added, or the like.

A conductive composition including a conductive macromolecule (also referred to as a conductive polymer) can be used for the pixel electrode layer 4030 and the counter electrode layer 4031. The pixel electrode formed using the conductive composition preferably has a sheet resistance of less than or equal to 10000 ohms per square and transmittance of greater than or equal to 70% at a wavelength of 550 nm. Further, the resistivity of the conductive polymer included in the conductive composition is preferably less than or equal to 0.1 Ω·cm.

As the conductive polymer, a so-called π-electron conjugated conductive polymer can be used. For example, polyaniline or a derivative thereof, polypyrrole or a derivative thereof, polythiophene or a derivative thereof, a copolymer of two or more kinds of them, and the like can be given.

Further, a variety of signals and potentials are supplied to the signal line driver circuit 4003 which is formed separately, the scan line driver circuit 4004, or the pixel portion 4002 from an FPC 4018.

In this embodiment, a connection terminal electrode 4015 is formed from the same conductive film as the pixel electrode layer 4030 included in the liquid crystal element 4013, and a terminal electrode 4016 is formed from the same conductive film as the source and drain electrode layers of the thin film transistors 4010 and 4011.

The connection terminal electrode 4015 is electrically connected to a terminal included in the FPC 4018 through an anisotropic conductive film 4019.

FIGS. 11A1, 11A2, and 11B illustrate an example in which the signal line driver circuit 4003 is formed separately and mounted on the first substrate 4001; however, this embodiment is not limited to this structure. The scan line driver circuit may be separately formed and then mounted, or only part of the signal line driver circuit or part of the scan line driver circuit may be separately formed and then mounted.

Figure 12:
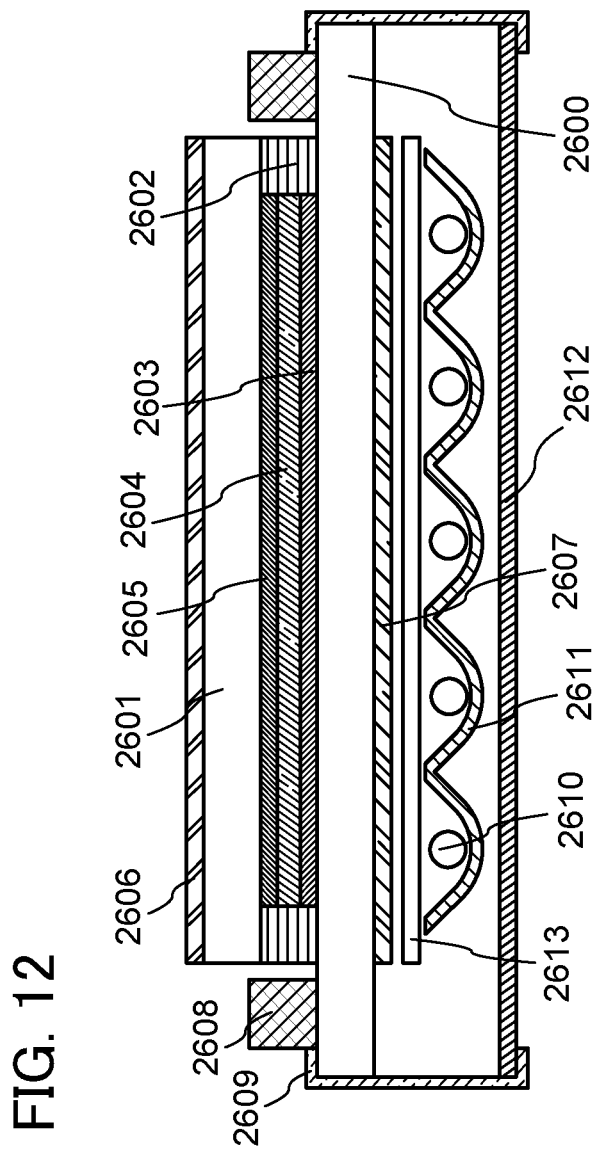
FIG. 12 illustrates a semiconductor device according to one embodiment of the present invention.

FIG. 12 illustrates an example in which a liquid crystal display module is formed as a semiconductor device by using a TFT substrate 2600 manufactured by application of the TFT described in any of Embodiments 1 to 5.

FIG. 12 illustrates an example of a liquid crystal display module, in which the TFT substrate 2600 and a counter substrate 2601 are fixed to each other with a sealant 2602, and a pixel portion 2603 including a TFT or the like, a display element 2604 including a liquid crystal layer, and a coloring layer 2605 are provided between the substrates to form a display region. The coloring layer 2605 is necessary to perform color display. In the case of the RGB system, respective coloring layers corresponding to colors of red, green, and blue are provided for respective pixels. Polarizing plates 2606 and 2607 and a diffusion plate 2613 are provided outside the TFT substrate 2600 and the counter substrate 2601. A light source includes a cold cathode tube 2610 and a reflective plate 2611, and a circuit board 2612 is connected to a wiring circuit portion 2608 of the TFT substrate 2600 through a flexible wiring board 2609 and includes an external circuit such as a control circuit or a power source circuit. The polarizing plate and the liquid crystal layer may be stacked with a retardation plate interposed therebetween.

For the liquid crystal display module, a twisted nematic (TN) mode, an in-plane-switching (IPS) mode, a fringe field switching (FFS) mode, a multi-domain vertical alignment (MVA) mode, a patterned vertical alignment (PVA) mode, an axially symmetric aligned micro-cell (ASM) mode, an optical compensated birefringence (OCB) mode, a ferroelectric liquid crystal (FLC) mode, an antiferroelectric liquid crystal (AFLC) mode, or the like can be used.

Through the above process, a highly reliable liquid crystal display panel as a semiconductor device can be manufactured.

Note that the structure described in this embodiment can be combined with any of the structures described in other embodiments as appropriate.

Embodiment 8

In this embodiment, an example of electronic paper will be described as an embodiment of a semiconductor device to which the thin film transistor described in any of Embodiments 1 to 5 is applied.

Figure 13:
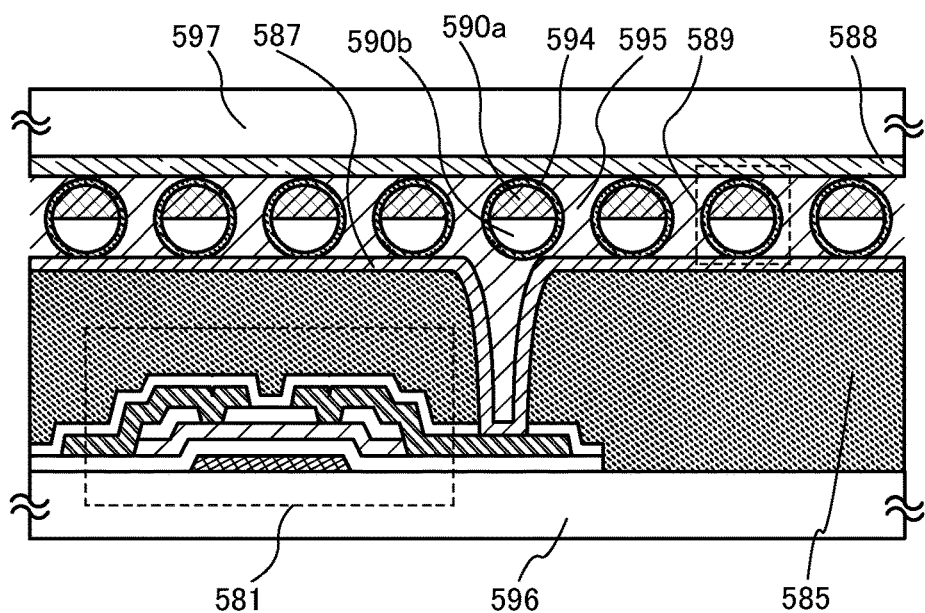
FIG. 13 illustrates a semiconductor device according to one embodiment of the present invention.

FIG. 13 illustrates active matrix electronic paper as an example of a semiconductor device. A thin film transistor 581 used for the semiconductor device can be manufactured by application of the thin film transistor described in any of Embodiments 1 to 5.

The electronic paper in FIG. 13 is an example of a display device using a twisting ball display system. The twisting ball display system refers to a method in which spherical particles colored in black and white are arranged between a first electrode layer and a second electrode layer which are electrode layers used for a display element, and a potential difference is generated between the first electrode layer and the second electrode layer to control orientation of the spherical particles, so that display is performed.

The thin film transistor 581 which is formed over a substrate 596 is a thin film transistor with a bottom gate structure, and a source or drain electrode layer thereof is in contact with a first electrode layer 587 through an opening formed in an insulating layer 585, whereby the thin film transistor 581 is electrically connected to the first electrode layer 587. Between the first electrode layer 587 and a second electrode layer 588 which is formed on a substrate 597, spherical particles 589 each having a black region 590a, a white region 590b, and a cavity 594 around the regions which is filled with liquid are provided. A space around the spherical particles 589 is filled with a filler 595 such as a resin (see FIG. 13). In this embodiment, the first electrode layer 587 corresponds to a pixel electrode and the second electrode layer 588 corresponds to a common electrode. The second electrode layer 588 is electrically connected to a common potential line provided over the same substrate as the thin film transistor 581. With the use of the common connection portion described in any one of Embodiments 1 to 5, the second electrode layer 588 is electrically connected to the common potential line through conductive particles provided between the pair of substrates.

Further, instead of the twisting ball, an electrophoretic element can be used. A microcapsule having a diameter of approximately 10 µm to 200 µm in which transparent liquid, positively charged white microparticles, and negatively charged black microparticles are encapsulated, is used. In the microcapsule which is provided between the first electrode layer and the second electrode layer, when an electric field is applied by the first electrode layer and the second electrode layer, the white microparticles and the black microparticles move to opposite sides, so that white or black can be displayed. A display element using this principle is an electrophoretic display element and is called electronic paper in general. The electrophoretic display element has higher reflectance than a liquid crystal display element, and thus, an auxiliary light is unnecessary, power consumption is low, and a display portion can be recognized even in a dim place. In addition, even when power is not supplied to the display portion, an image which has been once displayed can be maintained. Accordingly, an image display can be maintained even when a semiconductor device having a display function (which may be simply referred to as a display device or a semiconductor device provided with a display device) is distanced from a wireless electric power source.

An electrophoretic display element is a display element that utilizes a so-called dielectrophoretic effect by which a substance having a high dielectric constant moves to a region with high electric field. An electrophoretic display element does not need to have a polarizing plate, which is necessary in a liquid crystal display device, and the thickness and weight of a device including the electrophoretic display element can be reduced as compared to those of a liquid crystal display device.

A solution in which the above microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

In addition, if a plurality of the above microcapsules are arranged as appropriate over an active matrix substrate so as to be interposed between two electrodes, an active matrix display device can be completed, and display can be performed by application of an electric field to the microcapsules. For example, the active matrix substrate obtained with the thin film transistor described in any of Embodiments 1 to 5 can be used.

Note that the microparticles in the microcapsules may be formed using a single material selected from a conductive material, an insulating material, a semiconductor material, a magnetic material, a liquid crystal material, a ferroelectric material, an electroluminescent material, an electrochromic material, and a magnetophoretic material, or may be formed using a composite material of any of these.

Note that the structure described in this embodiment can be combined with any of the structures described in other embodiments as appropriate.

Embodiment 9

In this embodiment, an example of a light-emitting display device will be described as an embodiment of a semiconductor device to which the thin film transistor described in any of Embodiments 1 to 5 is applied. As a display element included in a display device, a light-emitting element utilizing electroluminescence is described here. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer including a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

Inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that description is made here using an organic EL element as a light-emitting element.

Figure 14:
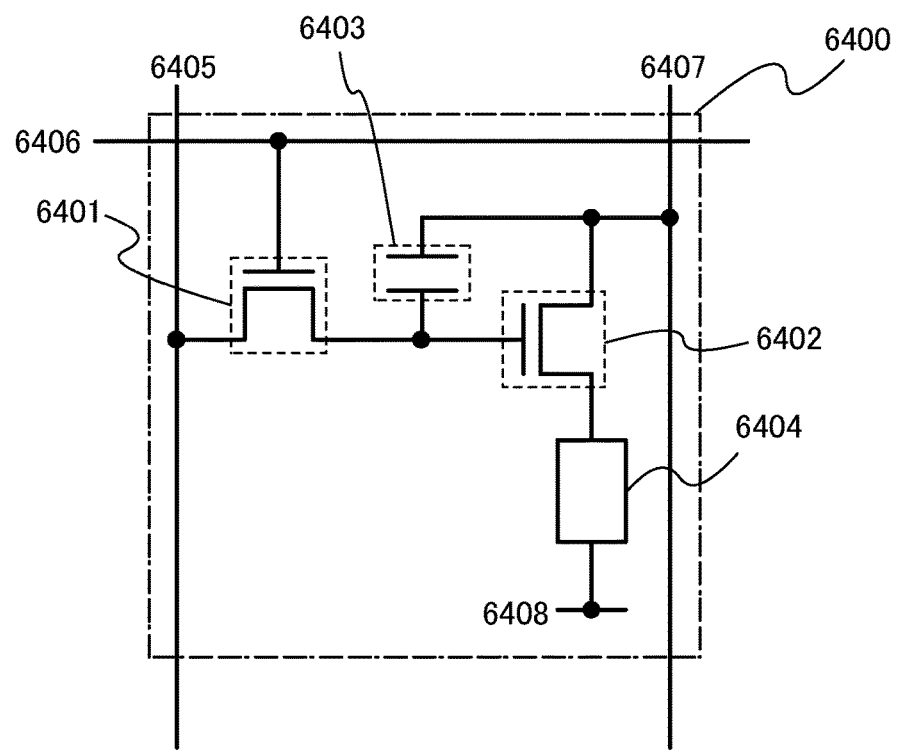
FIG. 14 illustrates a pixel equivalent circuit of a semiconductor device according to one embodiment of the present invention.

FIG. 14 illustrates an example of a pixel structure to which digital time grayscale driving can be applied, as an example of a semiconductor device to which an embodiment of the present invention is applied.

A structure and operation of a pixel to which digital time grayscale driving can be applied are described. Here, one pixel includes two n-channel transistors each of which includes an oxide semiconductor layer in a channel formation region and is described in any of Embodiments 1 to 5.

A pixel 6400 includes a switching transistor 6401, a driving transistor 6402, a light-emitting element 6404, and a capacitor 6403. A gate of the switching transistor 6401 is connected to a scan line 6406, a first electrode (one of a source electrode and a drain electrode) of the switching transistor 6401 is connected to a signal line 6405, and a second electrode (the other of the source electrode and the drain electrode) of the switching transistor 6401 is connected to a gate of the driving transistor 6402. The gate of the driving transistor 6402 is connected to a power supply line 6407 through the capacitor 6403, a first electrode of the driving transistor 6402 is connected to the power supply line 6407, and a second electrode of the driving transistor 6402 is connected to a first electrode (pixel electrode) of the light-emitting element 6404. A second electrode of the light-emitting element 6404 corresponds to a common electrode 6408. The common electrode 6408 is electrically connected to a common potential line provided over the same substrate.

The second electrode (the common electrode 6408) of the light-emitting element 6404 is set to a low power supply potential. Note that the low power supply potential is a potential satisfying the low power supply potential<a high power supply potential with the high power supply potential set to the power supply line 6407 as a reference. As the low power supply potential, GND, 0 V, or the like may be employed, for example. A potential difference between the high power supply potential and the low power supply potential is applied to the light-emitting element 6404 and current is supplied to the light-emitting element 6404, so that the light-emitting element 6404 emits light. Here, in order to make the light-emitting element 6404 emit light, each potential is set so that the potential difference between the high power supply potential and the low power supply potential is higher than or equal to a forward threshold voltage of the light emitting element 6404.

Note that gate capacitance of the driving transistor 6402 may be used as a substitute for the capacitor 6403, so that the capacitor 6403 can be omitted. The gate capacitance of the driving transistor 6402 may be formed between the channel region and the gate electrode.

In the case of a voltage-input voltage driving method, a video signal is input to the gate of the driving transistor 6402 so that the driving transistor 6402 is in either of two states of being sufficiently turned on and turned off. That is, the driving transistor 6402 is operated in a linear region. Since the driving transistor 6402 is operated in a linear region, a voltage higher than the voltage of the power supply line 6407 is applied to the gate of the driving transistor 6402. Note that voltage higher than or equal to (voltage of the power supply line+$V_{th}$ of the driving transistor 6402) is applied to the signal line 6405.

In the case of performing analog grayscale driving instead of digital time grayscale driving, the same pixel structure as FIG. 14 can be used by changing signal input.

In the case of performing analog grayscale driving, voltage higher than or equal to the sum of the forward voltage of the light-emitting element 6404 and the $V_{th}$ of the driving transistor 6402 is applied to the gate of the driving transistor 6402. The forward voltage of the light-emitting element 6404 indicates voltage at which a desired luminance is obtained, and includes at least forward threshold voltage. The video signal by which the driving transistor 6402 is operated in a saturation region is input, so that current can be supplied to the light-emitting element 6404. In order for the driving transistor 6402 to be operated in a saturation region, the potential of the power supply line 6407 is set higher than the gate potential of the driving transistor 6402. When an analog video signal is used, it is possible to feed current to the light-emitting element 6404 in accordance with the video signal and perform analog grayscale driving.

Note that the pixel structure illustrated in FIG. 14 is not limited thereto. For example, a switch, a resistor, a capacitor, a transistor, a logic circuit, or the like may be added to the pixel illustrated in FIG. 14.

Next, structures of the light-emitting element are described with reference to FIGS. 15A to 15C. A cross-sectional structure of a pixel is described by taking an n-channel driving TFT as an example. Driving TFTs 7001, 7011, and 7021 used for semiconductor devices illustrated in FIGS. 15A to 15C can be formed in a manner similar to that of the thin film transistor described in any of Embodiments 1 to 5 and are highly reliable thin film transistors each including an oxide semiconductor layer typified by an In—Ga—Zn—O-based non-single-crystal film.

In order to extract light emitted from the light-emitting element, at least one of the anode and the cathode is required to transmit light. A thin film transistor and a light-emitting element are formed over a substrate. A light-emitting element can have a top emission structure, in which light emission is extracted through the surface opposite to the substrate; a bottom emission structure, in which light emission is extracted through the surface on the substrate side; or a dual emission structure, in which light emission is extracted through the surface opposite to the substrate and the surface on the substrate side. A pixel structure of an embodiment of the present invention can be applied to a light-emitting element having any of these emission structures.

A light-emitting element having a top emission structure is described with reference to FIG. 15A.

Figure 15A:
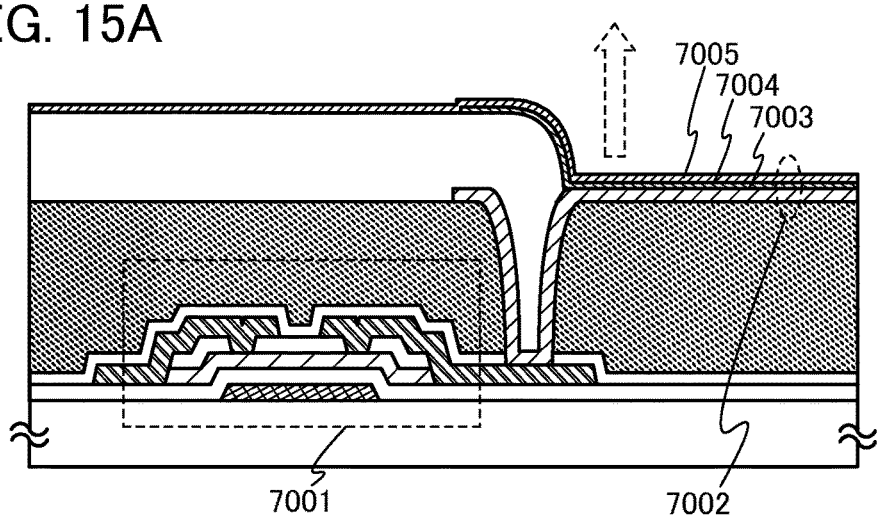
FIGS. 15A to 15C each illustrate a semiconductor device according to one embodiment of the present invention.

FIG. 15A is a cross-sectional view of a pixel in the case where the driving TFT 7001 is an n-channel TFT and light is emitted from a light-emitting element 7002 to an anode 7005 side. In FIG. 15A, a cathode 7003 of the light-emitting element 7002 is electrically connected to the driving TFT 7001, and a light-emitting layer 7004 and the anode 7005 are stacked in this order over the cathode 7003. The cathode 7003 can be formed using a variety of conductive materials as long as they have a low work function and reflect light. For example, Ca, Al, MgAg, AlLi, or the like is preferably used. The light-emitting layer 7004 may be formed using a single layer or a plurality of layers stacked. When the light-emitting layer 7004 is formed using a plurality of layers, the light-emitting layer 7004 is formed by stacking an electron-injection layer, an electron-transport layer, a light-emitting layer, a hole-transport layer, and a hole-injection layer in this order over the cathode 7003. It is not necessary to form all of these layers. The anode 7005 is formed using a light-transmitting conductive film such as a film of indium oxide including tungsten oxide, indium zinc oxide including tungsten oxide, indium oxide including titanium oxide, indium tin oxide including titanium oxide, indium tin oxide (hereinafter referred to as ITO), indium zinc oxide, or indium tin oxide to which silicon oxide is added.

The light-emitting element 7002 corresponds to a region where the light-emitting layer 7004 is sandwiched between the cathode 7003 and the anode 7005. In the case of the pixel illustrated in FIG. 15A, light is emitted from the light-emitting element 7002 to the anode 7005 side as indicated by an arrow.

Next, a light-emitting element having a bottom emission structure is described with reference to FIG. 15B. FIG. 15B is a cross-sectional view of a pixel in the case where the driving TFT 7011 is an n-channel transistor and light is emitted from a light-emitting element 7012 to a cathode 7013 side. In FIG. 15B, the cathode 7013 of the light-emitting element 7012 is formed over a light-transmitting conductive film 7017 that is electrically connected to the driving TFT 7011, and a light-emitting layer 7014 and an anode 7015 are stacked in this order over the cathode 7013. A light-blocking film 7016 for reflecting or blocking light may be formed to cover the anode 7015 when the anode 7015 has a light-transmitting property. For the cathode 7013, a variety of materials can be used as in the case of FIG. 15A as long as they are conductive materials having a low work function. The cathode 7013 is formed to have a thickness that can transmit light (preferably, approximately 5 nm to 30 nm). For example, an aluminum film with a thickness of 20 nm can be used as the cathode 7013. In a manner similar to the case of FIG. 15A, the light-emitting layer 7014 may be formed using either a single layer or a plurality of layers stacked. The anode 7015 is not required to transmit light, but can be formed using a light-transmitting conductive material as in the case of FIG. 15A. As the light-blocking film 7016, for example, metal or the like that reflects light can be used; however, it is not limited to a metal film. For example, a resin or the like to which black pigments are added can also be used.

The light-emitting element 7012 corresponds to a region where the light-emitting layer 7014 is sandwiched between the cathode 7013 and the anode 7015. In the case of the pixel illustrated in FIG. 15B, light is emitted from the light-emitting element 7012 to the cathode 7013 side as indicated by an arrow.

Next, a light-emitting element having a dual emission structure is described with reference to FIG. 15C. In FIG. 15C, a cathode 7023 of a light-emitting element 7022 is formed over a light-transmitting conductive film 7027 which is electrically connected to the driving TFT 7021, and a light-emitting layer 7024 and an anode 7025 are stacked in this order over the cathode 7023. As in the case of FIG. 15A, the cathode 7023 can be formed using a variety of conductive materials as long as they have a low work function. The cathode 7023 is formed to have a thickness so that it can transmit light. For example, a film of Al having a thickness of 20 nm can be used as the cathode 7023. As in FIG. 15A, the light-emitting layer 7024 may be formed using either a single layer or a plurality of layers stacked. The anode 7025 can be formed using a light-transmitting conductive material as in the case of FIG. 15A.

The light-emitting element 7022 corresponds to a region where the cathode 7023, the light-emitting layer 7024, and the anode 7025 overlap with one another. In the case of the pixel illustrated in FIG. 15C, light is emitted from the light-emitting element 7022 to both the anode 7025 side and the cathode 7023 side as indicated by arrows.

Note that, although an organic EL element is described here as a light-emitting element, an inorganic EL element can also be provided as a light-emitting element.

In this embodiment, the example is described in which a thin film transistor (a driving TFT) which controls the driving of a light-emitting element is electrically connected to the light-emitting element; however, a structure may be employed in which a TFT for current control is connected between the driving TFT and the light-emitting element.

Figure 15B:
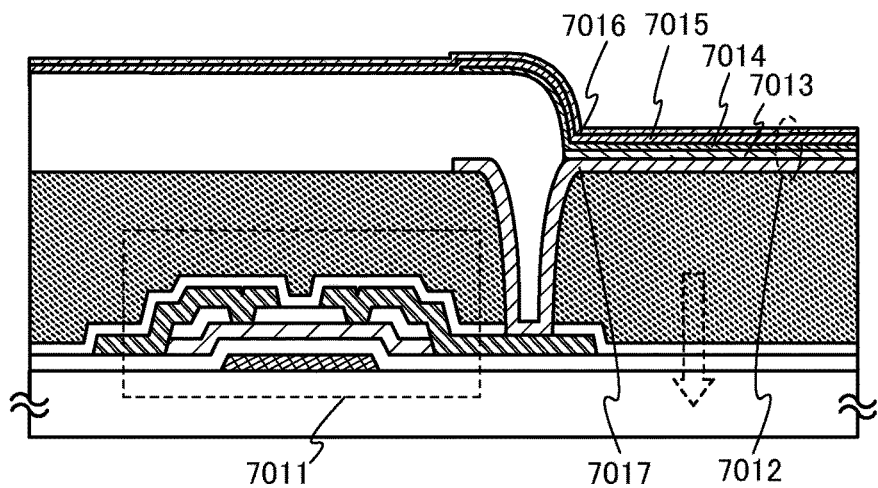
Figure 15C:
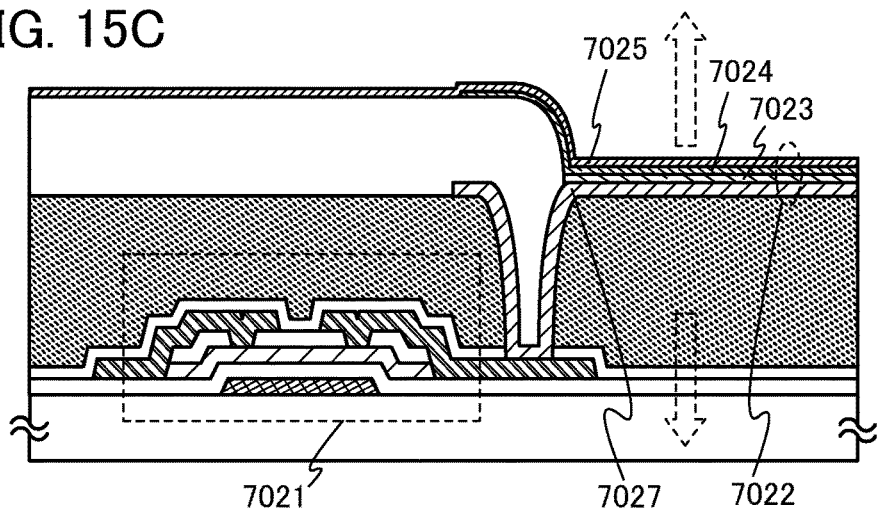

A semiconductor device described in this embodiment is not limited to the structures illustrated in FIGS. 15A to 15C and can be modified in various ways based on the spirit of techniques according to the present invention.

Figure 16A:
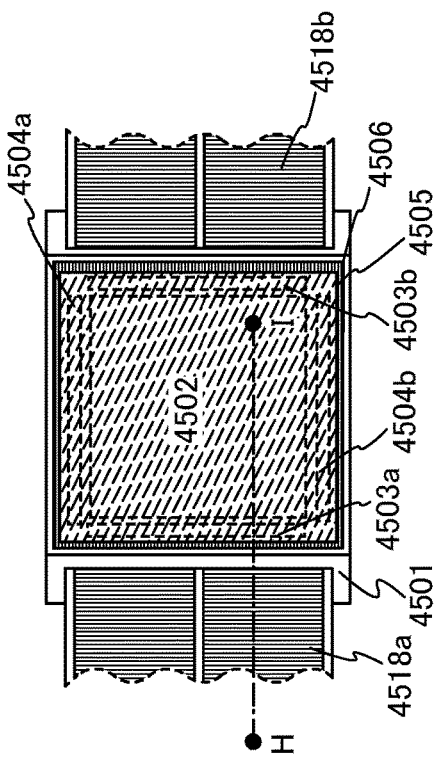
FIGS. 16A and 16B illustrate a semiconductor device according to one embodiment of the present invention.
Figure 16B:
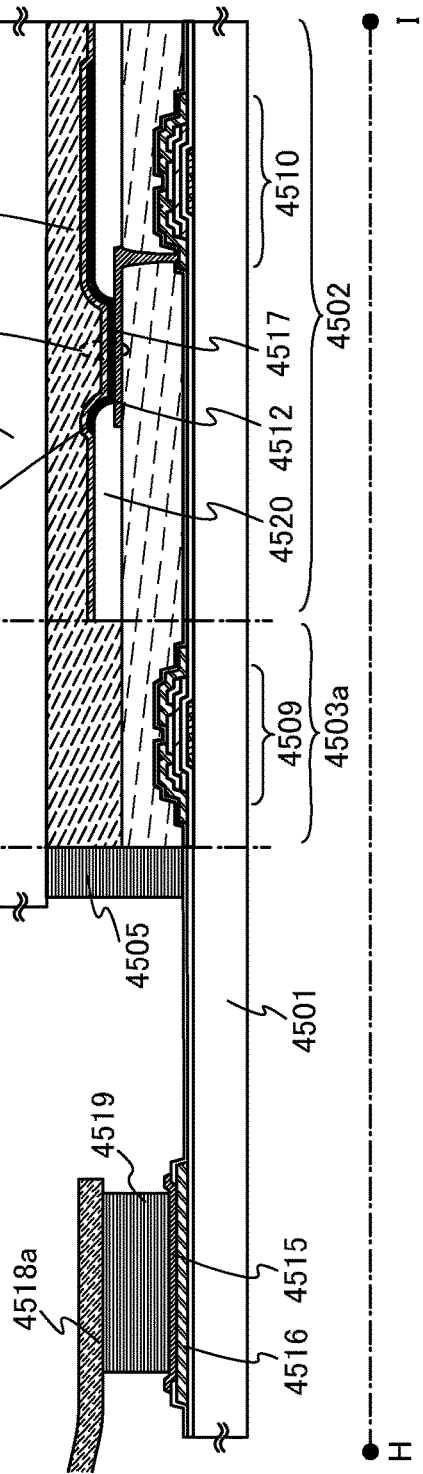

Next, the appearance and a cross section of a light-emitting display panel (also referred to as a light-emitting panel), which is one embodiment of a semiconductor device to which the thin film transistor described in any of Embodiments 1 to 5 is applied, are described with reference to FIGS. 16A and 16B. FIG. 16A is a top view of a panel in which a thin film transistor and a light-emitting element formed over a first substrate are sealed with a sealant between the first substrate and a second substrate. FIG. 16B is a cross-sectional view taken along line H-I of FIG. 16A.

A sealant 4505 is provided so as to surround a pixel portion 4502, signal line driver circuits 4503a and 4503b, and scan line driver circuits 4504a and 4504b which are provided over a first substrate 4501. In addition, a second substrate 4506 is provided over the pixel portion 4502, the signal line driver circuits 4503a and 4503b, and the scan line driver circuits 4504a and 4504b. Accordingly, the pixel portion 4502, the signal line driver circuits 4503a and 4503b, and the scan line driver circuits 4504a and 4504b are sealed together with a filler 4507, by the first substrate 4501, the sealant 4505, and the second substrate 4506. It is preferable that a panel be packaged (sealed) with a protective film (such as a laminate film or an ultraviolet curable resin film) or a cover material with high air-tightness and little degasification so that the panel is not exposed to the outside air as described above.

The pixel portion 4502, the signal line driver circuits 4503a and 4503b, and the scan line driver circuits 4504a and 4504b provided over the first substrate 4501 each include a plurality of thin film transistors, and a thin film transistor 4510 included in the pixel portion 4502 and a thin film transistor 4509 included in the signal line driver circuit 4503a are illustrated as an example in FIG. 16B.

The highly reliable thin film transistor including an oxide semiconductor layer typified by an In—Ga—Zn—O-based non-single-crystal film, which is described in any of Embodiments 1 to 5, can be employed as the thin film transistors 4509 and 4510. In this embodiment, the thin film transistors 4509 and 4510 are n-channel thin film transistors.

Moreover, reference numeral 4511 denotes a light-emitting element. A first electrode layer 4517 which is a pixel electrode included in the light-emitting element 4511 is electrically connected to a source electrode layer or a drain electrode layer of the thin film transistor 4510. Note that, although the light-emitting element 4511 has a stacked-layer structure composed of the first electrode layer 4517, an electroluminescent layer 4512, and the second electrode layer 4513, the structure of the light-emitting element 4511 is not limited to the structure described in this embodiment. The structure of the light-emitting element 4511 can be changed as appropriate depending on the direction in which light is extracted from the light-emitting element 4511, or the like.

A partition wall 4520 is formed using an organic resin film, an inorganic insulating film, or organic polysiloxane. It is particularly preferable that the partition wall 4520 be formed using a photosensitive material and an opening portion be formed over the first electrode layer 4517 so that a sidewall of the opening portion is formed as an inclined surface with continuous curvature.

The electroluminescent layer 4512 may be formed with a single layer or a plurality of layers stacked.

A protective film may be formed over the second electrode layer 4513 and the partition wall 4520 in order to prevent entry of oxygen, moisture, carbon dioxide, or the like into the light-emitting element 4511. As the protective film, a silicon nitride film, a silicon nitride oxide film, a DLC film, or the like can be formed.

In addition, a variety of signals and potentials are supplied to the signal line driver circuits 4503a and 4503b, the scan line driver circuits 4504a and 4504b, or the pixel portion 4502 from FPCs 4518a and 4518b.

In this embodiment, a connection terminal electrode 4515 is formed from the same conductive film as the first electrode layer 4517 included in the light-emitting element 4511, and a terminal electrode 4516 is formed from the same conductive film as the source and drain electrode layers included in the thin film transistors 4509 and 4510.

The connection terminal electrode 4515 is electrically connected to a terminal included in the FPC 4518a through an anisotropic conductive film 4519.

The second substrate located in the direction in which light is extracted from the light-emitting element 4511 needs to have a light-transmitting property. In that case, a light-transmitting material such as a glass plate, a plastic plate, a polyester film, or an acrylic film is used.

As the filler 4507, an ultraviolet curable resin or a thermosetting resin can be used, in addition to an inert gas such as nitrogen or argon. For example, polyvinyl chloride (PVC), acrylic, polyimide, an epoxy resin, a silicone resin, polyvinyl butyral (PVB), or ethylene vinyl acetate (EVA) can be used. In this embodiment, nitrogen is used as the filler.

In addition, if needed, an optical film such as a polarizing plate, a circularly polarizing plate (including an elliptically polarizing plate), a retardation plate (a quarter-wave plate or a half-wave plate), or a color filter may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so that the glare is reduced can be performed.

The signal line driver circuits 4503a and 4503b and the scan line driver circuits 4504a and 4504b may be provided as driver circuits formed using a single crystal semiconductor film or polycrystalline semiconductor film over a substrate separately prepared. In addition, only the signal line driver circuits or part thereof, or only the scan line driver circuits or part thereof may be separately formed and mounted. This embodiment is not limited to the structure illustrated in FIGS. 16A and 16B.

Through the above process, a highly reliable light-emitting display device (display panel) as a semiconductor device can be manufactured.

Note that the structure described in this embodiment can be combined with any of the structures described in other embodiments as appropriate.

Embodiment 10

A semiconductor device to which the thin film transistor described in any of Embodiments 1 to 5 is applied can be used as electronic paper. Electronic paper can be used for electronic devices of a variety of fields as long as they can display data. For example, electronic paper can be applied to an electronic book (e-book) reader, a poster, an advertisement in a vehicle such as a train, displays of various cards such as a credit card, and the like. Examples of the electronic devices are illustrated in FIGS. 17A and 17B and FIG. 18.

Figure 17A:
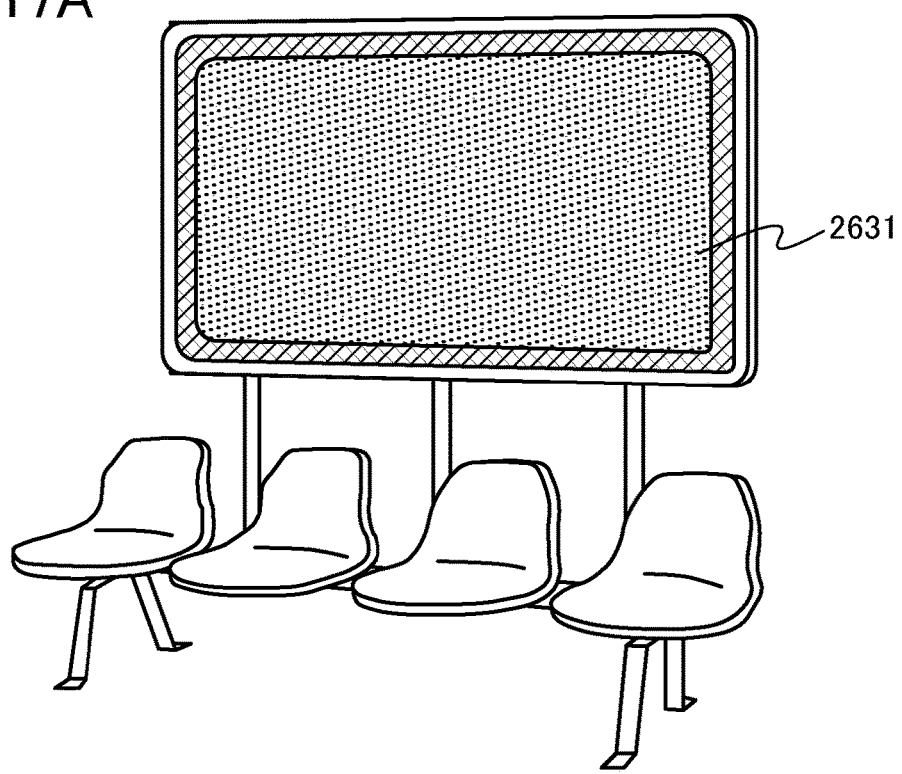
FIGS. 17A and 17B illustrate examples of usage patterns of electronic paper.

FIG. 17A illustrates a poster 2631 formed using electronic paper. In the case where an advertising medium is printed paper, replacement of the advertisement is performed by manpower; however, by using electronic paper, the advertising display can be changed in a short time. Further, an image can be stably displayed without being distorted. Note that the poster may be configured to transmit and receive data wirelessly.

Figure 17B:
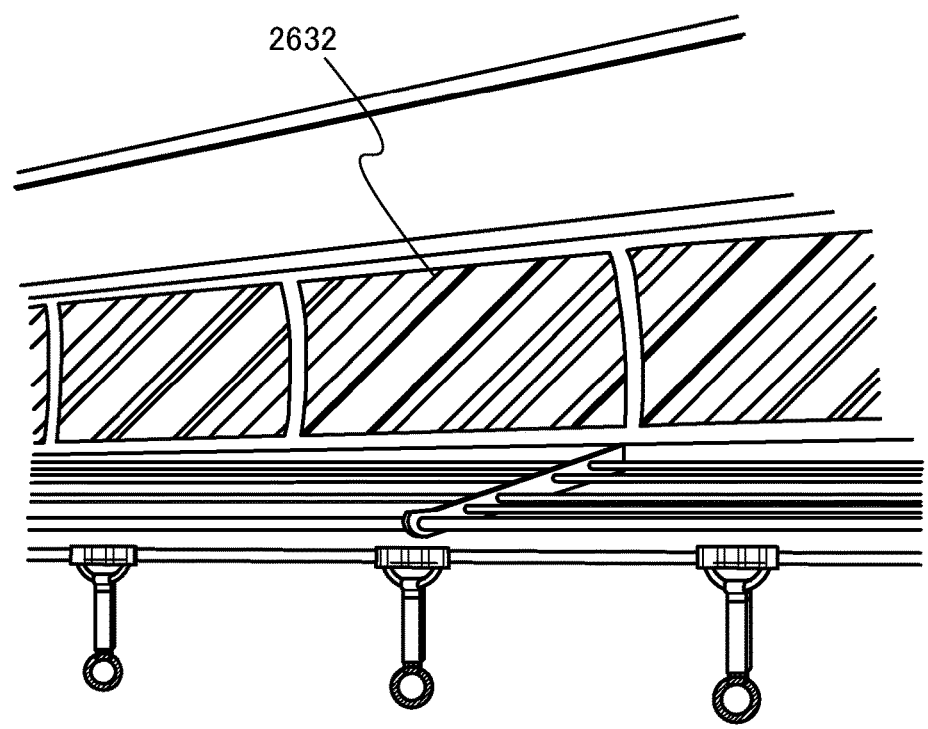

FIG. 17B illustrates an advertisement 2632 in a vehicle such as a train. In the case where an advertising medium is printed paper, replacement of the advertisement is performed by manpower; however, by using electronic paper, the advertising display can be changed in a short time without a lot of manpower. Further, an image can be stably displayed without being distorted. Note that the advertisement in a vehicle may be configured to transmit and receive data wirelessly.

Figure 18:
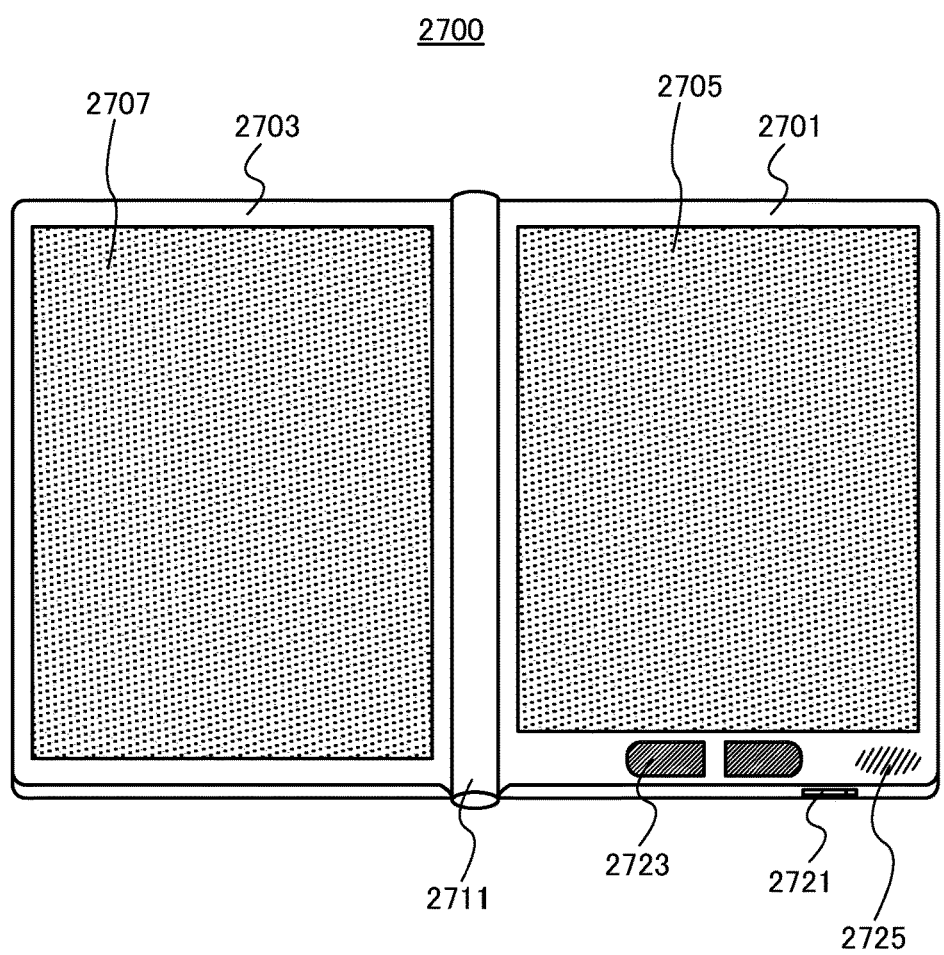
FIG. 18 is an external view illustrating one embodiment of an electronic book reader.

FIG. 18 illustrates an example of an electronic book reader 2700. For example, the electronic book reader 2700 includes two housings, a housing 2701 and a housing 2703. The housing 2701 and the housing 2703 are combined with a hinge 2711 so that the electronic book reader 2700 can be opened and closed with the hinge 2711 as an axis. With such a structure, the electronic book reader 2700 can be operated like a paper book.

A display portion 2705 and a display portion 2707 are incorporated in the housing 2701 and the housing 2703, respectively. The display portion 2705 and the display portion 2707 may be configured to display one image or different images. In the case where the display portion 2705 and the display portion 2707 display different images, for example, a display portion on the right side (the display portion 2705 in FIG. 18) can display text and a display portion on the left side (the display portion 2707 in FIG. 18) can display graphics.

FIG. 18 illustrates an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, or the like may be provided on the surface of the housing, on which the display portion is provided. Further, an external connection terminal (an earphone terminal, a USB terminal, a terminal that can be connected to various cables such as an AC adapter and a USB cable, or the like), a recording medium insertion portion, or the like may be provided on the back surface or the side surface of the housing. Further, the electronic book reader 2700 may have a function of an electronic dictionary.

The electronic book reader 2700 may be configured to transmit and receive data wirelessly. The structure can be employed in which desired book data or the like is purchased and downloaded from an electronic book server wirelessly.

Note that the structure described in this embodiment can be combined with any of the structures described in other embodiments as appropriate.

Embodiment 11

A semiconductor device using the thin film transistor described in any of Embodiments 1 to 5 can be applied to a variety of electronic devices (including an amusement machine). Examples of electronic devices include a television set (also referred to as a television or a television receiver), a monitor of a computer or the like, a camera such as a digital camera or a digital video camera, a digital photo frame, a mobile phone handset (also referred to as a mobile phone or a mobile phone device), a portable game console, a portable information terminal, an audio reproducing device, a large-sized game machine such as a pachinko machine, and the like.

Figure 19A:
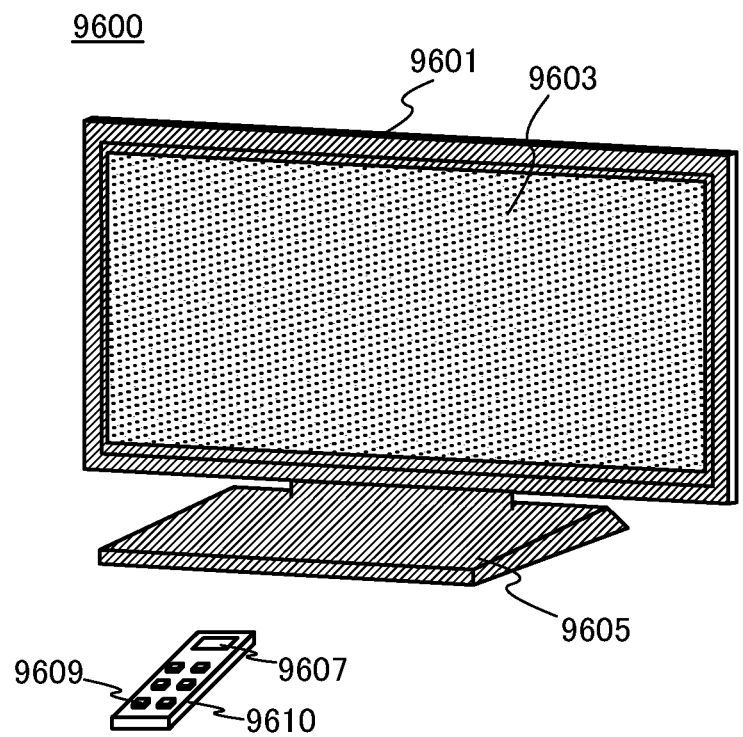
FIGS. 19A and 19B are external views respectively illustrating one embodiment of a television set and one embodiment of a digital photo frame.

FIG. 19A illustrates an example of a television set 9600. In the television set 9600, a display portion 9603 is incorporated in a housing 9601. The display portion 9603 can display an image. Further, here, the housing 9601 is supported by a stand 9605.

The television set 9600 can be operated with an operation switch of the housing 9601 or a separate remote controller 9610. Channels and volume can be controlled with an operation key 9609 of the remote controller 9610 so that an image displayed on the display portion 9603 can be controlled. Further, the remote controller 9610 may be provided with a display portion 9607 for displaying data output from the remote controller 9610.

Note that the television set 9600 is provided with a receiver, a modem, and the like. With the receiver, a general television broadcast can be received. Further, when the television set 9600 is connected to a communication network by wired or wireless connection via the modem, one-way (from a transmitter to a receiver) or two-way (between a transmitter and a receiver or between receivers) data communication can be performed.

Figure 19B:
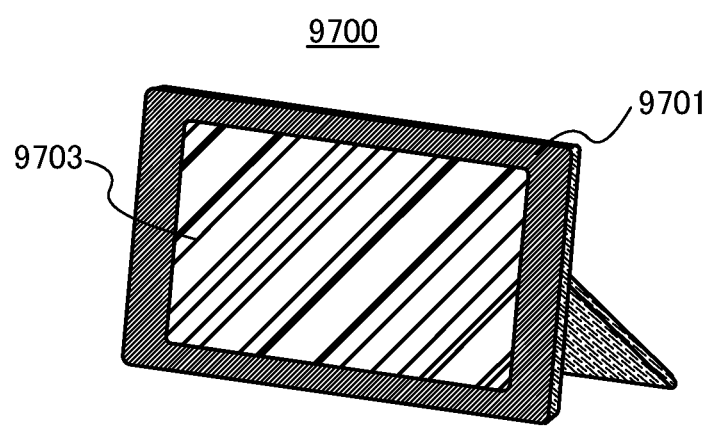

FIG. 19B illustrates an example of a digital photo frame 9700. For example, in the digital photo frame 9700, a display portion 9703 is incorporated in a housing 9701. The display portion 9703 can display various images. For example, the display portion 9703 can display data of an image taken with a digital camera or the like and function as a normal photo frame.

Note that the digital photo frame 9700 is provided with an operation portion, an external connection terminal (a USB terminal, a terminal that can be connected to various cables such as a USB cable, or the like), a recording medium insertion portion, and the like. Although these components may be provided on the surface on which the display portion is provided, it is preferable to provide them on the side surface or the back surface for the design of the digital photo frame 9700. For example, a memory storing data of an image taken with a digital camera is inserted in the recording medium insertion portion of the digital photo frame, whereby the image data can be transferred and then displayed on the display portion 9703.

The digital photo frame 9700 may be configured to transmit and receive data wirelessly. The structure may be employed in which desired image data is transferred wirelessly to be displayed.

Figure 20A:
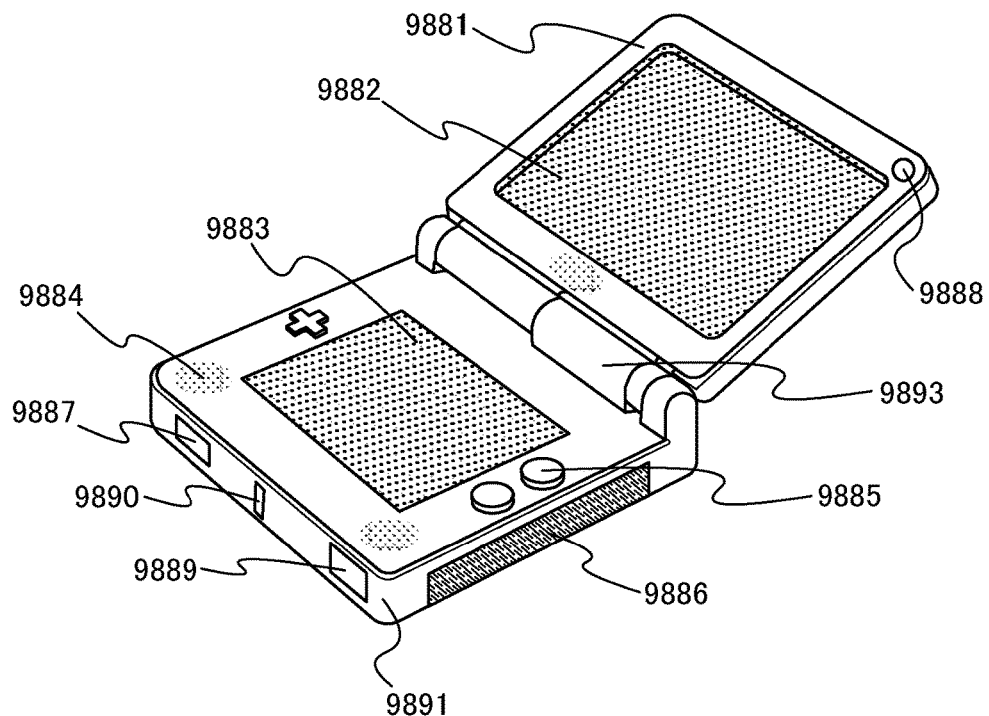
FIGS. 20A and 20B are external views each illustrating one embodiment of an amusement machine.

FIG. 20A illustrates a portable game machine and includes two housings, a housing 9881 and a housing 9891, which are connected with a joint portion 9893 so that the portable game machine can be opened or folded. A display portion 9882 is incorporated in the housing 9881, and a display portion 9883 is incorporated in the housing 9891. In addition, the portable game machine illustrated in FIG. 20A is provided with a speaker portion 9884, a recording medium insertion portion 9886, an LED lamp 9890, input means (an operation key 9885, a connection terminal 9887, a sensor 9888 (having a function of measuring force, displacement, position, speed, acceleration, angular velocity, rotation number, distance, light, liquid, magnetism, temperature, chemical substance, sound, time, hardness, electric field, current, voltage, electric power, radial ray, flow rate, humidity, gradient, vibration, odor, or infrared ray), and a microphone 9889), and the like. Needless to say, the structure of the portable game machine is not limited to that described above. The portable game machine may have a structure in which additional accessory equipment is provided as appropriate as long as at least a semiconductor device according to an embodiment of the present invention is provided. The portable game machine illustrated in FIG. 20A has a function of reading a program or data stored in a recording medium to display it on the display portion, and a function of sharing information with another portable game machine by wireless communication. Note that a function of the portable game machine illustrated in FIG. 20A is not limited to those described above, and the portable game machine can have a variety of functions.

Figure 20B:
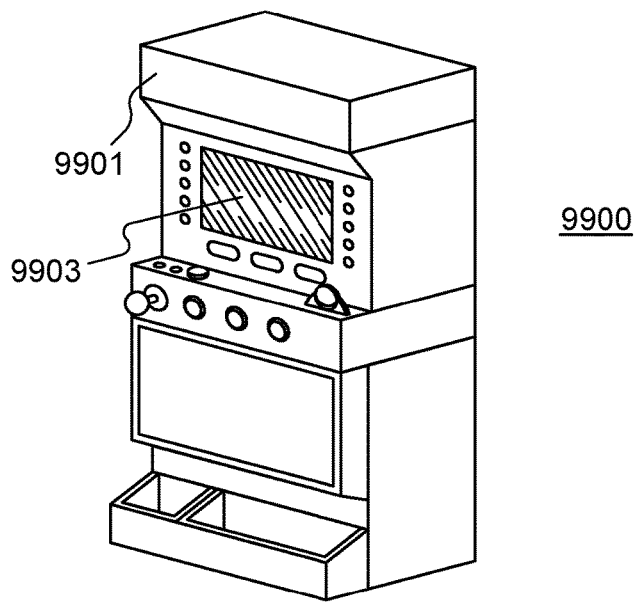

FIG. 20B illustrates an example of a slot machine 9900 which is a large-sized amusement machine. In the slot machine 9900, a display portion 9903 is incorporated in a housing 9901. In addition, the slot machine 9900 is provided with operation means such as a start lever and a stop switch, a coin slot, a speaker, and the like. Needless to say, the structure of the slot machine 9900 is not limited to that described above. The slot machine may have a structure in which additional accessory equipment is provided as appropriate as long as at least an embodiment of the present invention is provided.

Figure 21A:
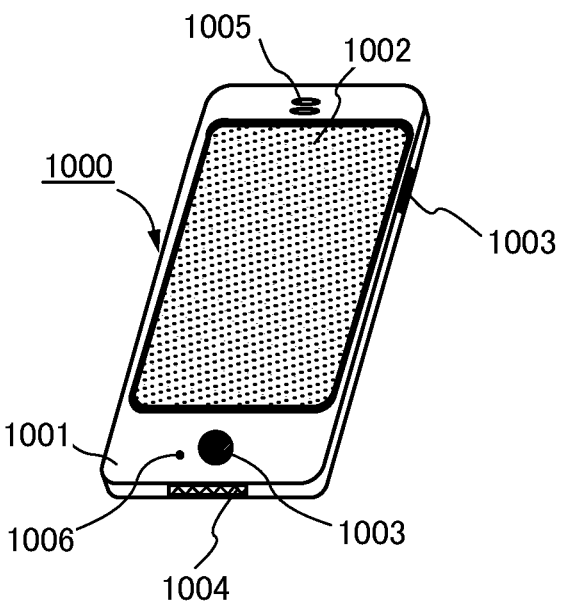
FIGS. 21A and 21B are external views each illustrating one embodiment of a mobile phone handset.

FIG. 21A illustrates an example of a mobile phone handset 1000. The mobile phone handset 1000 is provided with a display portion 1002 incorporated in a housing 1001, operation buttons 1003, an external connection port 1004, a speaker 1005, a microphone 1006, and the like.

When the display portion 1002 of the mobile phone handset 1000 illustrated in FIG. 21A is touched with a finger or the like, data can be input into the mobile phone handset 1000. Further, operation such as making calls and composing mails can be performed by touching the display portion 1002 with a finger or the like.

There are mainly three screen modes of the display portion 1002. The first mode is a display mode mainly for displaying an image. The second mode is an input mode mainly for inputting data such as text. The third mode is a mode which is a combination of the two modes of the display mode and the input mode.

For example, in the case of making a call or composing a mail, a text input mode mainly for inputting text is selected for the display portion 1002 so that text displayed on a screen can be input. In that case, it is preferable to display a keyboard or number buttons on almost all area of the screen of the display portion 1002.

When a detection device including a sensor for detecting inclination, such as a gyroscope or an acceleration sensor, is provided inside the mobile phone handset 1000, display on the screen of the display portion 1002 can be automatically changed by determining the orientation of the mobile phone handset 1000 (whether the mobile phone handset 1000 is placed horizontally or vertically for a landscape mode or a portrait mode).

The screen modes are switched by touching the display portion 1002 or using the operation buttons 1003 of the housing 1001. Alternatively, the screen modes may be switched depending on the kind of the image displayed on the display portion 1002. For example, when a signal of an image displayed on the display portion is the one of moving image data, the screen mode is switched to the display mode. When the signal is the one of text data, the screen mode is switched to the input mode.

Further, in the input mode, when input by touching the display portion 1002 is not performed for a certain period while a signal detected by the optical sensor in the display portion 1002 is detected, the screen mode may be controlled so as to be switched from the input mode to the display mode.

The display portion 1002 may function as an image sensor. For example, an image of a palm print, a fingerprint, or the like is taken when the display portion 1002 is touched with the palm or the finger, whereby personal identification can be performed. Further, by providing a backlight or a sensing light source which emits a near-infrared light in the display portion, an image of a finger vein, a palm vein, or the like can be taken.

Figure 21B:
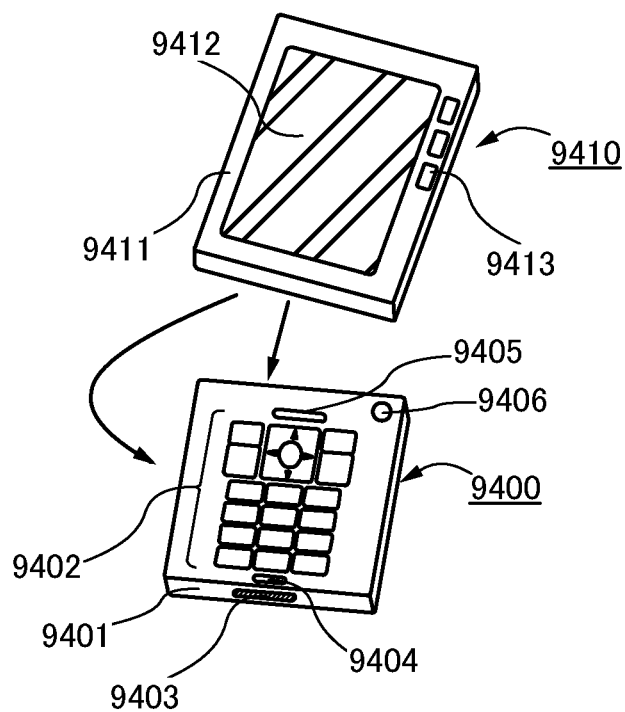

FIG. 21B illustrates another example of a mobile phone handset. The mobile phone handset in FIG. 21B has a display device 9410 in a housing 9411, which includes a display portion 9412 and an operation button 9413, and a communication device 9400 in a housing 9401, which includes operation buttons 9402, an external input terminal 9403, a microphone 9404, a speaker 9405, and a light-emitting portion 9406 that emits light when a phone call is received. The display device 9410 which has a display function can be detached from or attached to the communication device 9400 which has a phone function in two directions indicated by arrows. Thus, the display device 9410 and the communication device 9400 can be attached to each other along their short sides or long sides. In addition, when only the display function is needed, the display device 9410 can be detached from the communication device 9400 and used alone. Images or input data can be transmitted or received by wireless or wired communication between the communication device 9400 and the display device 9410, each of which has a rechargeable battery.

Note that the structure described in this embodiment can be combined with any of the structures described in other embodiments as appropriate.

Embodiment 12

Figure 22A:
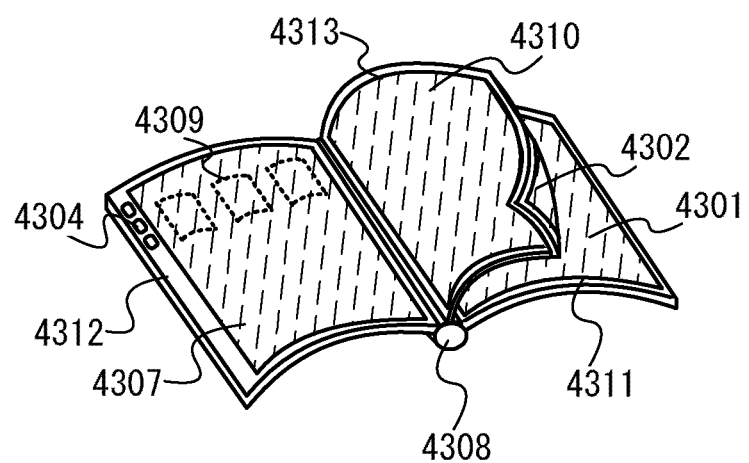
FIGS. 22A and 22B illustrate one embodiment of an electronic book reader.
Figure 22B:
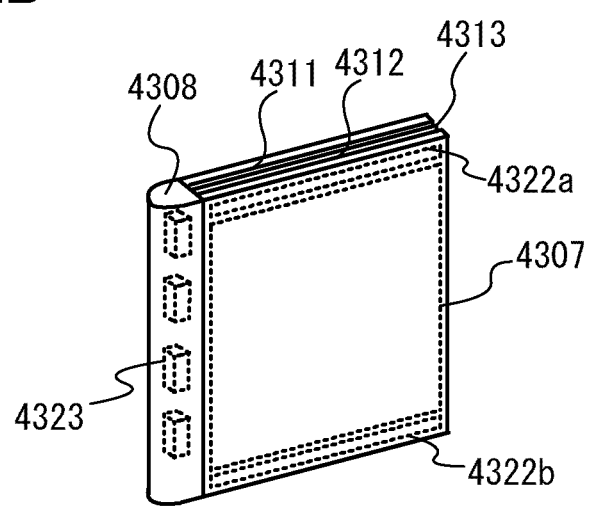
Figure 23:
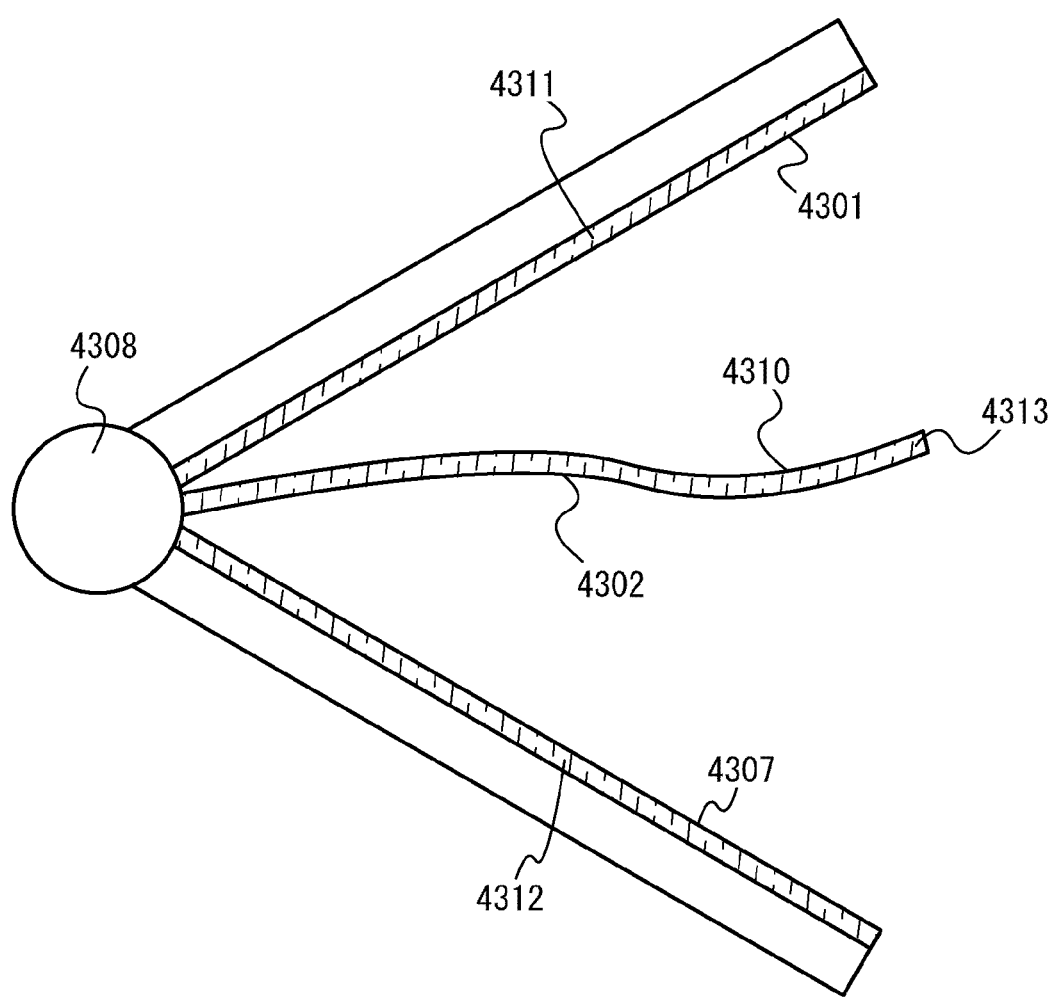
FIG. 23 illustrates one embodiment of the electronic book reader.

In this embodiment, an example of an electronic book reader will be described as one embodiment of a semiconductor device to which the thin film transistor described in any of Embodiments 1 to 5 is applied. In this embodiment, an example in which a double-sided third display panel 4313 is provided between a first display panel 4311 and a second display panel 4312 will be described with reference to FIGS. 22A and 22B and FIG. 23. FIG. 22A illustrates an opened electronic book reader, and FIG. 22B illustrates a closed electronic book reader. FIG. 23 is a cross-sectional view of the electronic book reader in a lateral direction.

The electronic book reader illustrated in FIGS. 22A and 22B includes the first display panel 4311 having a first display portion 4301, the second display panel 4312 having an operation portion 4304 and a second display portion 4307, the third display panel 4313 having a third display portion 4302 and a fourth display portion 4310, and a binding portion 4308 provided in one end portion of the first display panel 4311, the second display panel 4312, and the third display panel 4313. The third display panel 4313 is inserted between the first display panel 4311 and the second display panel 4312. The electronic book reader of FIGS. 22A and 22B includes four display screens of the first display portion 4301, the second display portion 4307, the third display portion 4302, and the fourth display portion 4310.

The first display panel 4311, the second display panel 4312, and the third display panel 4313 are flexible and easy to bend. When the first display panel 4311 and the second display panel 4312 are formed using plastic substrates and the third display panel 4313 is formed using a thin film, the electronic book reader can be made thin. In other words, as illustrated in the lateral cross-sectional view of the electronic book reader in FIG. 23 as an example, the electronic book reader can have a structure in which the third display panel 4313 is more flexible than the first display panel 4311 and the second display panel 4312. Thus, the display panels provided on the outer sides of the third display panel 4313 are made harder, whereby the electronic book reader can be handled just as a paper book. In addition, damage to the third display panel 4313 can be suppressed.

The third display panel 4313 is a double-sided display panel having the third display portion 4302 and the fourth display portion 4310. The third display panel 4313 may be formed using a dual-emission type display panel or one-side emission type display panels which are bonded to each other. Alternatively, two liquid crystal display panels between which a backlight (preferably a thin-shape EL light-emitting panel) is interposed may be used.

The electronic book reader illustrated in FIGS. 22A and 22B includes a scan line driver circuit (not illustrated) which controls display of the first display portion 4301, scan line driver circuits 4322a and 4322b which control display of the second display portion 4307, a scan line driver circuit (not illustrated) which controls display of the third display portion 4302 and/or the fourth display portion 4310, and a signal line driver circuit 4323 which controls display of the first display portion 4301, the second display portion 4307, the third display portion 4302, and/or the fourth display portion 4310. Note that the scan line driver circuit which controls display of the first display portion 4301 is provided in the first display panel 4311, the scan line driver circuits 4322a and 4322b are provided in the second display panel 4312, and the signal line driver circuit 4323 is provided inside the binding portion 4308.

In the electronic book reader illustrated in FIGS. 22A and 22B, the second display panel 4312 includes the operation portion 4304 which can have various functions such as a switch for turning on a power source, and a switch for shifting the display.

Input operation to the electronic book reader illustrated in FIGS. 22A and 22B is performed by touching the first display portion 4301 or the second display portion 4307 with a finger, an input pen, or the like or by operating the operation portion 4304. Note that a displayed button 4309 which is displayed on the second display portion 4307 is illustrated in FIG. 22A. Input can be performed by touching the displayed button 4309 with a finger or the like.

The electronic book reader illustrated in FIGS. 22A and 22B, in which the third display panel 4313 is inserted, is useful when used in the following manner: for example, texts are read on the first display portion 4301 and the fourth display portion 4310, and illustrations are referred to on the second display portion 4307 and the third display portion 4302. In this case, the third display panel 4313 cannot perform display on both the third display portion 4302 and the fourth display portion 4310 at the same time; therefore, when a page is turned, display on the third display portion 4302 is switched to display on the fourth display portion 4310.

When one finishes reading the first display portion 4301 and the third display portion 4302 and starts turning the next page, the third display panel 4313, the fourth display portion 4310 and the second display portion 4307 start performing display for the next page at a certain angle. When one finishes reading the fourth display portion 4310 and the second display portion 4307 and starts turning the third display panel 4313, the first display portion 4301 and the third display portion 4302 start displaying the next page at a certain angle. Thus, the switching of displays can be invisible, and visual incongruity or the like can be suppressed.

Note that the structure described in this embodiment can be combined with any of the structures described in other embodiments as appropriate.

This application is based on Japanese Patent Application serial no. 2009-131616 filed with Japan Patent Office on May 29, 2009, the entire contents of which are hereby incorporated by reference.

What is claimed is:
1. A semiconductor device comprising:
a gate electrode over a substrate having an insulating surface;
a first insulating film over the gate electrode, the first insulating film comprising oxygen;
an oxide semiconductor layer over and in direct contact with the first insulating film;
a second insulating film over and in direct contact with the oxide semiconductor layer, the second insulating film comprising oxygen;
a source electrode and a drain electrode over the second insulating film and in electrical contact with the oxide semiconductor layer via a first contact hole and a second contact hole in the second insulating film, respectively;
a third insulating film continuously formed from a top surface of the source electrode to a top surface of the drain electrode, the third insulating film comprising oxygen;
a planarization layer over the third insulating film, the planarization layer comprising an organic material;
a first electrode over the planarization layer;
a light-emitting layer over the first electrode; and
a second electrode over the light-emitting layer,
wherein the first electrode is in electrical contact with the oxide semiconductor layer via a top surface of the oxide semiconductor layer through one of the source electrode and the drain electrode, and
wherein a channel formation region of the oxide semiconductor layer is interposed between the first insulating film and the second insulating film.
2. The semiconductor device according to claim 1,
wherein the first insulating film is a silicon oxynitride film.
3. The semiconductor device according to claim 2,
wherein the silicon oxynitride film includes nitrogen at a concentration greater than or equal to 3 atomic % and less than or equal to 30 atomic %.
4. The semiconductor device according to claim 1,
wherein the second insulating film is a silicon oxynitride film.
5. The semiconductor device according to claim 4,
wherein the silicon oxynitride film includes nitrogen at a concentration greater than or equal to 3 atomic % and less than or equal to 30 atomic %.
6. The semiconductor device according to claim 1,
wherein the first insulating film comprises a stack of a first oxide film over a nitride film, the first oxide film being in direct contact with the oxide semiconductor layer,
wherein the second insulating film is a second oxide film, and
wherein the third insulating film is a third oxide film.
7. The semiconductor device according to claim 1,
wherein the first insulating film comprises a stack of a first film comprising oxygen and silicon over a film comprising nitrogen and silicon, the first film comprising oxygen and silicon being in direct contact with the oxide semiconductor layer,
wherein the second insulating film is a second film comprising oxygen and silicon, and
wherein the third insulating film is a third film comprising oxygen and silicon.
8. The semiconductor device according to claim 1,
wherein the planarization layer is over and in direct contact with the third insulating film;
wherein the first electrode is in electrical contact with the one of the source electrode and the drain electrode via a contact hole in the planarization layer,
wherein the first electrode comprises a light-transmitting conductive material, and wherein the first electrode is in electrical contact with the oxide semiconductor layer via a side end surface of the oxide semiconductor layer through the one of the source electrode and the drain electrode.

9. The semiconductor device according to claim 1, wherein the first electrode is in electrical contact with the oxide semiconductor layer via a side end surface of the oxide semiconductor layer through the one of the source electrode and the drain electrode.

10. The semiconductor device according to claim 9, wherein an end portion of the source electrode and an end portion of the drain electrode are sandwiched between the second insulating film and the third insulating film.

11. The semiconductor device according to claim 9, wherein the oxide semiconductor layer comprises an oxide semiconductor film including at least zinc and indium.

12. The semiconductor device according to claim 1, wherein the first contact hole and the second contact hole define a first top portion and a second top portion of the oxide semiconductor layer, respectively, the first top portion and the second top portion being not covered with the second insulating film, and an entirety of each of the first top portion and the second top portion overlapping the gate electrode.

13. The semiconductor device according to claim 1, wherein a side end surface of the oxide semiconductor layer and a side end surface of the second insulating film coincide.

14. The semiconductor device according to claim 1, wherein the oxide semiconductor layer presents an amorphous state.

15. A display device comprising the semiconductor device according to claim 1.

16. The semiconductor device according to claim 1, wherein a portion of a top surface of the third insulating film is at a lower position than a portion of a top surface of the source electrode and a portion of the top surface of the drain electrode.

17. The semiconductor device according to claim 1, wherein the first insulating film comprises nitrogen.

18. A semiconductor device comprising:
a gate electrode over a substrate having an insulating surface;
a silicon nitride film over the gate electrode;
a first silicon oxide film over and in direct contact with the silicon nitride film;
an oxide semiconductor layer over and in direct contact with the first silicon oxide film;
a second silicon oxide film over and in direct contact with the oxide semiconductor layer;
a source electrode and a drain electrode over and in direct contact with the second silicon oxide film and with the oxide semiconductor layer via a first contact hole and a second contact hole in the second silicon oxide film, respectively;
a third silicon oxide film continuously formed from a top surface of the source electrode to a top surface of the drain electrode, in direct contact with the source electrode, the drain electrode, and the second silicon oxide film;
a planarization layer over and in direct contact with the third silicon oxide film, the planarization layer comprising an organic material;
a first electrode over the planarization layer and in electrical contact with one of the source electrode and the drain electrode via a contact hole in the planarization layer, the first electrode comprising a light-transmitting conductive material;
a light-emitting layer over the first electrode; and
a second electrode over the light-emitting layer,
wherein the first electrode is in electrical contact with the oxide semiconductor layer via a top surface of the oxide semiconductor layer through the one of the source electrode and the drain electrode,
wherein the first contact hole and the second contact hole define a first top portion and a second top portion of the oxide semiconductor layer, respectively, the first top portion and the second top portion being not covered with the second silicon oxide film, and an entirety of each of the first top portion and the second top portion overlapping the gate electrode, and
wherein a channel formation region of the oxide semiconductor layer is interposed between the first silicon oxide film and the second silicon oxide film.

19. The semiconductor device according to claim 18, wherein the first electrode is in electrical contact with the oxide semiconductor layer via a side end surface of the oxide semiconductor layer through the one of the source electrode and the drain electrode.

20. The semiconductor device according to claim 18, wherein a side end surface of the oxide semiconductor layer and a side end surface of the second silicon oxide film coincide.

21. The semiconductor device according to claim 18, wherein an end portion of the source electrode and an end portion of the drain electrode are sandwiched between the second silicon oxide film and the third silicon oxide film.

22. The semiconductor device according to claim 18, wherein the oxide semiconductor layer comprises an oxide semiconductor film including at least zinc and indium.

23. The semiconductor device according to claim 18, wherein the oxide semiconductor layer presents an amorphous state.

24. A display device comprising the semiconductor device according to claim 18.

25. The semiconductor device according to claim 18, wherein a portion of a top surface of the third silicon oxide film is at a lower position than a portion of the top surface of the source electrode and a portion of the top surface of the drain electrode.

26. A semiconductor device comprising:
a gate electrode over a substrate having an insulating surface;
a silicon nitride film over the gate electrode;
a first silicon oxide film over and in direct contact with the silicon nitride film;
an oxide semiconductor layer over and in direct contact with the first silicon oxide film;
a second silicon oxide film over and in direct contact with the oxide semiconductor layer;
a source electrode and a drain electrode over and in direct contact with the second silicon oxide film and with the oxide semiconductor layer via a first contact hole and a second contact hole in the second silicon oxide film, respectively;
a third silicon oxide film continuously formed from a top surface of the source electrode to a top surface of the drain electrode, in direct contact with the source electrode, the drain electrode, and the second silicon oxide film;

a planarization layer over the third silicon oxide film, the planarization layer comprising an organic material; and
a first electrode over the planarization layer;
a light-emitting layer over the first electrode; and
a second electrode over the light-emitting layer,
wherein the first electrode is in electrical contact with the oxide semiconductor layer via a side end surface and a top surface of the oxide semiconductor layer through one of the source electrode and the drain electrode, and
wherein a channel formation region of the oxide semiconductor layer is interposed between the first silicon oxide film and the second silicon oxide film.

27. The semiconductor device according to claim 26, wherein the first contact hole and the second contact hole define a first top portion and a second top portion of the oxide semiconductor layer, respectively, the first top portion and the second top portion being not covered with the second silicon oxide film, and an entirety of each of the first top portion and the second top portion overlapping the gate electrode.

28. The semiconductor device according to claim 26, wherein the side end surface of the oxide semiconductor layer and a side end surface of the second silicon oxide film coincide.

29. The semiconductor device according to claim 26, wherein an end portion of the source electrode and an end portion of the drain electrode are sandwiched between the second silicon oxide film and the third silicon oxide film.

30. The semiconductor device according to claim 26, wherein the oxide semiconductor layer comprises an oxide semiconductor film including at least zinc and indium.

31. The semiconductor device according to claim 26, wherein the oxide semiconductor layer presents an amorphous state.

32. A display device comprising the semiconductor device according to claim 26.

33. The semiconductor device according to claim 26, wherein a portion of a top surface of the third silicon oxide film is at a lower position than a portion of the top surface of the source electrode and a portion of the top surface of the drain electrode.

34. A semiconductor device comprising:
a gate electrode;
a first insulating film over the gate electrode, the first insulating film comprising oxygen;
an oxide semiconductor layer over and in direct contact with the first insulating film;
a second insulating film over and in direct contact with the oxide semiconductor layer, the second insulating film comprising oxygen;
a source electrode over the oxide semiconductor layer, the source electrode being in electrical contact with the oxide semiconductor layer, wherein a part of the source electrode is located in a first contact hole in the second insulating film;
a drain electrode over the oxide semiconductor layer, the drain electrode being in electrical contact with the oxide semiconductor layer, wherein a part of the drain electrode is located in a second contact hole in the second insulating film;
a third insulating film over the second insulating film, the source electrode, and the drain electrode, the third insulating film comprising oxygen, wherein the third insulating film is in direct contact with a top surface of the second insulating film;
a fourth insulating film over the third insulating film, the fourth insulating film comprising an organic material;
a conductive film over the fourth insulating film, the conductive film being in electrical contact with one of the source electrode and the drain electrode, wherein a part of the conductive film is located in a contact hole in the fourth insulating film,
wherein each of the first contact hole and the second contact hole comprises a region overlapping with the gate electrode,
wherein the contact hole comprises a region not overlapping with the first contact hole and not overlapping with the second contact hole.

35. The semiconductor device according to claim 34, further comprising a light-emitting layer over the conductive film.

36. The semiconductor device according to claim 34, wherein the oxide semiconductor layer comprises indium, gallium and zinc.

37. The semiconductor device according to claim 34, wherein the conductive film is a pixel electrode.

38. The semiconductor device according to claim 34, wherein the gate electrode comprises a tapered end portion.

39. A semiconductor device comprising:
a gate electrode;
a first insulating film over the gate electrode, the first insulating film comprising oxygen;
an oxide semiconductor layer over and in direct contact with the first insulating film;
a second insulating film over and in direct contact with the oxide semiconductor layer, the second insulating film comprising oxygen;
a source electrode over the oxide semiconductor layer, the source electrode being in electrical contact with the oxide semiconductor layer, wherein a part of the source electrode is located in a first contact hole in the second insulating film;
a drain electrode over the oxide semiconductor layer, the drain electrode being in electrical contact with the oxide semiconductor layer, wherein a part of the drain electrode is located in a second contact hole in the second insulating film;
a third insulating film over the second insulating film, the source electrode, and the drain electrode, the third insulating film comprising oxygen, wherein the third insulating film is in direct contact with a top surface of the second insulating film;
a fourth insulating film over the third insulating film, the fourth insulating film comprising an organic material;
a conductive film over the fourth insulating film, the conductive film being in electrical contact with one of the source electrode and the drain electrode, wherein a part of the conductive film is located in a contact hole in the fourth insulating film,
wherein each of the first contact hole and the second contact hole comprises a region overlapping with the gate electrode,
wherein the source electrode comprises a depressed portion overlapping with the first contact hole,
wherein the drain electrode comprises a depressed portion overlapping with the second contact hole,
wherein the contact hole comprises a region not overlapping with the first contact hole and not overlapping with the second contact hole.

40. The semiconductor device according to claim 39, further comprising a light-emitting layer over the conductive film.

41. The semiconductor device according to claim 39, wherein the oxide semiconductor layer comprises indium, gallium and zinc.

42. The semiconductor device according to claim 39, wherein the conductive film is a pixel electrode.

43. The semiconductor device according to claim 39, wherein the gate electrode comprises a tapered end portion.

* * * * *